(12) United States Patent
Hirata et al.

(10) Patent No.: US 11,910,624 B2
(45) Date of Patent: Feb. 20, 2024

(54) SOLID-STATE IMAGING ELEMENT AND SOLID-STATE IMAGING DEVICE

(71) Applicant: SONY SEMICONDUCTOR SOLUTIONS CORPORATION, Kanagawa (JP)

(72) Inventors: Shintarou Hirata, Tokyo (JP); Hideaki Togashi, Kanagawa (JP); Yukio Kaneda, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 18/081,889

(22) Filed: Dec. 15, 2022

(65) Prior Publication Data

US 2023/0119970 A1    Apr. 20, 2023

Related U.S. Application Data

(63) Continuation of application No. 16/979,992, filed as application No. PCT/JP2019/008348 on Mar. 4, 2019, now Pat. No. 11,552,268.

(30) Foreign Application Priority Data

Mar. 19, 2018 (JP) ................................ 2018-050808

(51) Int. Cl.
*H10K 30/30* (2023.01)
*H10K 39/32* (2023.01)

(52) U.S. Cl.
CPC ........... *H10K 30/353* (2023.02); *H10K 39/32* (2023.02)

(58) Field of Classification Search
CPC ..................................................... H10K 39/32
See application file for complete search history.

(56) References Cited

U.S. PATENT DOCUMENTS

| 2015/0255498 | A1 | 9/2015 | Sugiura |
| 2016/0037098 | A1* | 2/2016 | Lee ......................... H10K 39/32 |
| | | | 257/292 |

(Continued)

FOREIGN PATENT DOCUMENTS

| CN | 104900664 A | 9/2015 |
| CN | 105409002 A | 3/2016 |

(Continued)

OTHER PUBLICATIONS

International Search Report and Written Opinion for International (PCT) Patent Application No. PCT/JP2019/008348, dated May 28, 2019, 7 pages.

(Continued)

*Primary Examiner* — Daniel P Shook
(74) *Attorney, Agent, or Firm* — Sheridan Ross PC

(57) ABSTRACT

A solid-state imaging element including: a photoelectric conversion layer, a first electrode and a second electrode opposed to each other with the photoelectric conversion layer interposed therebetween, a semiconductor layer provided between the first electrode and the photoelectric conversion layer, an accumulation electrode opposed to the photoelectric conversion layer with the semiconductor layer interposed therebetween, an insulating film provided between the accumulation electrode and the semiconductor layer, and a barrier layer provided between the semiconductor layer and the photoelectric conversion layer.

15 Claims, 36 Drawing Sheets

(56) References Cited

U.S. PATENT DOCUMENTS

| | | |
|---|---|---|
| 2016/0268345 A1 | 9/2016 | Miyazaki et al. |
| 2017/0186818 A1* | 6/2017 | Yen .................. H10K 30/15 |
| 2018/0076252 A1 | 3/2018 | Togashi et al. |

FOREIGN PATENT DOCUMENTS

| | | |
|---|---|---|
| CN | 107146850 A | 9/2017 |
| JP | 2016-063165 | 4/2016 |
| JP | 2016-167563 | 9/2016 |
| JP | 2017-055085 | 5/2017 |
| JP | 2017-157816 | 9/2017 |
| KR | 20140068995 A | 6/2014 |
| KR | 20160017168 A | 2/2016 |

OTHER PUBLICATIONS

Official Action for U.S. Appl. No. 16/979,992, dated Jul. 21, 2022, 12 pages.
Notice of Allowance for U.S. Appl. No. 16/979,992, dated Sep. 14, 2022, 5 pages.

* cited by examiner

SOLID-STATE IMAGING ELEMENT AND SOLID-STATE IMAGING DEVICE

CROSS REFERENCE TO RELATED APPLICATIONS

This application is a continuation of U.S. patent application Ser. No. 16/979,992 filed 11 Sep. 2020, which is a national stage application under 35 U.S.C. 371 and claims the benefit of PCT Application No. PCT/JP2019/008348 having an international filing date of 4 Mar. 2019, which designated the United States, which PCT application claimed the benefit of Japanese Patent Application No. 2018-050808 filed 19 Mar. 2018, the entire disclosures of each of which are incorporated herein by reference.

TECHNICAL FIELD

The present disclosure relates to a solid-state imaging element and a solid-state imaging device that use, for example, an organic photoelectric conversion material.

BACKGROUND ART

A solid-state imaging element such as a CCD (Charge Coupled Device) image sensor and a CMOS (Complementary Metal Oxide Semiconductor) image sensor has been used in a solid-state imaging device. The solid-state imaging element is provided with, for example, a photoelectric conversion layer including an organic photoelectric conversion material (see, e.g., PTL 1).

CITATION LIST

Patent Literature

PTL 1: Japanese Unexamined Patent Application Publication No. 2016-63165

SUMMARY OF THE INVENTION

It is desired, in such a solid-state imaging element and a solid-state imaging device, for example, to suppress occurrence of transfer failure, etc. of signal charges and to improve element characteristics.

It is therefore desirable to provide a solid-state imaging element and a solid-state imaging device that make it possible to improve element characteristics.

A first solid-state imaging element according to an embodiment of the present disclosure includes a photoelectric conversion layer; a first electrode and a second electrode opposed to each other with the photoelectric conversion layer interposed therebetween; a semiconductor layer provided between the first electrode and the photoelectric conversion layer; an accumulation electrode opposed to the photoelectric conversion layer with the semiconductor layer interposed therebetween; an insulating film provided between the accumulation electrode and the semiconductor layer; and a barrier layer provided between the semiconductor layer and the photoelectric conversion layer.

A first solid-state imaging device according to an embodiment of the present disclosure includes the first solid-state imaging element according to an embodiment of the present disclosure.

In the first solid-state imaging element and the first solid-state imaging device according to respective embodiments of the present disclosure, signal charges generated in the photoelectric conversion layer are accumulated in the semiconductor layer, and thereafter are read by the first electrode. Here, the barrier layer is provided between the semiconductor layer and the photoelectric conversion layer, thus making the signal charges accumulated in the semiconductor layer less likely to return to the photoelectric conversion layer. The barrier layer functions as a potential or physical barrier during movement of the signal charges.

A second solid-state imaging element according to an embodiment of the present disclosure includes: a photoelectric conversion layer; a first electrode and a second electrode opposed to each other with the photoelectric conversion layer interposed therebetween; a semiconductor layer provided between the first electrode and the photoelectric conversion layer and having a potential barrier at a junction plane with respect to the photoelectric conversion layer; an accumulation electrode opposed to the photoelectric conversion layer with the semiconductor layer interposed therebetween; and an insulating film provided between the accumulation electrode and the semiconductor layer.

A second solid-state imaging device according to an embodiment of the present disclosure includes the second solid-state imaging element according to an embodiment of the present disclosure.

In the second solid-state imaging element and the second solid-state imaging device according to respective embodiments of the present disclosure, signal charges generated in the photoelectric conversion layer are accumulated in the semiconductor layer, and thereafter are read by the first electrode. Here, the potential barrier is provided in the junction plane between the semiconductor layer and the photoelectric conversion layer, thus making the signal charges accumulated in the semiconductor layer less likely to return to the photoelectric conversion layer.

According to the first solid-state imaging element and the first solid-state imaging device of the respective embodiments of the present disclosure, the barrier layer is provided between the semiconductor layer and the photoelectric conversion layer, and according to the second solid-state imaging element and the second solid-state imaging device of the respective embodiments of the present disclosure, the potential barrier is provided at the junction plane between the semiconductor layer and the photoelectric conversion layer, thus making it possible to suppress occurrence of transfer failure of signal charges accumulated in the semiconductor layer. Accordingly, it is possible to improve element characteristics.

It is to be noted that, the above content is merely an example of the present disclosure. The effects of the present disclosure are not limited to those described above, and may be other different effects or may further include other effects.

MODES FOR CARRYING OUT THE INVENTION

Hereinafter, description is given in detail of embodiments of the present disclosure with reference to the drawings. It is to be noted that the description is given in the following order.

1. First Embodiment (Example of Solid-State Imaging Element Including Barrier Layer between Semiconductor Layer and Photoelectric Conversion Layer)
2. Modification Example 1 (Example of Providing Multilayer Wiring Line on First Surface of Semiconductor Substrate)
3. Modification Example 2 (Example of Including One Photo Diode Section in Semiconductor Substrate)
4. Modification Example 3 (Example without Photodiode Section in Semiconductor Substrate)
5. Modification Example 4 (Example of Including Transfer Electrode Between First Electrode and Accumulation Electrode)
6. Modification Example 5 (Example of Including Discharge Electrode Separated from First Electrode)
7. Modification Example 6 (Example of Including Shielding Electrode between Adjacent Accumulation Electrodes)
8. Modification Example 7 (Example of Including Light-Shielding Film Opposed to First Electrode)
9. Second Embodiment (Solid-State Imaging Element in which Potential Barrier is Provided at Junction Plane between Semiconductor Layer and Photoelectric Conversion Layer)
10. Application Example 1 (Example of Solid-State Imaging Device)
11. Applicable Example 2 (Example of Electronic Apparatus)
12. Application Example 3 (Example of Practical Application to In-Vivo Information Acquisition System)
13. Application Example 4 (Example of Practical Application to Endoscopic Surgery System)

14. Application Example 5 (Example of Practical Application to Mobile Body)

1. First Embodiment

Figure 1:
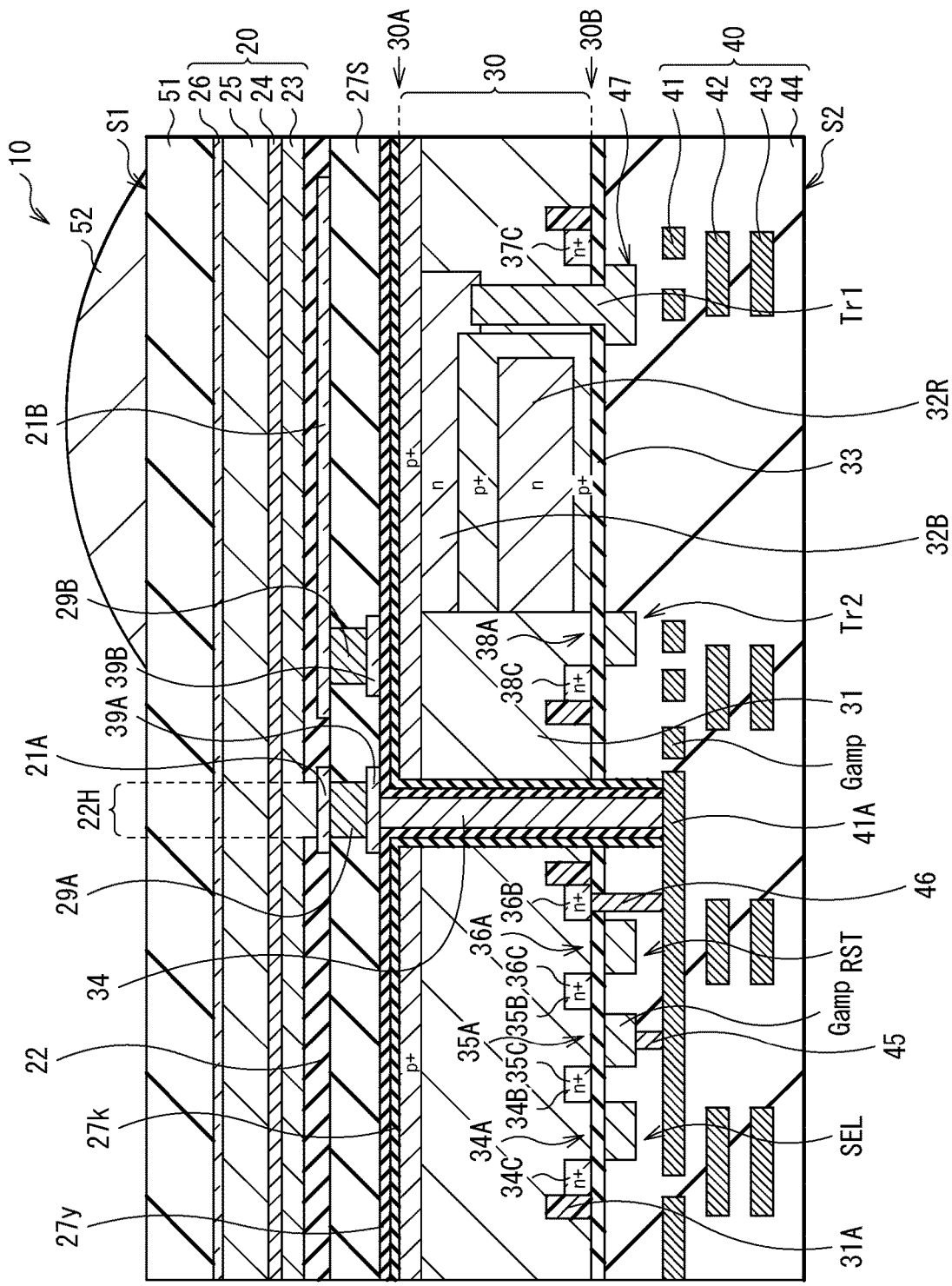
FIG. 1 is a cross-sectional schematic view of a schematic configuration of a solid-state imaging element according to a first embodiment of the present disclosure.

FIG. 1 schematically illustrates a cross-sectional configuration of a solid-state imaging element (a solid-state imaging element 10) according to a first embodiment of the present disclosure. The solid-state imaging element 10 configures one pixel (a unit pixel P) in a solid-state imaging device (e.g., a solid-state imaging device 1 in FIG. 32) such as a CMOS image sensor used in an electronic apparatus such as a digital still camera or a video camera, for example.

1-1. Configuration of Solid-State Imaging Element

The solid-state imaging element 10 is, for example, of a so-called vertical spectroscopic type in which one organic photoelectric conversion section 20 and two inorganic photoelectric conversion sections 32B and 32R are stacked in a vertical direction. The organic photoelectric conversion section 20 is provided on side of a first surface 30A (back surface) of a semiconductor substrate 30. The semiconductor substrate 30 has a second surface 30B (front face) opposed to the first surface 30A. In the solid-state imaging element 10, light enters from the side of the first surface 30A (light incident side S1), and a multilayer wiring line (wiring layer side S2) is provided on side of the second surface 30B.

The inorganic photoelectric conversion sections 32B and 32R are each formed to be embedded in the semiconductor substrate 30, and are stacked in a thickness direction of the semiconductor substrate 30. The organic photoelectric conversion section 20 includes a photoelectric conversion layer 25 formed using an organic photoelectric conversion material between a pair of electrodes (a first electrode 21A and a second electrode 26) disposed to be opposed to each other. The photoelectric conversion layer 25 includes a p-type semiconductor and an n-type semiconductor, and has a bulk heterojunction structure in the layer. The bulk heterojunction structure is a p/n junction plane formed by mixing of the p-type semiconductor and the n-type semiconductor.

The organic photoelectric conversion section 20 and the inorganic photoelectric conversion sections 32B and 32R each perform photoelectric conversion by selectively detecting light in a different wavelength region. Specifically, the organic photoelectric conversion section 20 acquires a green (G) color signal. The inorganic photoelectric conversion sections 32B and 32R acquire, respectively, blue (B) and red (R) color signals due to a difference in absorption coefficients. This enables the solid-state imaging element 10A to acquire a plurality of types of color signals in one pixel without using a color filter.

It is to be noted that, in the present embodiment, description is given of a case of reading electrons as signal charges among a pair of electrons and holes (electron-hole pairs) generated by photoelectric conversion. In addition, in the diagram, "+ (plus)" added to "p" and "n" indicates a higher impurity concentration of the p type or the n type, and "++" indicates a still higher impurity concentration of the p type or the n type than that of "+".

The second surface 30B of the semiconductor substrate 30 is provided with, for example, floating diffusions (floating diffusion layers) FD1 (a region 36B in the semiconductor substrate 30), FD2 (a region 37C in the semiconductor substrate 30), FD3 (a region 38C in the semiconductor substrate 30), transfer transistors Tr2 and Tr3, an amplifier transistor (modulating element) AMP, a reset transistor RST, a selection transistor SEL, and a multilayer wiring line 40.

The multilayer wiring line 40 has, for example, a configuration in which wiring layers 41, 42, and 43 are stacked in an insulating layer 44.

There are provided, between the first surface 30A of the semiconductor substrate 30 and the organic photoelectric conversion section 20, for example, a layer (fixed charge layer) 27k having a fixed charge, a dielectric layer 27y having an insulating property, and an interlayer insulating layer 22s. A protective layer 51 is provided on the organic photoelectric conversion section 20 (light incident side S1). There are provided, above the protective layer 51, optical members such as a planarization layer (not illustrated) and an on-chip lens 52.

A through electrode 34 is provided between the first surface 30A and the second surface 30B of the semiconductor substrate 30. The organic photoelectric conversion section 20 is coupled, via the through electrode 34, to a gate Gamp of the amplifier transistor AMP and one of the source/drain region 36B, of the reset transistor RST (a reset transistor Tr1rst), which also serves as the floating diffusion FD1. This allows the solid-state imaging element 10 to favorably transfer charges (here, electrons) generated in the organic photoelectric conversion section 20 of the side of the first surface 30A of the semiconductor substrate 30 to the side of the second surface 30B of the semiconductor substrate 30 via the through electrode 340, thus making it possible to enhance the characteristics.

A lower end of the through electrode 340 is coupled to a coupling part 41A in the wiring layer 41, and the coupling part 41A and the gate Gamp of the amplifier transistor AMP are coupled to each other via a lower first contact 45. The coupling part 41A and the floating diffusion FD1 (region 36B) are coupled to each other via, for example, a lower second contact 46. An upper end of the through electrode 34 is coupled to the first electrode 21A, for example, via a coupling wiring line 39A and an upper first contact 29A.

The through electrode 34 is provided for each organic photoelectric conversion section 20 in each solid-state imaging element 10, for example. The through electrodes 34 has a function as a connector between the organic photoelectric conversion section 20 and the gate Gamp of the amplifier transistors AMP as well as the floating diffusion FD1, and serves as a transmission path for charges (here, electrons) generated in the organic photoelectric conversion section 20. The through electrode 34 is configured by, for example, a metal material such as aluminum, tungsten, titanium, cobalt, hafnium, and tantalum. The through electrode 34 may be configured by a doped silicone material such as PDAS (Phosphorus Doped Amorphous Silicon).

A reset gate Grst of the reset transistor RST is disposed next to the floating diffusion FD1 (one of the source/drain region 36B of the reset transistor RST). This enables charges accumulated in the floating diffusion FD1 to be reset by the reset transistor RST.

In the solid-state imaging element 10 of the present embodiment, light that has entered the organic photoelectric conversion section 20 from side of the second electrode 26 is absorbed by the photoelectric conversion layer 25. Excitons thus generated move to an interface between an electron donor and an electron acceptor that configure the photoelectric conversion layer 25, and undergo exciton separation, i.e., dissociate into electrons and holes. One of charges (e.g., electrons) generated here is accumulated in a semiconductor layer 23 opposed to an accumulation electrode 21B, and the other of charges (e.g., holes) is discharged to the second electrode 26.

Hereinafter, description is given of a configuration, a material, and the like of each of the components.

The organic photoelectric conversion section 20 is an organic photoelectric conversion element that absorbs green light corresponding to a portion or all of a selective wavelength region (e.g., in a range from 450 nm to 650 nm) and generates electron-hole pairs. The organic photoelectric conversion section 20 includes, in order from a position close to the first surface 30A of the semiconductor substrate 30, the first electrode 21A and the accumulation electrode 21B, the insulating layer 22, the semiconductor layer 23, a barrier layer 24, the photoelectric conversion layer 25, and the second electrode 26. The insulating layer 22 is provided with an opening 22H; the opening 22H allows the first electrode 21A to be electrically coupled to the semiconductor layer 23. The insulating layer 22 is interposed between the accumulation electrode 21B and the semiconductor layer 23.

Figure 2:
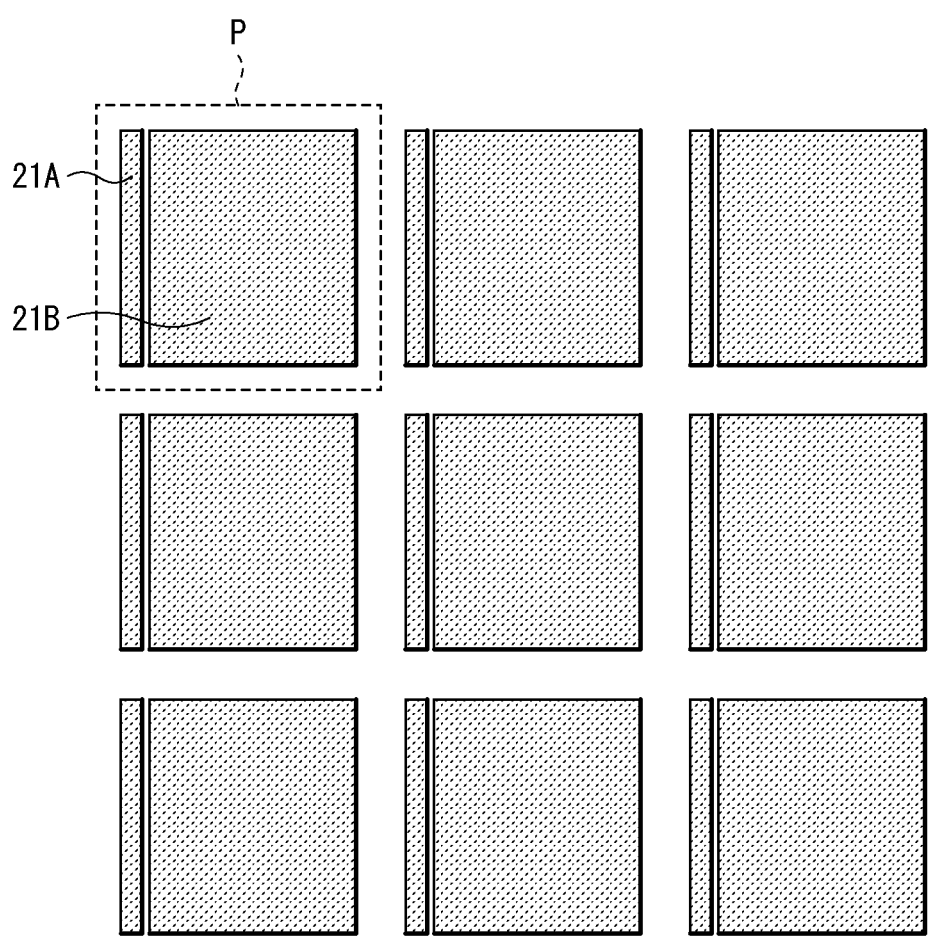
FIG. 2 is a schematic view of a planar configuration of a first electrode and an accumulation electrode illustrated in FIG.

FIG. 2 illustrates a planar configuration of the first electrode 21A and the accumulation electrode 21B. The first electrode 21A and the accumulation electrode 21B each have, for example, a quadrangular planar configuration, and are disposed apart from each other. For example, an area of the accumulation electrode 21B is larger than an area of the first electrode 21A. One pixel (a pixel P) is provided with, for example, one first electrode 21A and one accumulation electrode 21B. The first electrode 21A is provided for transferring charges (here, electrons) generated in the photoelectric conversion layer 25 to the floating diffusion FD1, and functions as a read electrode. The first electrode 21A is coupled to the floating diffusion FD1 via, for example, the upper first contact 29A, the coupling wiring line 39A, the through electrode 34, the coupling part 41A, and the lower second contact 46.

The accumulation electrode 21B opposed to the photoelectric conversion layer 25 with the semiconductor layer 23 interposed therebetween is provided for accumulating, in the semiconductor layer 23, signal charges (e.g., electrons) among the charges generated in the photoelectric conversion layer 25. The accumulation electrode 21B is provided at a region that is opposed to light receiving surfaces of the inorganic photoelectric conversion sections 32B and 32R formed in the semiconductor substrate 30 and covers these light receiving surfaces. The accumulation electrode 21B is electrically coupled to a drive circuit (not illustrated) via, for example, an upper second contact 29B and a coupling wiring line 39B. Making the area of the accumulation electrode 21B larger than the area of the first electrode 21A causes more charges to be accumulated.

The first electrode 21A and the accumulation electrode 21B are each configured by, for example, an electrically-conductive film having light-transmissivity, and are configured by, for example, ITO (indium tin oxide). However, in addition to the ITO, a dopant-doped tin oxide ($SnO_2$)-based material or a zinc oxide-based material in which aluminum zinc oxide (ZnO) is doped with a dopant may be used as a constituent material of a lower electrode 21. Examples of the zinc oxide-based material include aluminum zinc oxide (AZO) doped with aluminum (Al) as a dopant, gallium (Ga)-doped gallium zinc oxide (GZO), and indium (In)-doped indium zinc oxide (IZO). In addition, aside from those mentioned above, for example, CuI, $InSbO_4$, ZnMgO, $CuInO_2$, $MgIN_2O_4$, CdO, $ZnSnO_3$, or the like may be used.

The first electrode 21A may be configured by an electrically-conductive material having a light-shielding property. Specifically, the first electrode 21A may be configured by a film of metal such as aluminum (Al), tungsten (W), titanium (Ti), molybdenum (Mo), tantalum (Ta), copper (Cu), cobalt (Co) or nickel (Ni), or an alloy film thereof, or may be configured by a film in which silicon or oxygen is contained in the metal film.

The insulating layer 22 is provided for electrically separating the accumulation electrode 21B and the semiconductor layer 23 from each other, and is provided, for example, on an interlayer insulating layer 27s to cover the first electrode 21A and the accumulation electrode 21B. The opening 22H provided in the insulating layer 22 causes the first electrode 21A to be exposed from the insulating layer 22, and is in contact with the semiconductor layer 23. The insulating layer 22 is configured by, for example, a monolayer film of one of silicon oxide, TEOS (Tetra Ethyl Ortho Silicate) silicon nitride, silicon oxynitride (SiON), and the like, or a stacked layer film of two or more of thereof. The insulating layer 22 has a thickness of, for example, 3 nm to 500 nm.

The semiconductor layer 23 provided between the first electrode 21A or the insulating layer 22 and the photoelectric conversion layer 25 is preferably configured by a material having higher charge mobility and a larger band gap than those of the photoelectric conversion layer 25. For example, the band gap of the constituent material of the semiconductor layer 23 is preferably 3.0 eV or more. Examples of such a material include an oxide semiconductor material such as IGZO and an organic semiconductor material. Examples of the organic semiconductor material include transition metal dichalcogenide, silicon carbide, diamond, graphene, a carbon nanotube, a fused polycyclic hydrocarbon compound, and a fused heterocyclic compound. The semiconductor layer 23 may be configured by a single film, or may be configured by stacking a plurality of films. The semiconductor layer 23 has a thickness of, for example, 10 nm to 500 nm, preferably 30 nm to 150 nm, and more preferably 50 nm to 100 nm. Providing such a semiconductor layer 23 as an underlayer of the photoelectric conversion layer 25 makes it possible to prevent recombination of charges at the time of charge accumulation and thus to improve transfer efficiency.

An impurity concentration of the constituent material of the semiconductor layer 23 is preferably $1 \times 10^{18}$ $cm^{-3}$ or less. The semiconductor layer 23 is provided in common, for example, for a plurality of solid-state imaging elements 10 (FIG. 1).

Figure 3:
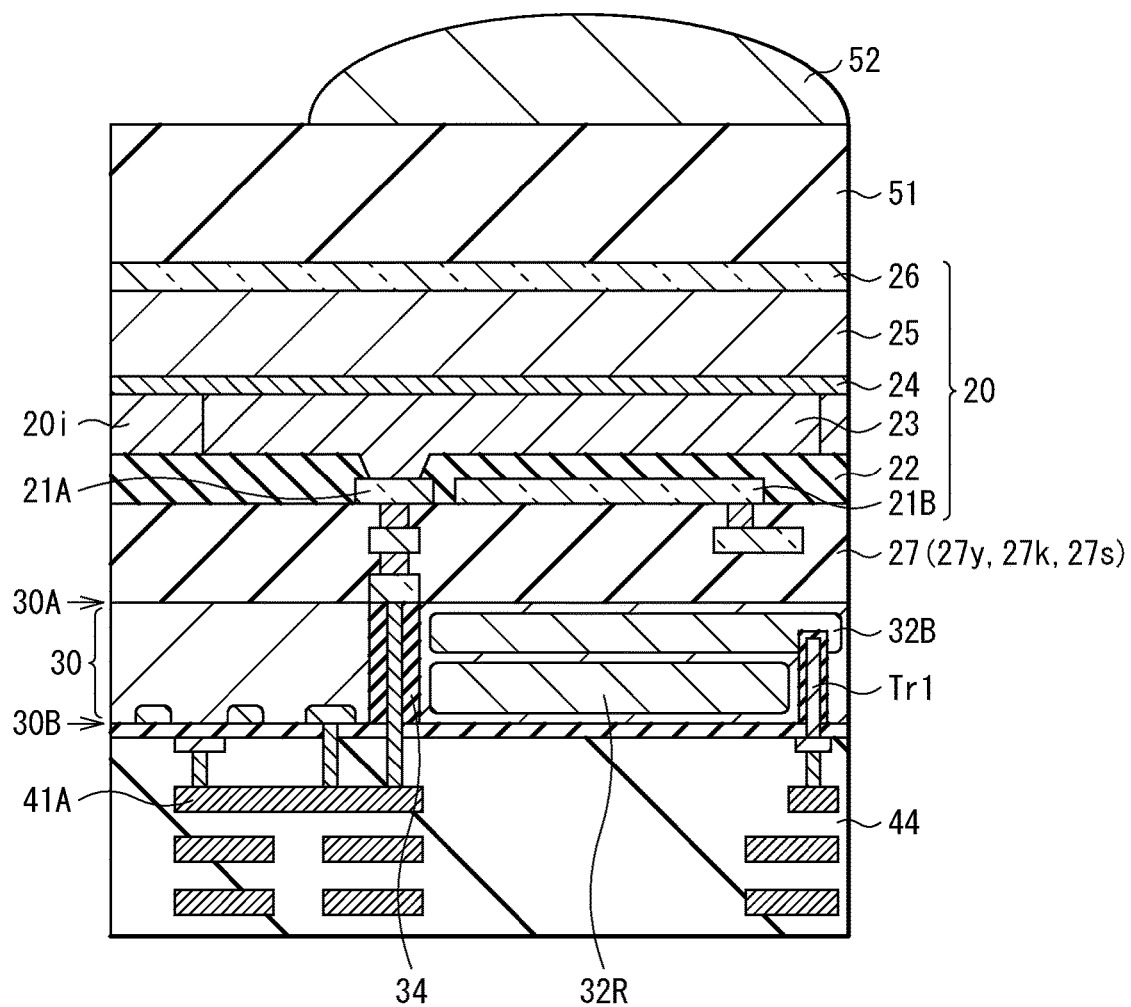
FIG. 3 is a cross-sectional schematic view of another example of a semiconductor layer illustrated in FIG. 1.

As illustrated in FIG. 3, the semiconductor layer 23 may be provided separately for each of the elements (pixels). At this time, an element separation layer (an element separation layer 20i) is disposed between the semiconductor layers 23 of the adjacent solid-state imaging elements 10.

In the present embodiment, the barrier layer 24 is provided between the semiconductor layer 23 and the photoelectric conversion layer 25. The barrier layer 24 functions as a potential or physical barrier during movement of signal charges. This makes the signal charges accumulated in the semiconductor layer 23 less likely to return to the photoelectric conversion layer 25, thus suppressing occurrence of transfer failure, although detailed description thereof is given later. The barrier layer 24 controls the movement of charges between the semiconductor layer 23 and the photoelectric conversion layer 25, and functions as an energy barrier for the charge movement.

Figure 4A:
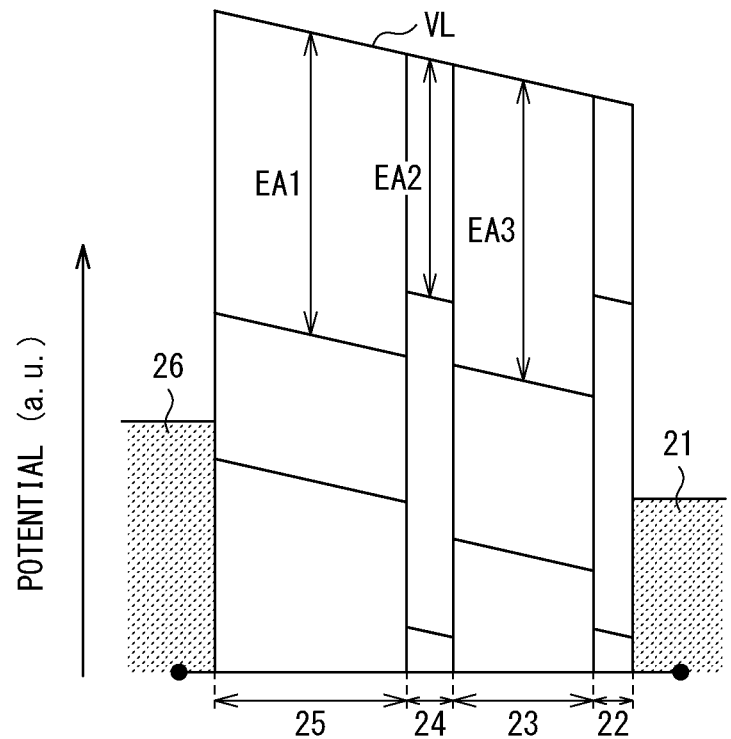
FIG. 4A is a diagram (1) that describes energy of a barrier layer illustrated in FIG. 1.

FIG. 4A schematically illustrates electron affinity of constituent materials of the barrier layer 24. When the signal charges are electrons, electron affinity (electron affinity EA2) of the constituent material of the barrier layer 24 is smaller than electron affinity (electron affinity EA1) of the constituent material of the photoelectric conversion layer 25 and electron affinity (electron affinity EA3) of the constituent material of the semiconductor layer 23. Providing the barrier layer 24 may cause the electron affinity EA3 of the constituent material of the semiconductor layer 23 to be the same as the electron affinity EA1 of the constituent material of the photoelectric conversion layer 25 or to be smaller than the electron affinity EA1. That is, it is possible to increase a degree of freedom of the constituent materials of the semiconductor layer 23 and the photoelectric conversion layer 25.

Figure 4B:
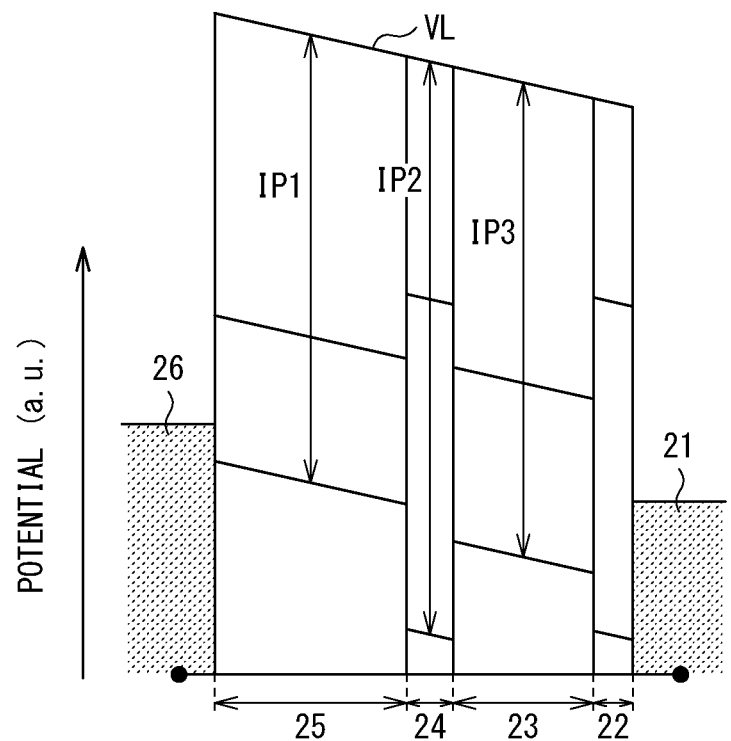
FIG. 4B is a diagram (2) that describes the energy of the barrier layer illustrated in FIG. 1.

FIG. 4B schematically illustrates ionization potential of the constituent material of the barrier layer 24. When the signal charges are holes, ionization potential (ionization potential IP2) of the constituent material of the barrier layer 24 is larger than ionization potential (ionization potential IP1) of the constituent material of the photoelectric conversion layer 25 and ionization potential (ionization potential IP3) of the constituent material of the semiconductor layer 23.

The barrier layer 24 is, for example, configured by silicon oxide (SiO), silicon nitride (SiN) or silicon oxynitride (SiON), and has a thickness of 0.1 nm to 50 nm, preferably 1 nm to 10 nm. When the signal charges are electrons, the barrier layer 24 may be configured by an organic material having an electron-injection blocking function. When the signal charges are holes, the barrier layer 24 may be configured by an organic material having a hole-injection blocking function. The barrier layer 24 is provided in common, for example, for the plurality of solid-state imaging elements 10 (FIG. 1).

The photoelectric conversion layer 25 provided between the barrier layer 24 and the second electrode 26 converts optical energy into electric energy. The photoelectric conversion layer 25 includes, for example, two or more organic semiconductor materials (p-type semiconductor materials or n-type semiconductor materials) which function as the p-type semiconductor or the n-type semiconductor, respectively. The photoelectric conversion layer 25 includes, in the layer, a junction plane (p/n junction plane) between the p-type semiconductor material and the n-type semiconductor material. The p-type semiconductor functions relatively as an electron donor (donor), and the n-type semiconductor functions relatively as an electron acceptor (acceptor). The photoelectric conversion layer 25 provides a field in which excitons generated upon light absorption separate into electrons and holes; specifically, the excitons separate into electrons and holes at an interface (p/n junction plane) between the electron donor and the electron acceptor.

The photoelectric conversion layer 25 may include, in addition to the p-type semiconductor material and the n-type semiconductor material, an organic semiconductor material, i.e., a so-called dye material that performs photoelectric conversion of light in a predetermined wavelength region while transmitting light in any other wavelength region. In a case where the photoelectric conversion layer 25 is formed using three types of organic semiconductor materials, i.e., the p-type semiconductor material, the n-type semiconductor material, and the dye material, the p-type semiconductor material and the n-type semiconductor material are each preferably a material having light-transmissivity in a visible region (e.g., 450 nm to 800 nm). The photoelectric conversion layer 25 has a thickness of, for example, 50 nm to 500 nm. The photoelectric conversion layer 25 is provided in common, for example, for the plurality of solid-state imaging elements 10 (FIG. 1).

Figure 5:
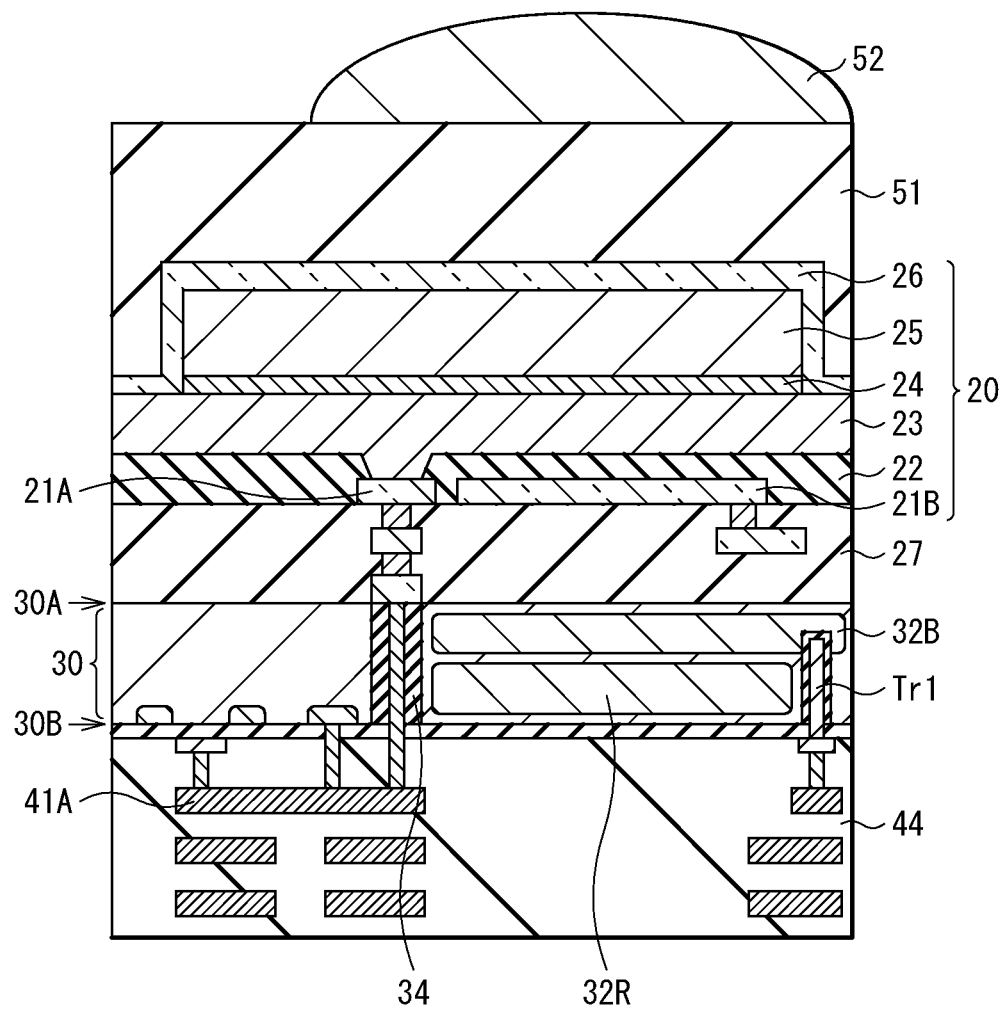
FIG. 5 is a cross-sectional schematic view of another example of a photoelectric conversion layer illustrated in FIG. 1.
Figure 6:
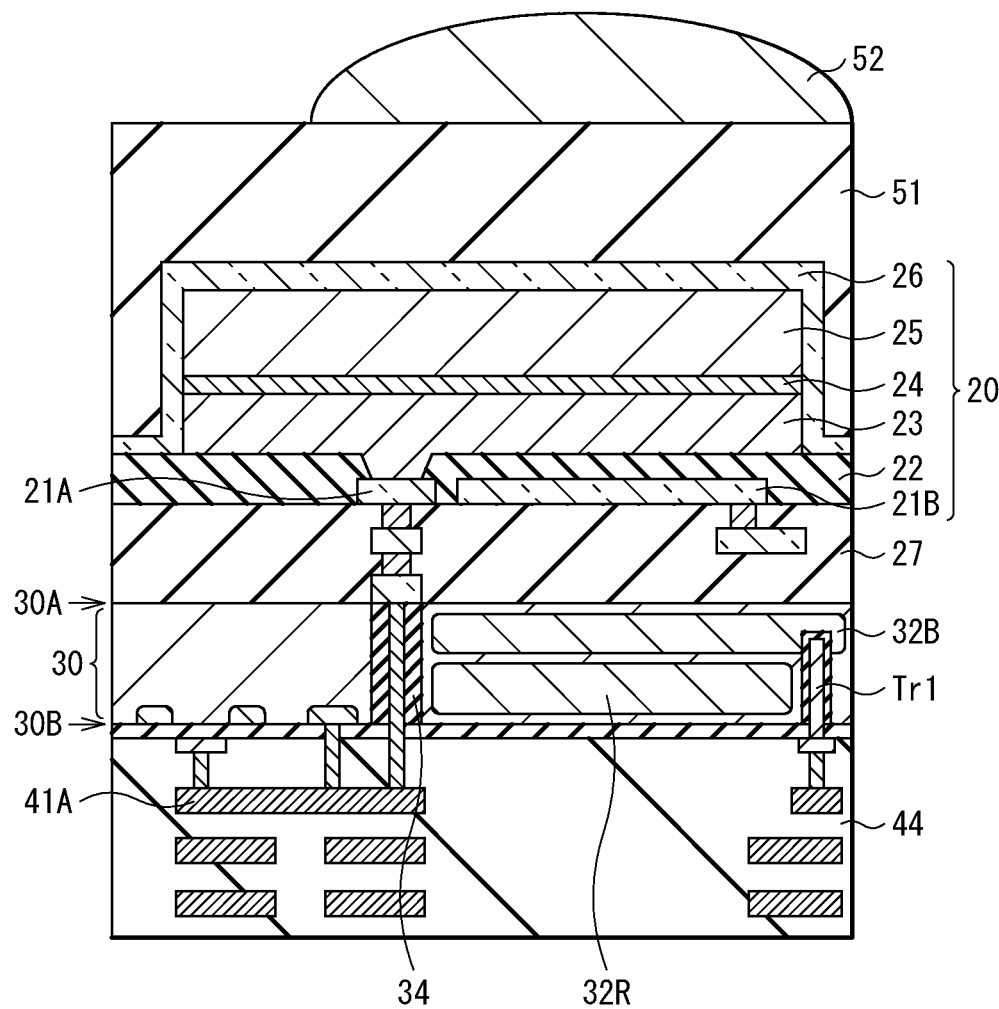
FIG. 6 is a cross-sectional schematic view of another example of the semiconductor layer and the photoelectric conversion layer illustrated in FIG. 1.

As illustrated in FIGS. 5 and 6, the photoelectric conversion layer 25 may be provided separately for each of the elements (pixels). At this time, the protective layer 51 is disposed between the photoelectric conversion layers 25 of the adjacent solid-state imaging elements 10. The semiconductor layer 23 may be provided in common for the plurality of solid-state imaging elements 10, and the barrier layer 24 and the photoelectric conversion layer 25 may be each provided separately for each of the elements (FIG. 5). The semiconductor layer 23, the barrier layer 24, and the photoelectric conversion layer 25 may be each provided separately for each of the elements (FIG. 6).

The photoelectric conversion layer 25 includes, for example, the p-type semiconductor, the n-type semiconductor, and the dye material. Examples of the p-type semiconductor include a thiophene derivative, a benzothienobenzothiophene derivative, a ferrocene derivative, a paraphenylenevinylene derivative, a carbazole derivative, a pyrrole derivative, an aniline derivative, a diamine derivative, a phthalocyanine derivative, a subphthalocyanine derivative, a hydrazone derivative, a naphthalene derivative, an anthracene derivative, a phenanthrene derivative, a pyrene derivative, a perylene derivative, a tetracene derivative, a pentacene derivative, a quinacridone derivative, a thienothiophene derivative, a benzothiophene derivative, triarylamine derivative, a perylene derivative, a picene derivative, a chrysene derivative, a fluoranthene derivative, a subporphyrazine derivative, a metal complex including a heterocyclic compound as a ligand, a polythiophene derivative, a polybenzothiadiazole derivative, and a polyfluorene derivative. These materials have relatively high mobility, and thus facilitate design for a hole transport property.

Examples of the n-type semiconductor contained in the photoelectric conversion layer 25 include fullerene or a fullerene derivative. The fullerene is, for example, high-order fullerene and endohedral fullerene. The high-order fullerene is, for example, $C_{60}$, $C_{70}$ and $C_{74}$, etc. The fullerene derivative is, for example, fullerene fluoride, a PCBM ([6,6]-Phenyl-C61-Butyric Acid Methyl Ester) fullerene compound and a fullerene multimer, etc. The fullerene derivative may include a halogen atom, an alkyl group, a phenyl group, a functional group having an aromatic compound, a functional group having a halide, a partial fluoroalkyl group, a perfluoroalkyl group, a silyl alkyl group, a silyl alkoxy group, an aryl silyl group, an aryl sulfanyl group, an alkyl sulfanyl group, an aryl sulfonyl group, an alkyl sulfonyl group, an aryl sulfide group, an alkyl sulfide group, an amino group, an alkyl amino group, an aryl amino group, a hydroxy group, an alkoxy group, an acyl amino group, an acyloxy group, a carbonyl group, a carboxy group, a carboxyamide group, a carboalkoxy group, an acyl group, a sulfonyl group, a cyano group, a nitro group, a group having a chalcogenide, a phosphine group, or a phosphone group, etc. The alkyl group may be linear or branched. A cyclic alkyl group may be included in the fullerene derivative. The aromatic compound may include a plurality of cyclic structures. The plurality of cyclic structures may be bonded by a single bond or may have a fused ring structure.

The n-type semiconductor included in the photoelectric conversion layer 25 may be, for example, an oxazole derivative, an oxadiazole derivative, a triazole derivative, an organic molecule including a heterocyclic compound in a portion of a molecular skeleton, an organic metal complex, or a subphthalocyanine derivative, etc. The heterocyclic compound contains a nitrogen atom, an oxygen atom, or a sulfur atom. Examples of the heterocyclic compound include a pyridine derivative, a pyrazine derivative, a pyrimidine derivative, a triazine derivative, a quinoline derivative, a quinoxaline derivative, an isoquinoline derivative, an acridine derivative, a phenazine derivative, a phenanthroline derivative, a tetrazole derivative, a pyrazole derivative, an imidazole derivative, a thiazole derivative, an imidazole derivative, a benzimidazole derivative, a benzotriazole derivative, a benzoxazole derivative, a carbazole derivative, a benzofuran derivative, a dibenzofuran derivative, a subporphyrazine derivative, a polyphenylenevinylene derivative, a polybenzothiadiazole derivative, and a polyfluorene derivative, etc. These materials have relatively high mobility, and facilitate design for an electron transport property.

Examples of the dye material contained in the photoelectric conversion layer 25 include a phthalocyanine derivative, a subphthalocyanine derivative, a quinacridone derivative, a naphthalocyanine derivative, and a squarylium derivative. The photoelectric conversion layer 25 may include a rhodamine-based dye, a merocyanine-based dye, a coumaric acid dye, or a tris-8-hydroxyquinoline aluminum (Alq3), etc. The photoelectric conversion layer 25 may include a plurality of materials, or may have a stacked structure. The photoelectric conversion layer 25 may include a material that does not directly contribute to photoelectric conversion.

Another layer may be provided between the photoelectric conversion layer 25 and the first electrode 21A (specifically, between the semiconductor layer 23 and the insulating layer 22) and between the photoelectric conversion layer 25 and the second electrode 26. Specifically, for example, there may be stacked, in order from side of the first electrode 21A, an underlying film, a hole transport layer, an electron blocking film, the photoelectric conversion layer 25, a hole blocking film, a buffer film, an electron transport layer, and a work function adjusting film, etc.

The second electrode 26 is opposed to the first electrode 21A and the accumulation electrode 21B, with the semiconductor layer 23, the barrier layer 24 and the photoelectric conversion layer 25 interposed therebetween. The second electrode 26 is configured by an electrically-conductive film having light-transmissivity, similarly to the first electrode 21A and the accumulation electrode 21B. In the solid-state imaging device 1 using the solid-state imaging element 10 as one pixel, the second electrodes 26 may be separated for each pixel, or may be formed as an electrode common to the pixels. The second electrode 26 has a thickness of, for example, 10 nm to 200 nm.

The interlayer insulating layer 27s provided between the insulating layer 22 and the first surface 30A of and the semiconductor substrate 30 is configured by, for example, a monolayer film of one of silicon oxide, silicon nitride and silicon oxynitride (SiON), or a stacked layer film of two or more thereof.

The dielectric layer 27y is provided between the interlayer insulating layer 27s and the first surface 30A of the semiconductor substrate 30. The dielectric layer 27y is formed by, for example, a silicon oxide film, TEOS, a silicon nitride film, a silicon oxynitride film, or the like, although a material of the dielectric layer 27y is not particularly limited.

The fixed charge layer 27k is provided between the dielectric layer 27y and the first surface 30A of the semiconductor substrate 30. The fixed charge layer 27k may be a film having a positive fixed charge, or may be a film having a negative fixed charge. Examples of the material of the film having a negative fixed charge include hafnium oxide, aluminum oxide, zirconium oxide, tantalum oxide, titanium oxide, and the like. In addition, as a material other than those mentioned above, there may be used lanthanum oxide, praseodymium oxide, cerium oxide, neodymium oxide, promethium oxide, samarium oxide, europium oxide, gadolinium oxide, terbium oxide, dysprosium oxide, holmium oxide, thulium oxide, ytterbium oxide, lutetium oxide, yttrium oxide, an aluminum nitride film, a hafnium oxynitride film or an aluminum oxynitride film, etc.

The fixed charge layer 27k may have a configuration in which two or more types of films are stacked. Thus, for example, in the case of a film having negative fixed charges, the function as a hole accumulation layer is able to be further enhanced.

The protective layer 51 is provided to cover the second electrode 26. The protective layer 51 is configured by a material having light-transmissivity, and is configured by, for example, a monolayer film of one of silicon oxide, silicon nitride, silicon oxynitride, and the like, or a stacked layer film of two or more thereof. The protective layer 51 has a thickness of, for example, 100 nm to 30000 nm.

An on-chip lens 52 is provided on the protective layer 51. The on-chip lens 52 is provided, for example, at a region opposed to the accumulation electrode 21B, and condenses incident light to the photoelectric conversion layer 25 of a part opposed to the accumulation electrode 21B. The solid-state imaging element 10 may be provided with a bonding pad (not illustrated).

The semiconductor substrate 30 is configured by, for example, an n-type silicon (Si) substrate, and includes a p-well 31 in a predetermined region. The second surface 30B of the p-well 31 is provided with the above-described transfer transistors Tr2 and Tr3, the amplifier transistor AMP, the reset transistor RST, the selection transistor SEL, and the like. In addition, the peripheral part of the semiconductor substrate 30 is provided with a peripheral circuit (not illustrated) including a logic circuit or the like.

Figure 7:
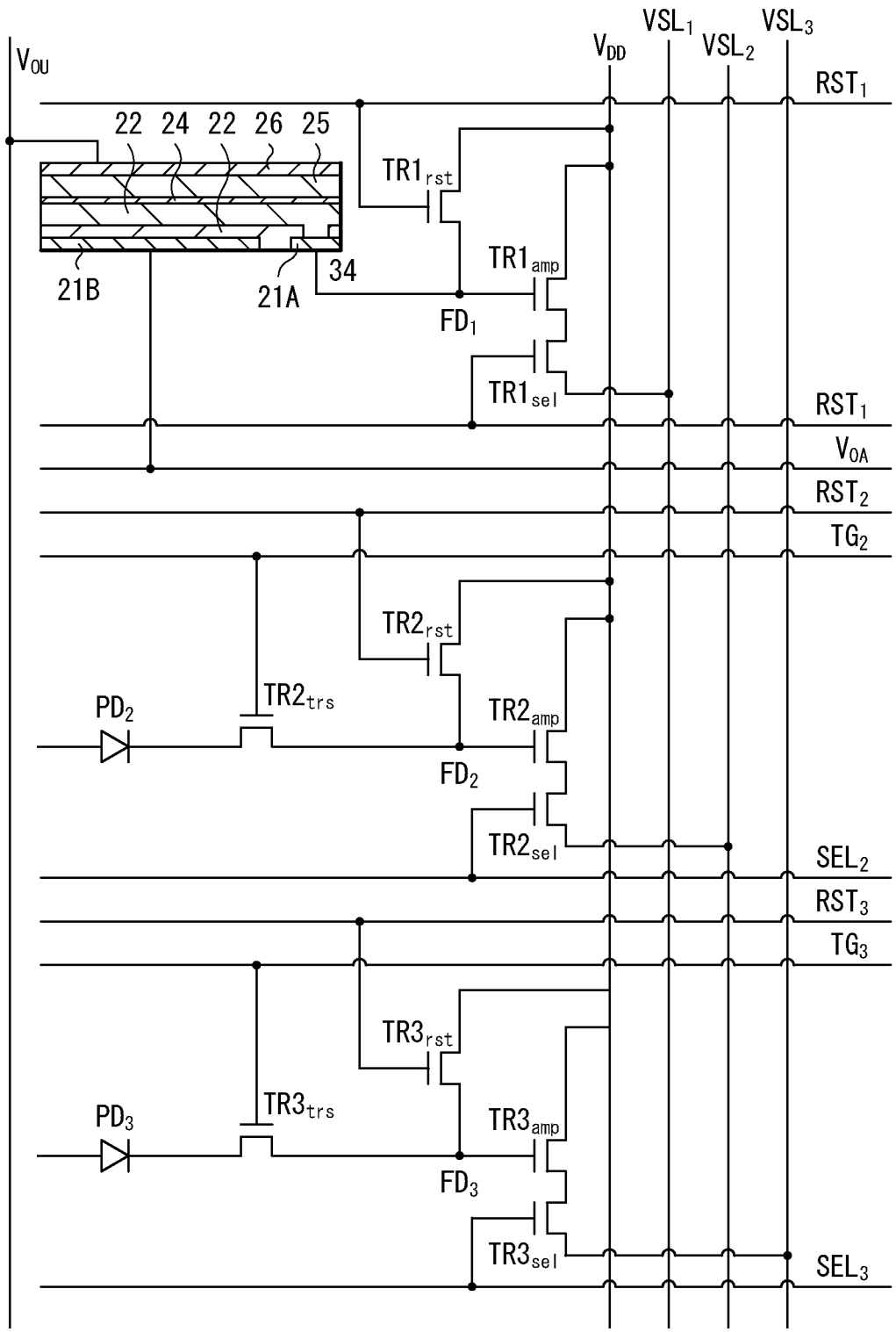
FIG. 7 is an equivalent circuit diagram of the solid-state imaging element illustrated in FIG. 1.
Figure 8:
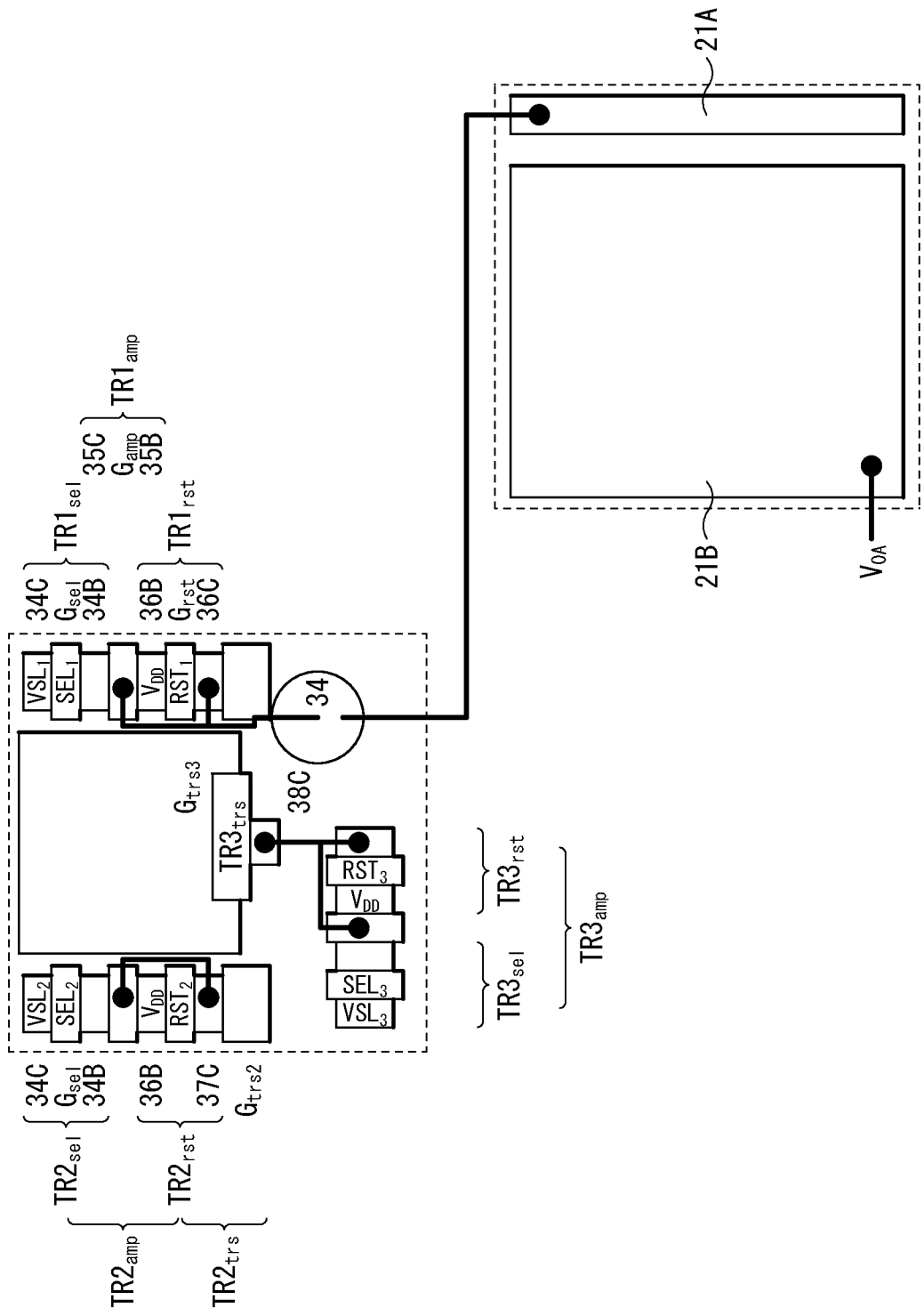
FIG. 8 is a schematic view of arrangement of the first electrode, the accumulation electrode, and various transistors of the solid-state imaging element illustrated in FIG. 1.

FIG. 7 is an equivalent circuit diagram of the solid-state imaging element 10, and FIG. 8 illustrates arrangement of the transistors, together with the first electrode 21A and the accumulation electrode 21B. Description is given of a configuration of the semiconductor substrate 30, with reference to FIGS. 7 and 8 together with FIG. 1.

The reset transistor RST (reset transistor Tr1rst) resets charges transferred to the floating diffusion FD1 from the organic photoelectric conversion section 20, and is configured by a MOS transistor, for example. Specifically, the reset transistor Tr1rst is configured by the reset gate Grst, a channel-forming region 36A, and source/drain regions 36B and 36C. The reset gate Grst is coupled to a reset line RST1, and one source/drain region 36B of the reset transistor Tr1rst also serves as the floating diffusion FD1. Another source/drain region 36C configuring the reset transistor Tr1rst is coupled to a power supply VDD.

The amplifier transistor AMP is a modulation element that modulates an amount of charges generated in the organic photoelectric conversion section 20 to a voltage, and is configured by a MOS transistor, for example. Specifically, the amplifier transistor AMP is configured by the gate Gamp, a channel-forming region 35A, and source/drain regions 35B and 35C. The gate Gamp is coupled to the first electrode 21A and the one source/drain region 36B (floating diffusion FD1) of the reset transistor Tr1rst via the lower first contact 45, the coupling part 41A, the lower second contact 46 and the through electrode 34, etc. In addition, one source/drain region 35B shares a region with the other source/drain region 36C configuring the reset transistor Tr1rst, and is coupled to the power supply VDD.

The selection transistor SEL (selection transistor TR1sel) is configured by a gate Gsel, a channel-forming region 34A, and source/drain regions 34B and 34C. The gate Gsel is coupled to a selection line SEL1. In addition, one source/ drain region 34B shares a region with another source/drain region 35C configuring the amplifier transistor AMP. Another source/drain region 34C is coupled to a signal line (data output line) VSL1.

The inorganic photoelectric conversion sections 32B and 32R each have a p-n junction at a predetermined region of the semiconductor substrate 30. The inorganic photoelectric conversion sections 32B and 32R enable spectroscopy of light in the vertical direction by utilizing different wavelengths of light absorbed in accordance with incident depth of light in a silicon substrate. The inorganic photoelectric conversion section 32B selectively detects blue light to accumulate signal charges corresponding to a blue color, and is installed at a depth that enables efficient photoelectric conversion of the blue light. The inorganic photoelectric conversion section 32R selectively detects red light to accumulate signal charges corresponding to a red color, and is installed at a depth that enables efficient photoelectric conversion of the red light. It is to be noted that the blue (B) is a color corresponding to a wavelength region of 450 nm to 495 nm, for example, and the red (R) is a color corresponding to a wavelength region of 620 nm to 750 nm, for example. It is sufficient for the inorganic photoelectric conversion sections 32B and 32R to be able to detect light in a portion or all of the respective wavelength regions.

The inorganic photoelectric conversion section 32B includes, for example, a p+ region serving as a hole accumulation layer and an n region serving as an electron accumulation layer. The inorganic photoelectric conversion section 32R includes, for example, a p+ region serving as a hole accumulation layer and an n region serving as an electron accumulation layer (having a p-n-p stacked structure). The n region of the inorganic photoelectric conversion section 32B is coupled to the vertical transfer transistor Tr2. The p+ region of the inorganic photoelectric conversion section 32B bends along the transfer transistor Tr2, and leads to the p+ region of the inorganic photoelectric conversion section 32R.

The transfer transistor Tr2 (transfer transistor TR2trs) is provided for transferring, to the floating diffusion FD2, signal charges (here, electrons) corresponding to a blue color, which have been generated and accumulated in the inorganic photoelectric conversion section 32B. The inorganic photoelectric conversion section 32B is formed at a deep position from the second surface 30B of the semiconductor substrate 30, and thus the transfer transistor TR2trs of the inorganic photoelectric conversion section 32B is preferably configured by a vertical transistor. In addition, the transfer transistor TR2trs is coupled to a transfer gate line TG2. Further, the floating diffusion FD2 is provided in the region 37C in the vicinity of a gate Gtrs2 of the transfer transistor TR2trs. The charges accumulated in the inorganic photoelectric conversion section 32B is read by the floating diffusion FD2 via a transfer channel formed along the gate Gtrs2.

The transfer transistor Tr3 (a transfer transistor TR3trs) transfers, to the floating diffusion FD3, signal charges (here, electrons) corresponding to the red color generated and accumulated in the inorganic photoelectric conversion section 32R, and is configured by, for example, a MOS transistor. In addition, the transfer transistor TR3trs is coupled to a transfer gate line TG3. Further, the floating diffusion FD3 is provided in the region 38C in the vicinity of a gate Gtrs3 of the transfer transistor TR3trs. The charges accumulated in the inorganic photoelectric conversion section 32R is read by the floating diffusion FD3 via a transfer channel formed along the gate Gtrs3.

There are further provided, on the side of the second surface 30B of the semiconductor substrate 30, a reset transistor TR2rst, an amplifier transistor TR2amp, and a selection transistor TR2sel which configure a controller of the inorganic photoelectric conversion section 32B. In addition, there are provided a reset transistor TR3rst, an amplifier transistor TR3amp, and a selection transistor TR3sel which configure a controller of the inorganic photoelectric conversion section 32R.

The reset transistor TR2rst is configured by a gate, a channel-forming region, and a source/drain region. A gate of the reset transistor TR2rst is coupled to a reset line RST2, and one of the source/drain region of the reset transistor TR2rst is coupled to the power supply VDD. Another of the source/drain region of the reset transistor TR2rst also serves as the floating diffusion FD2.

The amplifier transistor TR2amp is configured by a gate, a channel-forming region, and a source/drain region. The gate is coupled to the other of the source/drain region (floating diffusion FD2) of the reset transistor TR2rst. In addition, one of the source/drain region configuring the amplifier transistor TR2amp shares a region with the one of the source/drain region configuring the reset transistor TR2rst, and is coupled to the power supply VDD.

The selection transistor TR2sel is configured by a gate, a channel-forming region, and a source/drain region. The gate is coupled to a selection line SEL2. In addition, one of the source/drain region configuring the selection transistor TR2sel shares a region with another of the source/drain region configuring the amplifier transistor TR2amp. Another of the source/drain region configuring the selection transistor TR2sel is coupled to a signal line (data output line) VSL2.

The reset transistor TR3rst is configured by a gate, a channel-forming region, and a source/drain region. A gate of the reset transistor TR3rst is coupled to a reset line RST3, and one of the source/drain region configuring the reset transistor TR3rst is coupled to the power supply VDD. Another of the source/drain region configuring the reset transistor TR3rst also serves as the floating diffusion FD3.

The amplifier transistor TR3amp is configured by a gate, a channel-forming region, and a source/drain region. The gate is coupled to the other of the source/drain region (floating diffusion FD3) configuring the reset transistor TR3rst. In addition, one of the source/drain region configuring the amplifier transistor TR3amp shares a region with the one of the source/drain region configuring the reset transistor TR3rst, and is coupled to the power supply VDD.

The selection transistor TR3sel is configured by a gate, a channel-forming region, and a source/drain region. The gate is coupled to a selection line SEL3. In addition, one of the source/drain region configuring the selection transistor TR3sel shares a region with the other of the of the source/drain region configuring the amplifier transistor TR3amp. Another of the source/drain region configuring the selection transistor TR3 set is coupled to a signal line (data output line) VSL3.

The reset lines RST1, RST2, and RST3, the selection lines SEL1, SEL2, and SEL3, and the transfer gate lines TG2 and TG3 are each coupled to a vertical drive circuit 112 configuring a drive circuit. The signal lines (data output lines) VSL1, VSL2, and VSL3 are coupled to a column signal processing circuit 113 configuring the drive circuit.

The lower first contact 45, the lower second contact 46, the upper first contact 29A, and the upper second contact 29B are each configured by a doped silicon material such as PDAS (Phosphorus Doped Amorphous Silicon) or a metal material such as aluminum (Al), tungsten (W), titanium (Ti), cobalt (Co), hafnium (Hf), or tantalum (Ta).

1-2. Method for Manufacturing Solid-State Imaging Element

The solid-state imaging element 10 may be manufactured, for example, as follows (FIGS. 9 to 14).

Figure 9:
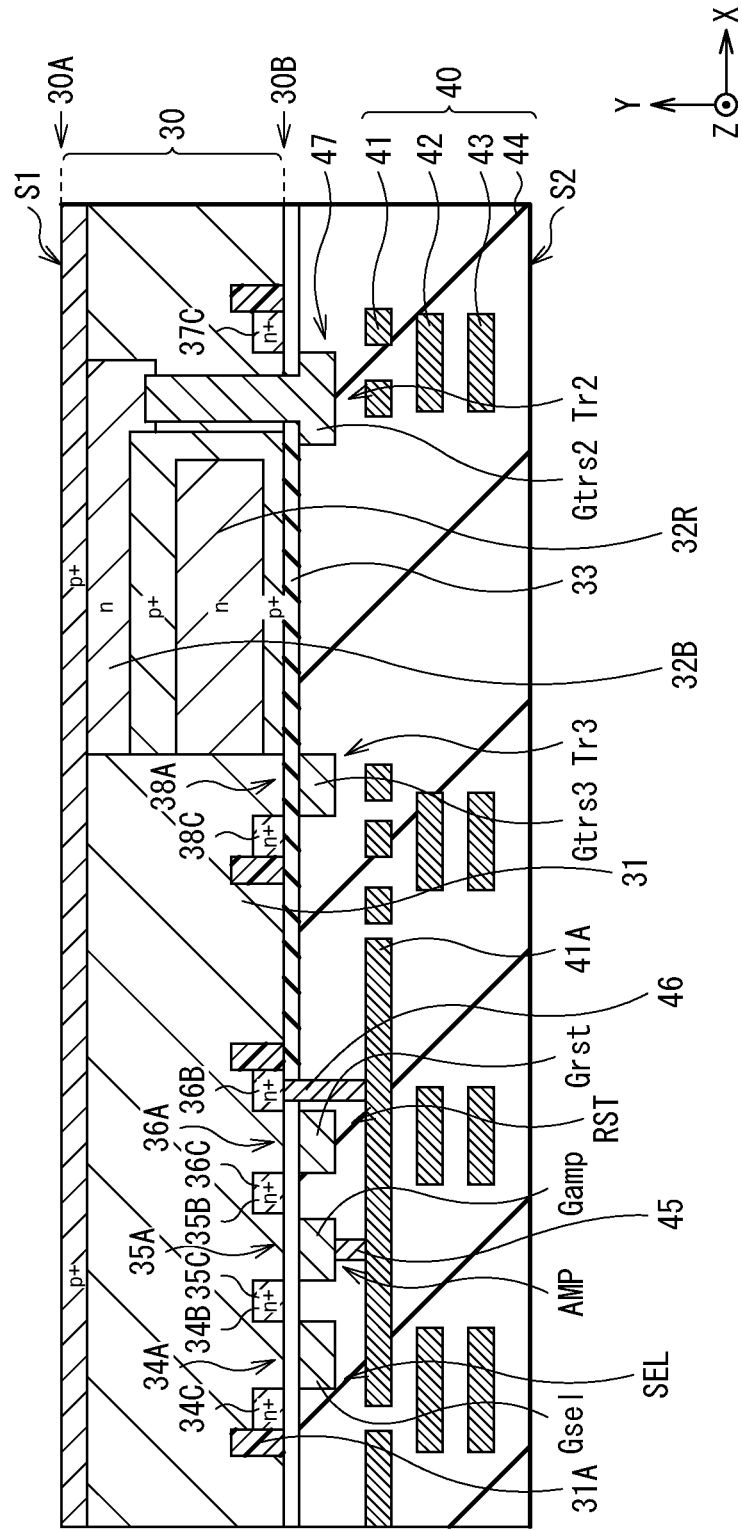
FIG. 9 is a cross-sectional schematic view of one step in a manufacturing method of the solid-state imaging element illustrated in FIG. 1.

First, as illustrated in FIG. 9, for example, the p-well 31 is formed as a well of a first electrically-conductive type in the semiconductor substrate 30, and the inorganic photoelectric conversion sections 32B and 32R of a second electrically-conductive type (e.g., n-type) are formed in the p-well 31. A p+ region is formed in the vicinity of the first surface 30A of the semiconductor substrate 30.

As illustrated in FIG. 9 as well, for example, n+ regions to serve as the floating diffusions FD1 to FD3 are formed on the second surface 30B of the semiconductor substrate 30, and thereafter a gate insulating layer 33 and a gate wiring layer 47 including respective gates of the transfer transistor Tr2, the transfer transistor Tr3, the selection transistor SEL, the amplifier transistor AMP, and the reset transistor RST are formed. This leads to formation of the transfer transistor Tr2, the transfer transistor Tr3, the selection transistor SEL, the amplifier transistor AMP, and the reset transistor RST. Further, there are formed, on the second surface 30B of the semiconductor substrate 30, the wiring layers 41 to 43 (multilayer wiring line 40) including the lower first contact 45, the lower second contact 46 and the coupling part 41A, and the insulating layer 44.

As a base of the semiconductor substrate 30, for example, an SOI (Silicon on Insulator) substrate is used, in which the semiconductor substrate 30, a buried oxide film (not illustrated), and a holding substrate (not illustrated) are stacked. Although not illustrated in FIG. 9, the buried oxide film and the holding substrate are joined to the first surface 30A of the semiconductor substrate 30. After ion implantation, anneal processing is performed.

Next, a supporting substrate (not illustrated) or another semiconductor substrate, etc. is joined to the side of the second surface 30B (side of multilayer wiring line 40) of the semiconductor substrate 30, and the substrate is vertically inverted. Subsequently, the semiconductor substrate 30 is separated from the buried oxide film and the holding substrate of the SOI substrate to expose the first surface 30A of the semiconductor substrate 30. The above steps may be performed by techniques used in common CMOS processes, such as ion implantation and CVD (Chemical Vapor Deposition).

Figure 10:
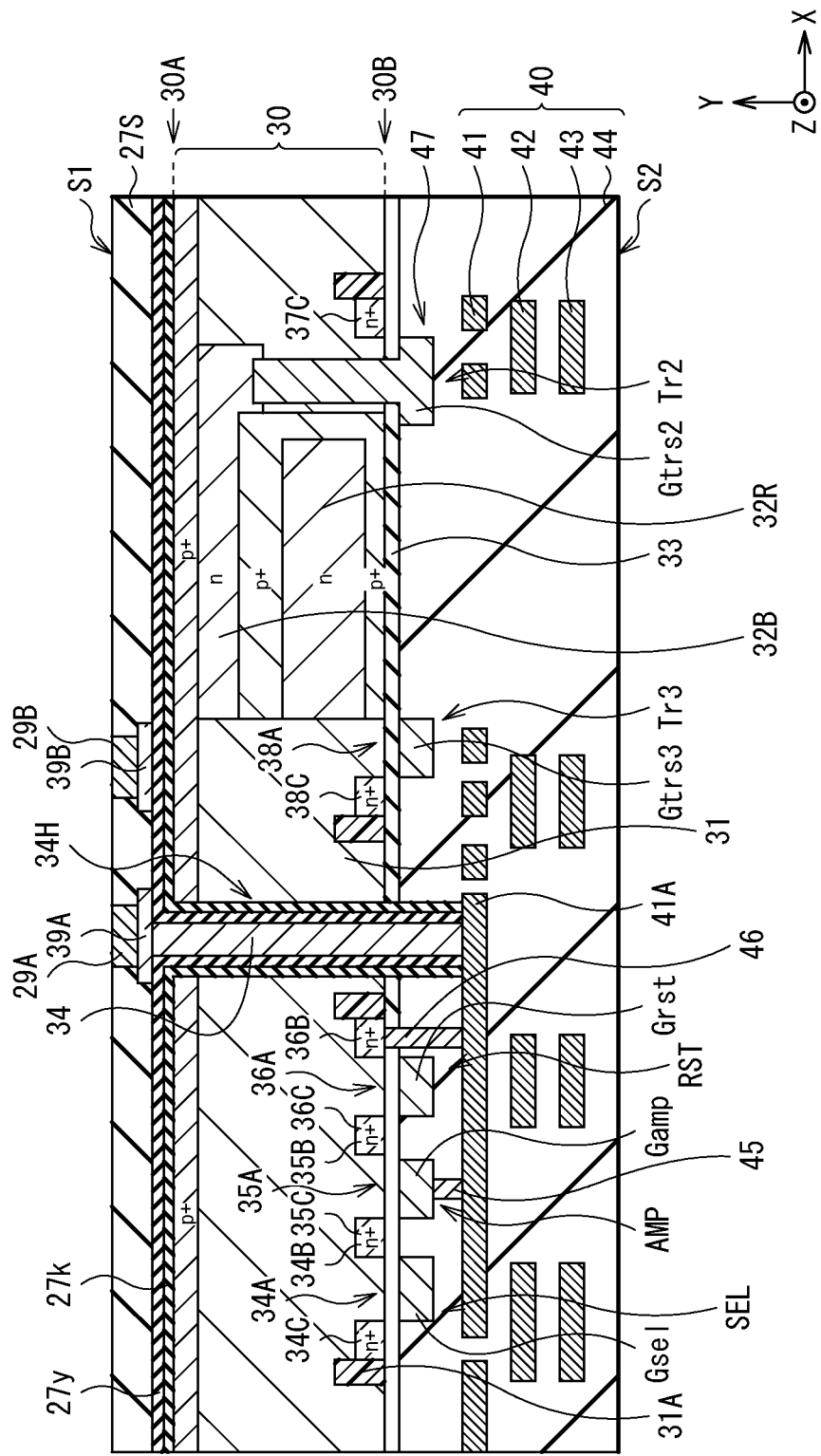
FIG. 10 is a cross-sectional schematic view of a step subsequent to FIG. 9.

Next, as illustrated in FIG. 10, the semiconductor substrate 30 is processed from the side of the first surface 30A by dry etching, for example, to form a ring-shaped opening 34H, for example. As illustrated in FIG. 10, as for the depth, the opening 34H penetrates from the first surface 30A to the second surface 30B of the semiconductor substrate 30, and reaches, for example, the coupling part 41A.

Subsequently, for example, the negative fixed charge layer 27k is formed on the first surface 30A of the semiconductor substrate 30 and a side surface of the opening 34H. Two or more types of films may be stacked as the negative fixed charge layer 27k. This makes it possible to further enhance the function as the hole accumulation layer. After the formation of the negative fixed charge layer 27k, the dielectric layer 27y is formed. Next, after formation of the coupling wiring lines 39A and 39B at predetermined positions on the dielectric layer 27y, a photolithography method and a CMP (Chemical Mechanical Polishing) method are used to form the interlayer insulating layer 27s including, for example, an SiO film, in which the upper first contact 29A and the upper second contact 29B are embedded on the coupling wiring lines 39A and 39B.

Figure 11:
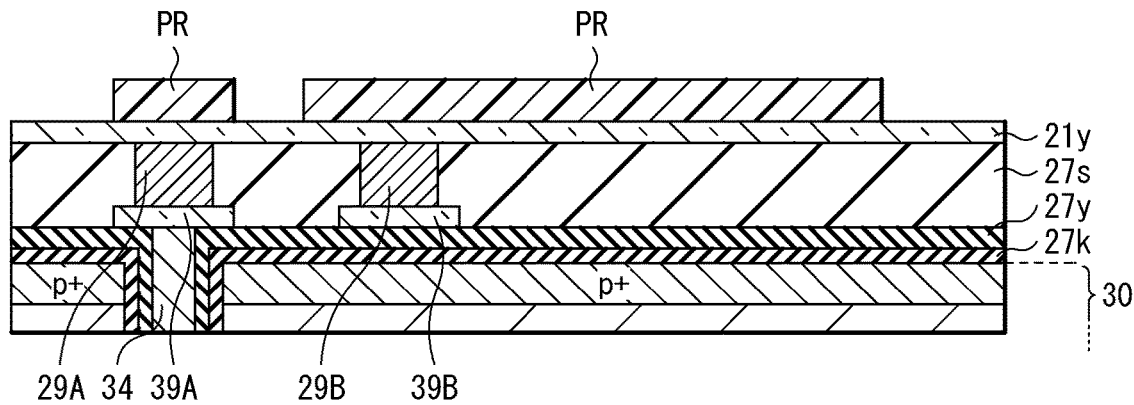
FIG. 11 is a cross-sectional schematic view of a step subsequent to FIG. 10.
Figure 12:
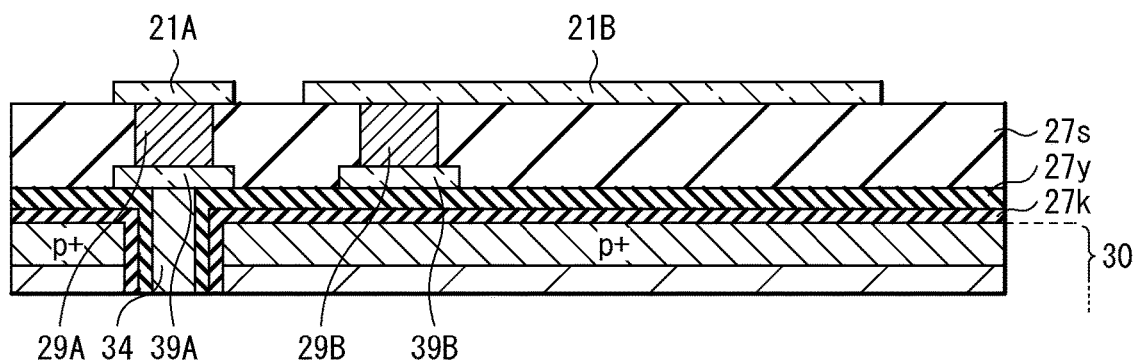
FIG. 12 is a cross-sectional schematic view of a step subsequent to FIG. 11.

Subsequently, as illustrated in FIG. 11, an electrically-conductive film 21y is formed on the upper first contact 29A, the upper second contact 29B and the interlayer insulating layer 27s, and thereafter a photoresist PR is formed at a predetermined position of the electrically-conductive film 21y. Thereafter, the first electrode 21A and the accumulation electrode 21B are formed as illustrated in FIG. 12 by etching and removal of the photoresist PR.

Then, for example, an SiO film is formed on the interlayer insulating layer 27s, the first electrode 21A and the accumulation electrode 21B, and thereafter a CMP method is used to planarize the SiO film. Subsequently, the insulating layer 22 is formed, as a film, on the interlayer insulating layer 27s, the first electrode 21A and the accumulation electrode 21B. The insulating layer 22 is formed, as a film, using an ALD (Atomic Layer Deposition) method, for example.

Figure 13:
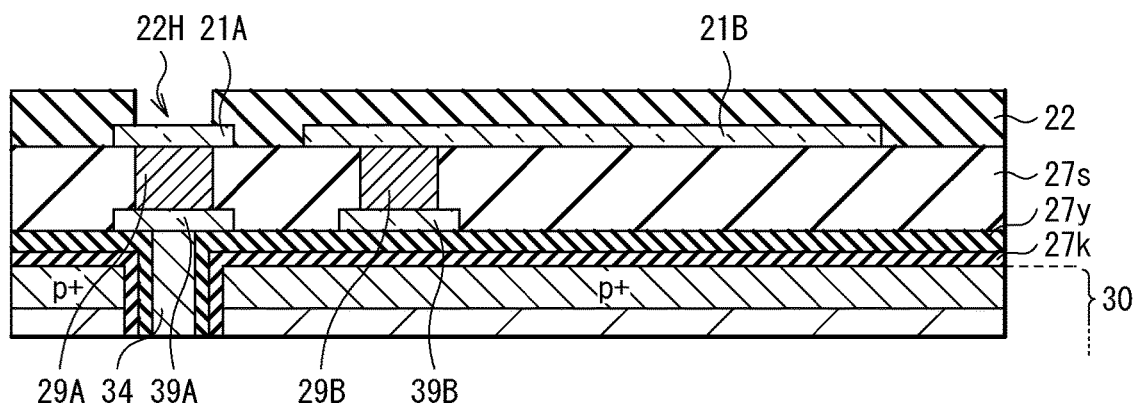
FIG. 13 is a cross-sectional schematic view of a step subsequent to FIG. 12.

Next, as illustrated in FIG. 13, the photoresist PR is formed on a region facing the first electrode 21A, and, for example, a dry etching method is used to etch the insulating layer 22. This allows the opening 22H to be formed.

Figure 14:
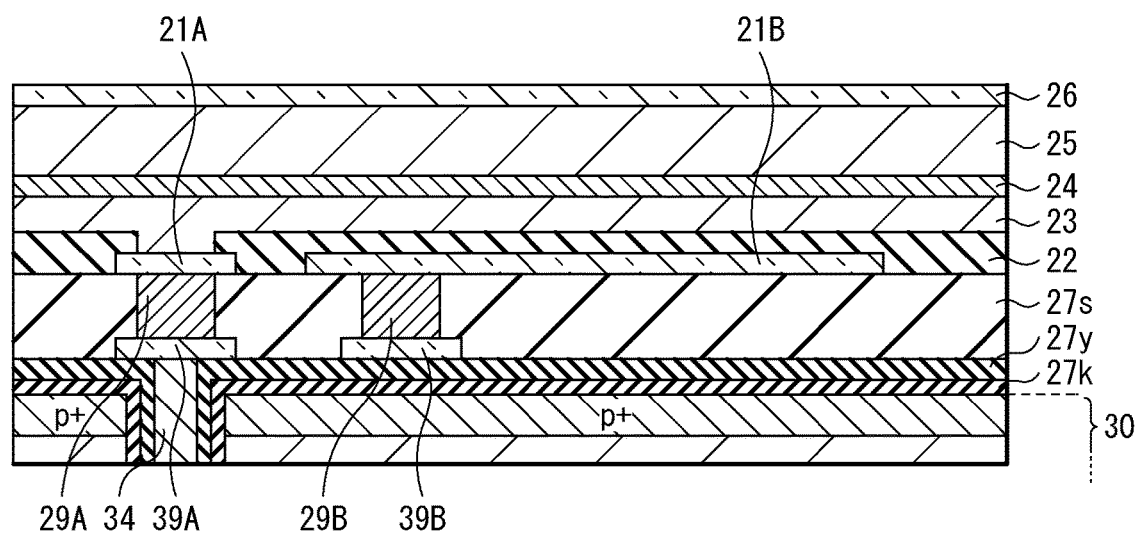
FIG. 14 is a cross-sectional schematic view of a step subsequent to FIG. 13.

Subsequently, as illustrated in FIG. 14, there are formed in order, on the insulating layer 22 and the first electrode 21A, the semiconductor layer 23, the barrier layer 24, the photoelectric conversion layer 25, and the second electrode 26. The protective layer 51 is then formed. Thereafter, an optical member such as a planarizing layer and the on-chip lens 52 are disposed. Thus, the solid-state imaging element 10 illustrated in FIG. 1 is completed.

1-3. Operation of Solid-State Imaging Element

In the solid-state imaging element 10, when light enters the organic photoelectric conversion section 20 through the on-chip lens 52, the light passes through the organic photoelectric conversion section 20 and the inorganic photoelectric conversion sections 32B and 32R in this order, and is photoelectrically converted for each light of green, blue, and red in the passage process. Hereinafter, description is given of a signal acquisition operation of each color.

(Acquisition of Green Signal by Organic Photoelectric Conversion Section 20)

Green light of the light having entered the solid-state imaging element 10 is first selectively detected (absorbed) by the organic photoelectric conversion section 20, and is subjected to photoelectrical conversion.

The organic photoelectric conversion section 20 is coupled to the gate Gamp of the amplifier transistor AMP and the floating diffusion FD1 via the through electrode 34. Therefore, electrons of the electron-hole pairs generated in the organic photoelectric conversion section 20 are extracted from side of the first electrode 21A and the accumulation electrode 21B, transferred to the side of the second surface 30B of the semiconductor substrate 30 via the through electrode 34, and accumulated in the floating diffusion FD1. At the same time, a charge amount generated in the organic photoelectric conversion section 20 is modulated into a voltage by the amplifier transistor AMP.

In addition, the reset gate Grst of the reset transistor RST is disposed next to the floating diffusion FD1. Thus, the charges accumulated in the floating diffusion FD1 are reset by the reset transistor RST.

Here, the organic photoelectric conversion section 20 is coupled not only to the amplifier transistor AMP but also to the floating diffusion FD1 via the through electrode 34, thus making it possible to easily reset the charges accumulated in the floating diffusion FD1 by the reset transistor RST.

In contrast, in a case where the through electrode 34 and the floating diffusion FD1 are not coupled to each other, it is difficult to reset the charges accumulated in the floating diffusion FD1, thus resulting in application of a large voltage to pull out the charges to the side of the second electrode 26. Accordingly, the photoelectric conversion layer 25 may be possibly damaged. In addition, the structure that enables resetting in a short period of time leads to an increase in dark noises, resulting in a trade-off, which structure is thus difficult.

Figure 15:
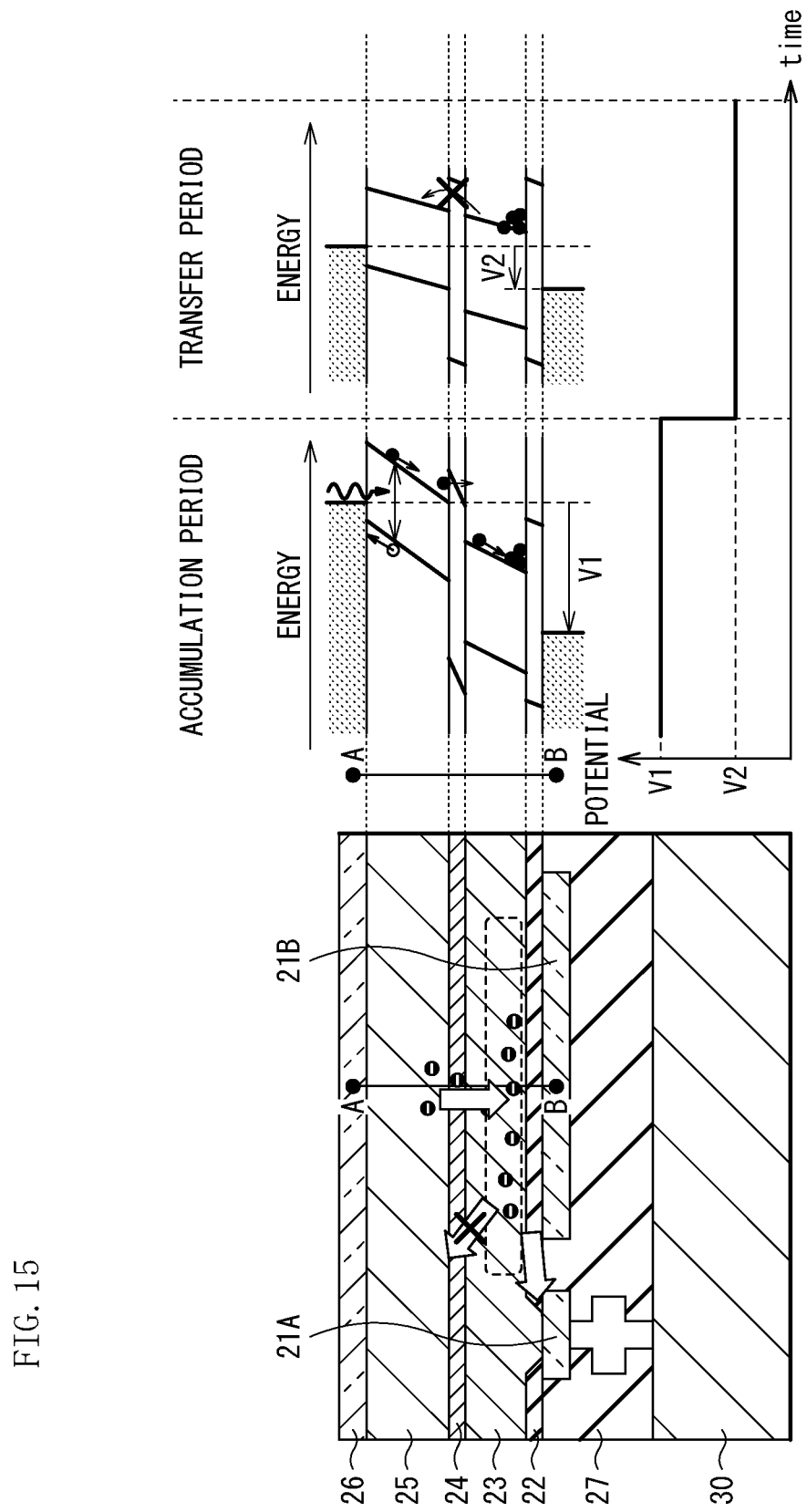
FIG. 15 is an explanatory schematic view of an operation of the solid-state imaging element illustrated in FIG. 1.

Description is given, with reference to FIG. 15, of accumulation and transfer of signal charges by the first electrode 21A and the accumulation electrode 21B.

In the solid-state imaging element 10, changing a potential to be applied to the accumulation electrode 21B causes charges to be accumulated and transferred. In the accumulation period, a positive potential V1 is applied to the accumulation electrode 21B from the drive circuit. This causes an electric field of a certain amount or more to be applied to the barrier layer 24, and thus charges (here, electrons) generated in the photoelectric conversion layer 25 move from the photoelectric conversion layer 25 to the semiconductor layer 23 via the barrier layer 24, and are accumulated in the semiconductor layer 23 of a part opposed to the accumulation electrode 21B (accumulation period). Holes generated in the photoelectric conversion layer 25 is discharged via the second electrode 26.

A reset operation is performed in a later stage of the accumulation period. Specifically, a scanning section changes a voltage of the reset signal RST from a low level to a high level at a predetermined timing. This bring, in the unit pixel P, a reset transistor TR1rst into an on state; as a result, a voltage of the floating diffusion FD1 is set to the power supply voltage VDD, and the voltage of the floating diffusion FD1 is reset.

After completion of the reset operation, reading of the signal charges is performed. Upon the reading of the signal charges, a potential V2 is applied from the drive circuit to the first electrode 21A. As for the potential V2, V2<V1 holds true. The potential V2 may be a negative potential. Here, the barrier layer 24 functions as an insulating layer. The application of the potential V2 to the first electrode 21A causes the signal charges (here, electrons) accumulated in a part, of the semiconductor layer 23, opposed to the accumulation electrode 21B to be read by the floating diffusion FD1 via the first electrode 21A. That is, the signal charges accumulated in the semiconductor layer 23 is read by the controller (transfer period).

Figure 16:
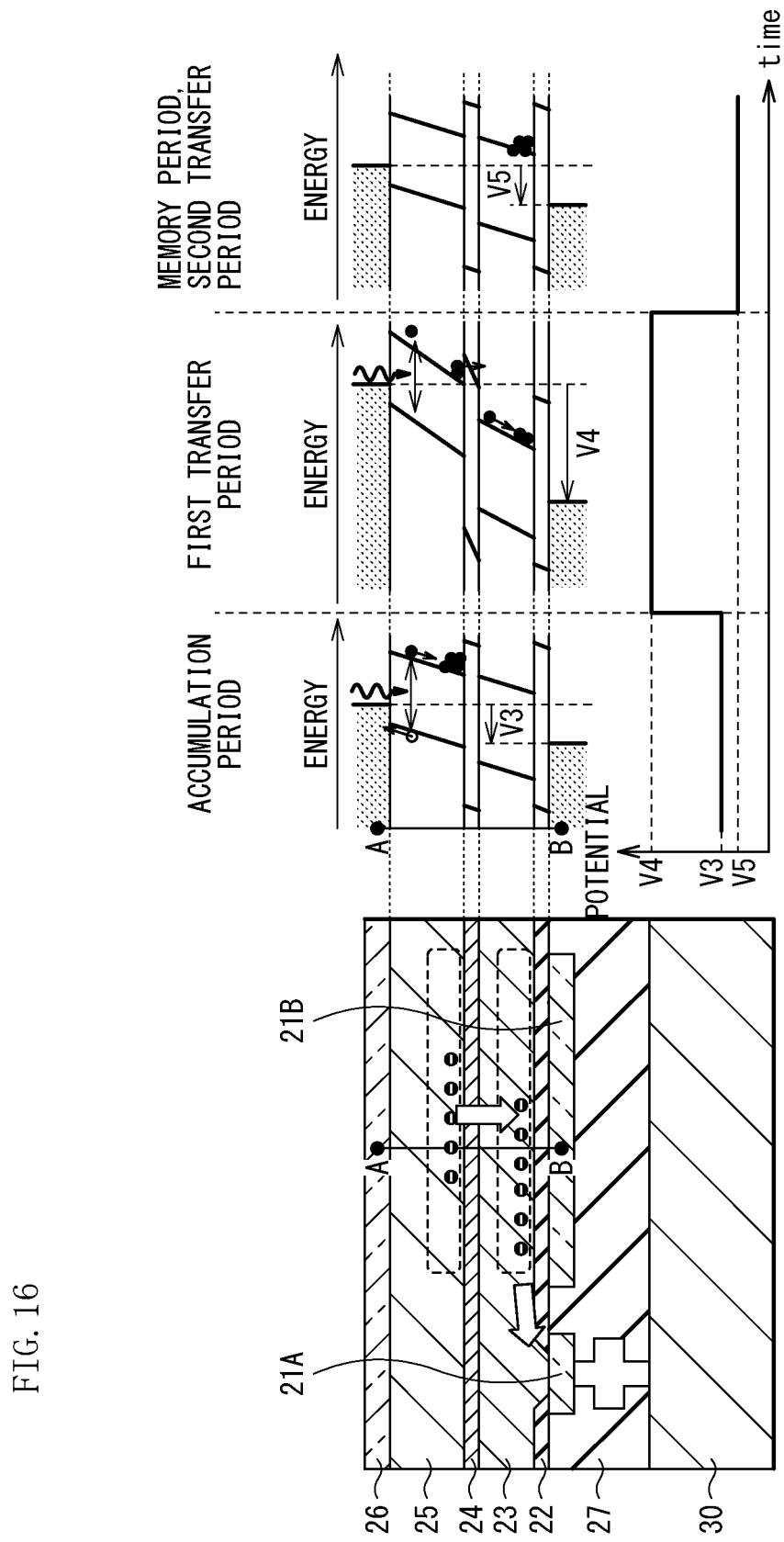
FIG. 16 is an explanatory schematic view of global shutter driving of the solid-state imaging element illustrated in FIG. 1.

In addition, as illustrated in FIG. 16, global shutter driving is also possible in the solid-state imaging element 10.

First, in the accumulation period, a predetermined potential V3 is applied from the drive circuit to the accumulation electrode 21B. Here, the barrier layer 24 functions as an insulating layer, and charges (here, electrons) generated in the photoelectric conversion layer 25 are accumulated in the photoelectric conversion layer 25 of a part opposed to the accumulation electrode 21B (accumulation period). The holes generated in the photoelectric conversion layer 25 are discharged via the second electrode 26.

In the following transfer period (first transfer period), a predetermined potential V4 is applied from the drive circuit to the accumulation electrode 21B. As for the potential V4, V3<V4 holds true. This causes an electric field of a certain amount or more to be applied to the barrier layer 24, and thus signal charges accumulated in the photoelectric conversion layer 25 are transferred, with all pixels (pixels P) at once, to the semiconductor layer 23 via the barrier layer 24 (first transfer period).

The signal charges transferred to the semiconductor layer 23 are held for a certain period of time at a part, of the semiconductor layer 23, opposed to the accumulation electrode 21B (memory period). Thereafter, the signal charges are read as needed. Upon reading of the signal charges, the potential V4 is applied from the drive circuit to the first electrode 21A. As for the potential V4, V4<V3 holds true. The potential V4 may be a negative potential. Here, the barrier layer 24 functions as an insulating layer. The application of the potential V4 to the first electrode 21A causes the signal charges (here, electrons) held in the part, of the semiconductor layer 23, opposed to the accumulation electrode 21B to be read by the floating diffusion FD1 via the first electrode 21A (second transfer period).

(Acquisition of Blue Signal and Red Signal by Inorganic Photoelectric Conversion Sections 32B and 32R)

Of the light transmitted through the organic photoelectric conversion section 20, blue light and red light are sequentially absorbed by the inorganic photoelectric conversion section 32B and the inorganic photoelectric conversion section 32R, respectively, and are subjected to photoelectric conversion. In the inorganic photoelectric conversion section 32B, electrons corresponding to the incident blue light are accumulated in an n region of the inorganic photoelectric conversion section 32B, and the accumulated electrons are transferred to the floating diffusion FD2 by the transfer transistor Tr2. Similarly, in the inorganic photoelectric conversion section 32R, electrons corresponding to the incident red light are accumulated in an n region of the inorganic photoelectric conversion section 32R, and the accumulated electrons are transferred to the floating diffusion FD3 by the transfer transistor Tr3.

1-3. Workings and Effects

In the present embodiment, the signal charges generated in the photoelectric conversion layer 25 are accumulated in the semiconductor layer 23 of a part opposed to the accumulation electrode 21B. The accumulated signal charges are transferred to the first electrode 21A and are read therefrom. That is, similarly to the inorganic photoelectric conversion sections 32B and 32R, also in the organic photoelectric conversion section 20, the signal charges are accumulated once and thereafter read by the floating diffusion FD1. This makes it possible to reset the floating diffusion FD1 immediately before the transfer of the signal charges. Accordingly, it is possible to remove a noise component and thus to improve quality of a captured image.

In addition, in the present embodiment, the barrier layer 24 is provided between the semiconductor layer 23 and the photoelectric conversion layer 25, thus suppressing occurrence of transfer failure of signal charges accumulated in the semiconductor layer 23. Hereinafter, description is given thereof with reference to a comparative example (Comparative Example 1).

Figure 17:
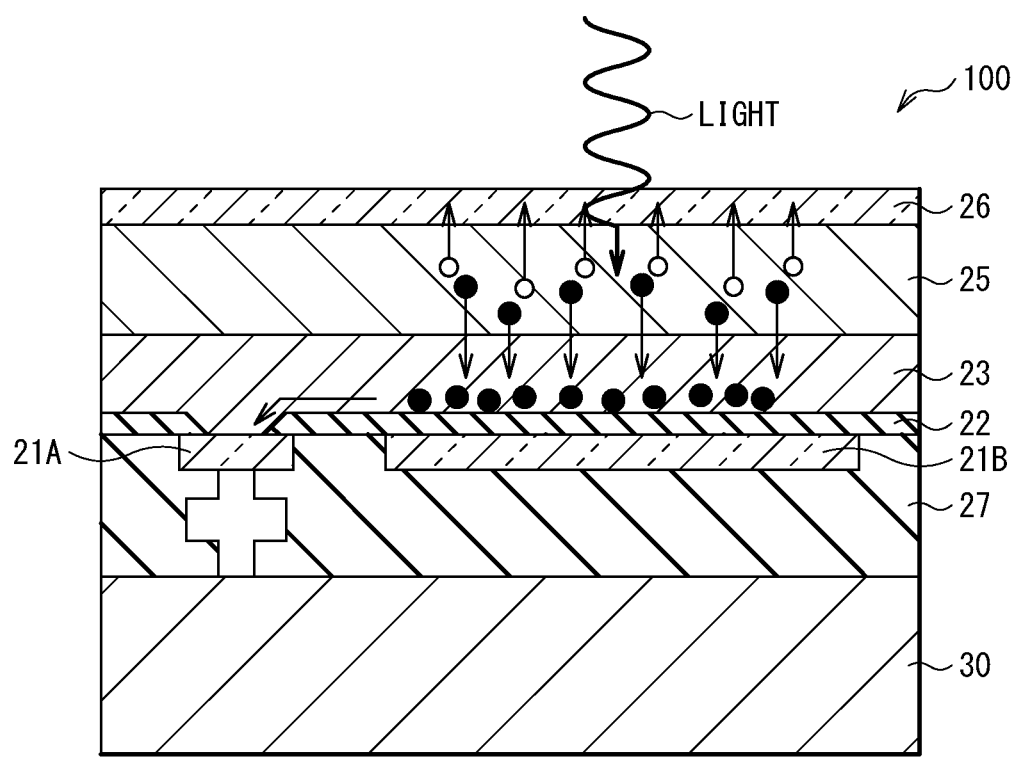
FIG. 17 is a cross-sectional schematic view of a schematic configuration of a solid-state imaging element according to Comparative Example 1.

FIG. 17 illustrates a schematic cross-sectional configuration of a main part of a solid-state imaging element (a solid-state imaging element 100) according to Comparative Example 1. The solid-state imaging element 100 is not provided with a barrier layer (the barrier layer 24 in FIG. 1), and the semiconductor layer 23 and the photoelectric conversion layer 25 are in contact with each other. In such a solid-state imaging element 100, signal charges accumulated in the semiconductor layer 23 is more likely to return to the photoelectric conversion layer 25 having smaller mobility.

Such backflow of signal charges causes occurrence of transfer failure of the signal charges.

In contrast, in the present embodiment, the barrier layer 24 is provided between the semiconductor layer 23 and the photoelectric conversion layer 25. The barrier layer 24 functions as an insulating layer when the potential V2 is applied to the accumulation electrode 21B (FIG. 15), thus suppressing movement of the signal charges straddling the barrier layer 24 from the semiconductor layer 23. That is, the signal charges are less likely to return from the semiconductor layer 23 to the photoelectric conversion layer 25. This suppresses the occurrence of transfer failure of the signal charges accumulated in the semiconductor layer 23.

Further, in the present embodiment, the barrier layer 24 is provided between the semiconductor layer 23 and the photoelectric conversion layer 25, thus making it possible to accumulate the signal charges in the photoelectric conversion layer 25 (accumulation period in FIG. 16) at the time of global shutter driving. The signal charges accumulated in the photoelectric conversion layer 25 are transferred, with all pixels at once, to the semiconductor layer 23, and are once held in the semiconductor layer 23 (memory period in FIG. 16). In this manner, the accumulation, transfer and holding (memory) of the signal charges are performed along the stacking direction of the semiconductor layer 23, the barrier layer 24 and the photoelectric conversion layer 25, thus making it possible to achieve global shutter driving without reducing a numerical aperture. Hereinafter, description is given thereof with reference to a comparative example (Comparative Example 2).

Figure 18:
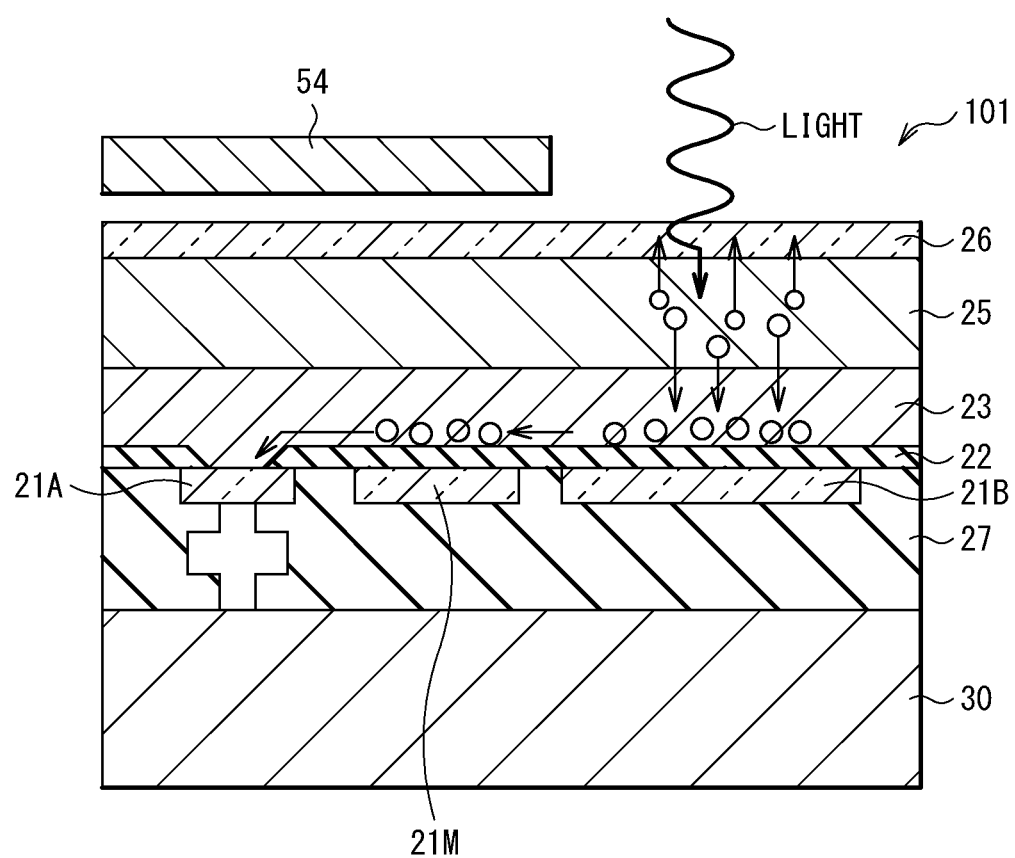
FIG. 18 is a cross-sectional schematic view of a schematic configuration of a solid-state imaging element according to Comparative Example 2.

FIG. 18 illustrates a schematic cross-sectional configuration of a main part of a solid-state imaging element (a solid-state imaging element 101) according to Comparative Example 2. Similar to the solid-state imaging element 100, the solid-state imaging element 101 is not provided with a barrier layer (the barrier layer 24 in FIG. 1). The solid-state imaging element 101 includes a memory electrode (a memory electrode 21M), and is configured to enable global shutter driving. For example, the memory electrode 21M is provided side by side between the first electrode 21A and the accumulation electrode 21B. The semiconductor layer 23 of a part opposed to the first electrode 21A and memory electrode 21M is covered with a light-shielding film (a light-shielding film 54).

In the solid-state imaging element 101, signal charges generated in the photoelectric conversion layer 25 moves to the semiconductor layer 23, and is accumulated in a part, of the semiconductor layer 23, opposed to the accumulation electrode 21B. Thereafter, the signal charges are transferred, with all pixels at once, inside the semiconductor layer 23, from the part opposed to the accumulation electrode 21B to a part opposed to the memory electrode 21M, and are held. That is, the accumulation, transfer and holding (memory) of the signal charges are performed along a planar direction of the semiconductor layer 23, thus shielding the semiconductor layer 23 of the part opposed to the memory electrode 21M from light. Accordingly, the numerical aperture is reduced due to the provision of the global shutter function.

In contrast, in the present embodiment, as described above, the accumulation, transfer and holding (memory) of the signal charges are performed along the stacking direction of the semiconductor layer 23, the barrier layer 24 and the photoelectric conversion layer 25, thus making it possible to achieve the global shutter driving without reducing the numerical aperture.

As described above, in the solid-state imaging element 10 according to the present embodiment, the barrier layer 24 is provided between the semiconductor layer 23 and the photoelectric conversion layer 25, thus making it possible to suppress the occurrence of the transfer failure of the signal charges accumulated in the semiconductor layer 23. Therefore, it becomes possible to improve element characteristics.

In addition, in the present embodiment, the provision of the barrier layer 24 allows the accumulation, transfer and holding (memory) of the signal charges to be performed along the stacking direction of the semiconductor layer 23, the barrier layer 24, and the photoelectric conversion layer 25, thus making it possible to achieve the global shutter driving without reducing the numerical aperture.

Hereinafter, description is given of modification examples of the first embodiment and another embodiment; components similar to those of the first embodiment are denoted with the same reference numerals, and descriptions thereof are omitted as appropriate.

2. Modification Example 1

Figure 19:
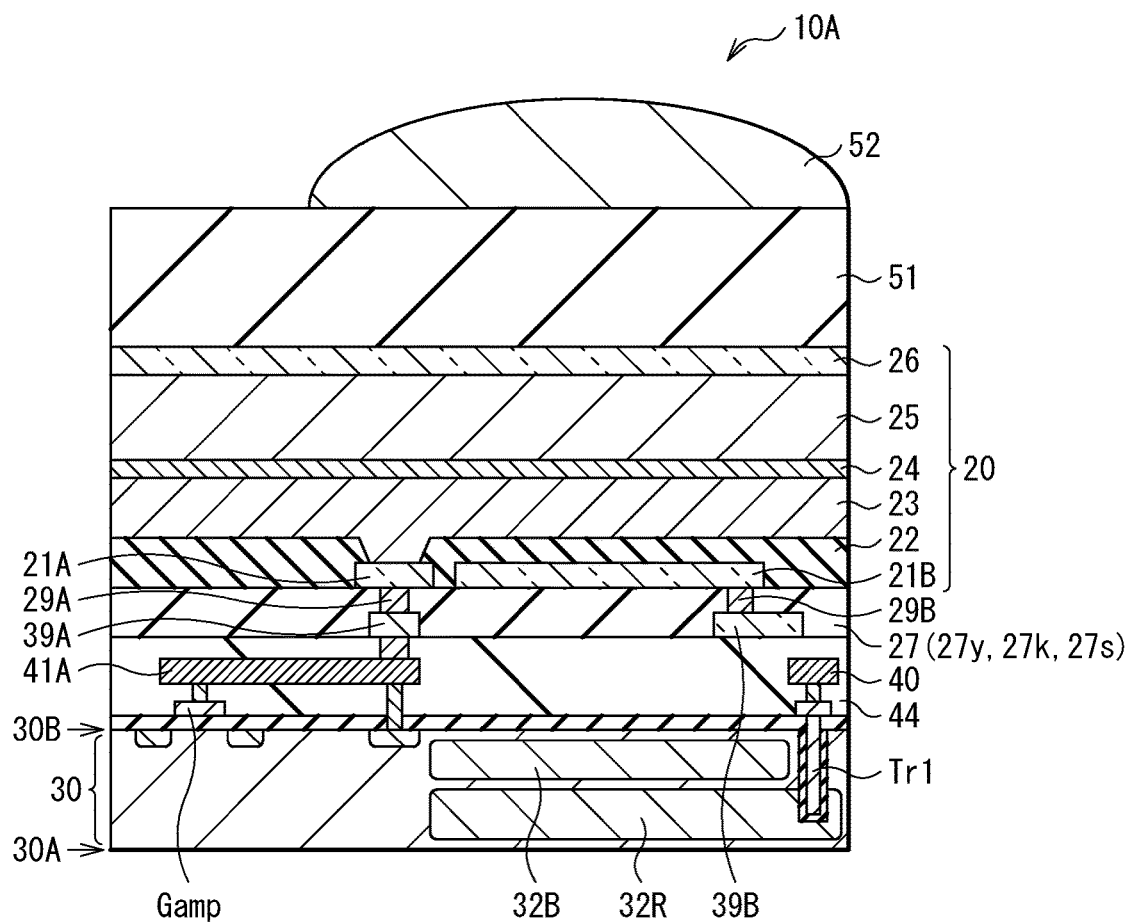
FIG. 19 is a cross-sectional schematic view of a schematic configuration of a solid-state imaging element according to Modification Example 1.

FIG. 19 schematically illustrates a cross-sectional configuration of a main part of a solid-state imaging element (a solid-state imaging element 10A) according to Modification Example 1 of the foregoing first embodiment. The solid-state imaging element 10A is a front-illuminated solid-state imaging element; light enters the semiconductor substrate 30 from the side of the second surface 30B. Except for this point, the solid-state imaging element 10A has configurations and effects similar to those of the solid-state imaging element 10.

The coupling part 41A, the multilayer wiring line 40, and the interlayer insulating layer 27s, etc. are provided between the second surface 30B of the semiconductor substrate 30 and the organic photoelectric conversion section 20 (first electrode 21A and accumulation electrode 21B). The first electrode 21A is coupled to the coupling part 41A via the upper first contact 29A and the coupling wiring line 39A provided in the interlayer insulating layer 27s. That is, the front-illuminated solid-state imaging element 10A eliminates the need of the through electrode (through electrode 34 in FIG. 1) of the semiconductor substrate 30.

3. Modification Example 2

Figure 20:
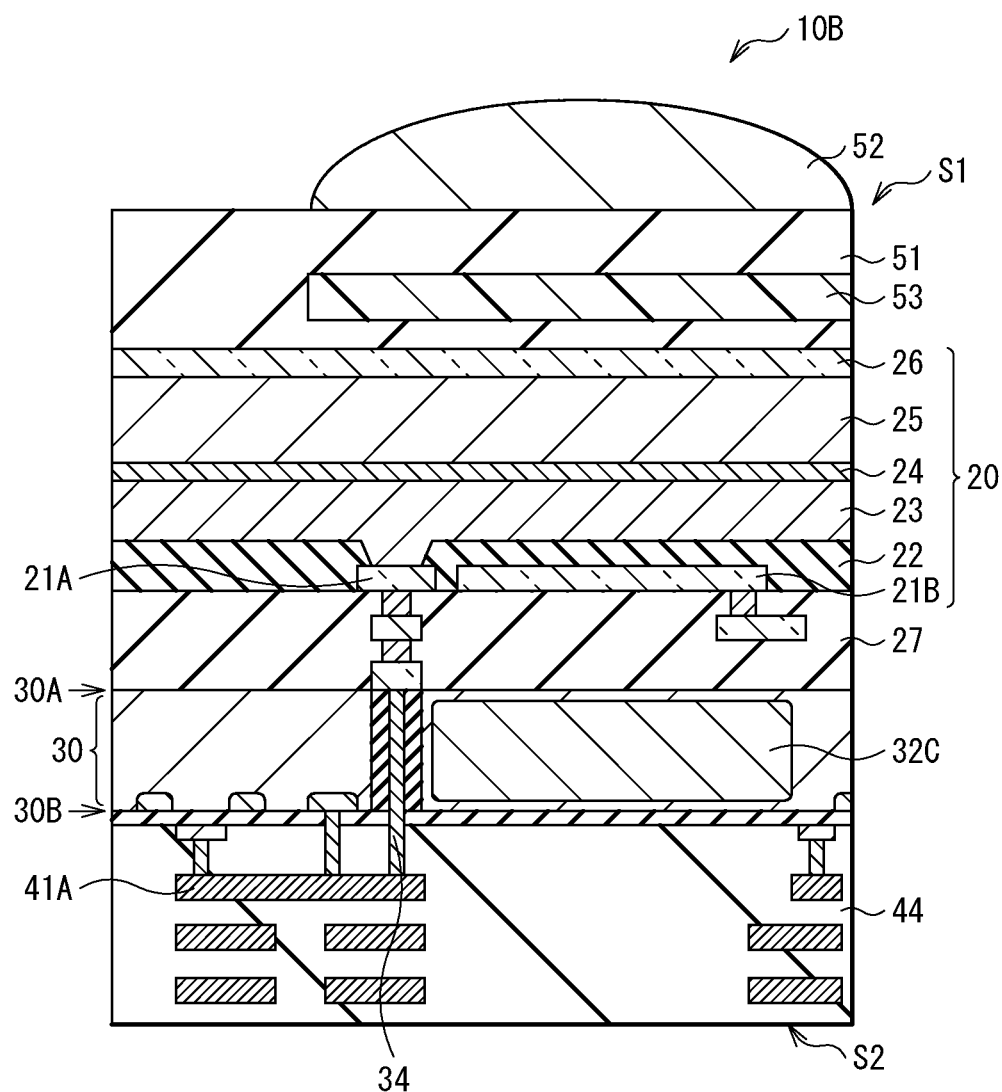
FIG. 20 is a cross-sectional schematic view of a schematic configuration of a solid-state imaging element according to Modification Example 2.

FIG. 20 schematically illustrates a cross-sectional configuration of a main part of a solid-state imaging element (a solid-state imaging element 10B) according to Modification Example 2 of the foregoing first embodiment. The solid-state imaging element 10B has one inorganic photoelectric conversion section (an inorganic photoelectric conversion section 32C) in the semiconductor substrate 30. Except for this point, the solid-state imaging element 10B has configurations and effects similar to those of the solid-state imaging element 10.

The inorganic photoelectric conversion section 32C is a part that performs photoelectric conversion of the light transmitted through a color filter layer 53 and the organic photoelectric conversion section 20. The solid-state imaging element 10B may be provided with the inorganic photoelectric conversion section 32C that detects light beams of different colors. The solid-state imaging element 10B includes, for example, the color filter layer 53 between the organic photoelectric conversion section 20 and the on-chip lens 52, and the color filter layer 53 is disposed at a position opposed to the inorganic photoelectric conversion section 32C. The color filter layer 53 may be provided between the semiconductor substrate 30 and the organic photoelectric conversion section 20 (not illustrated).

In this manner, there may be one inorganic photoelectric conversion section (inorganic photoelectric conversion section 32C) provided in the semiconductor substrate 30. It is possible, in the solid-state imaging element 10B, to selectively utilize light of any wavelength for each pixel.

Figure 21:
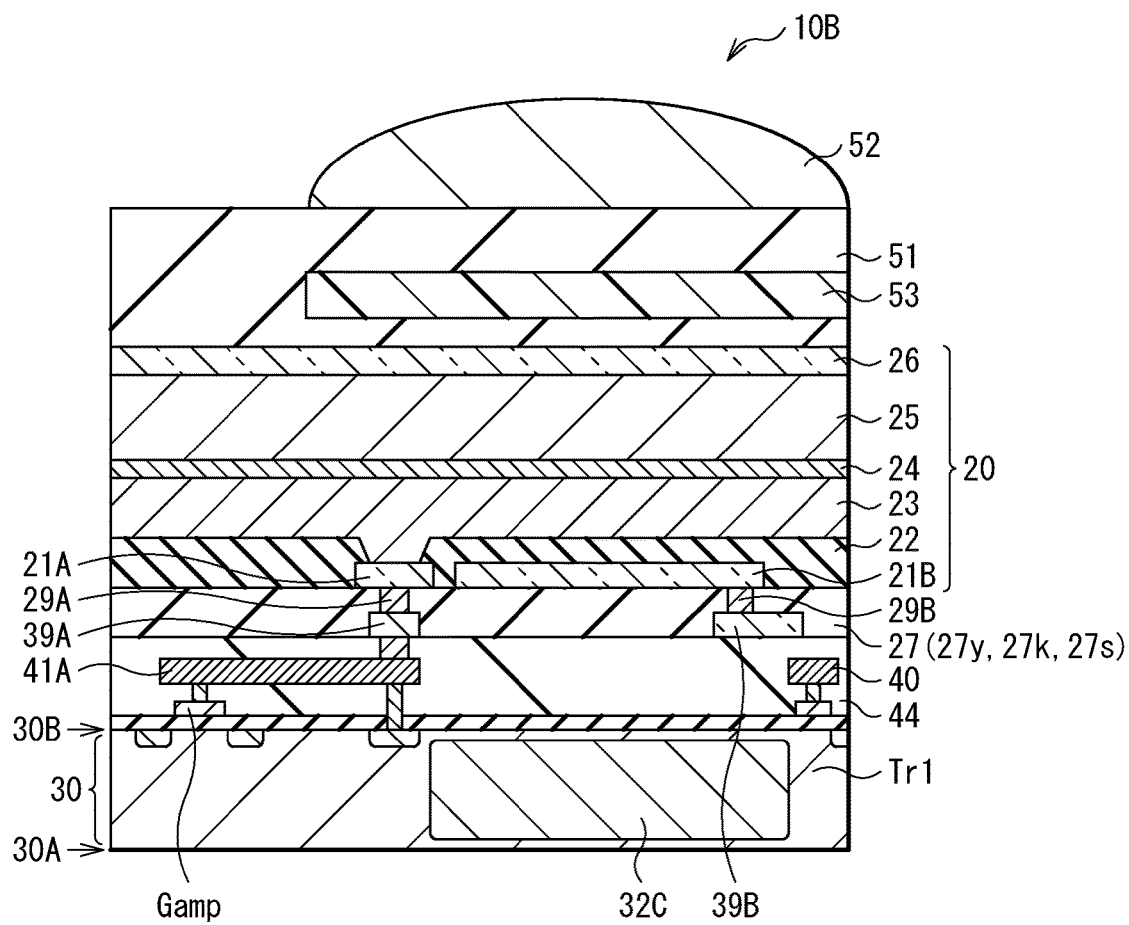
FIG. 21 is a cross-sectional schematic view of another example of the solid-state imaging element illustrated in FIG. 20.

As illustrated in FIG. 21, the solid-state imaging element 10B may be a front-illuminated solid-state imaging element.

4. Modification Example 3

Figure 22:
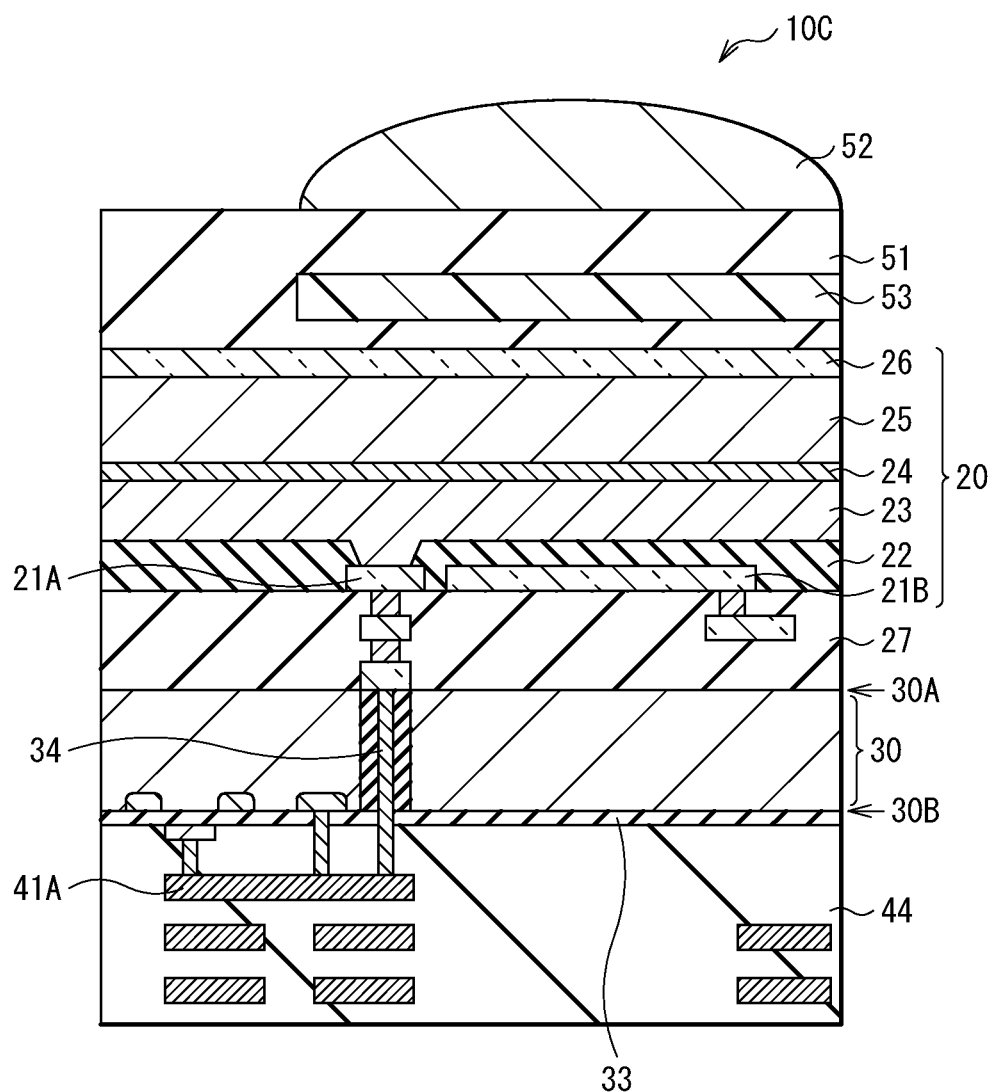
FIG. 22 is a cross-sectional schematic view of a schematic configuration of a solid-state imaging element according to Modification Example 3.

FIG. 22 schematically illustrates a cross-sectional configuration of a main part of a solid-state imaging element (a solid-state imaging element 10C) according to Modification Example 3 of the foregoing first embodiment. In the solid-state imaging element 10C, no inorganic photoelectric conversion section (inorganic photoelectric conversion sections 32R and 32B in FIG. 1 or inorganic photoelectric conversion section 32C in FIG. 20) is provided in the semiconductor substrate 30. Except for this point, the solid-state imaging element 10C has configurations and effects similar to those of the solid-state imaging element 10.

The solid-state imaging element 10C has the color filter layer 53, similarly to the foregoing solid-state imaging element 10B of Modification Example 2. The color filter layer 53 may be provided between the organic photoelectric conversion section 20 and the on-chip lens 52 (FIG. 20), or may be provided between the semiconductor substrate 30 and the organic photoelectric conversion section 20 (not illustrated). It is possible, in such a solid-state imaging element 10C, to selectively utilize light of any wavelength for each pixel.

In addition, no inorganic photoelectric conversion section is provided in the semiconductor substrate 30, thus making it possible to improve a degree of freedom of selection of electrically-conductive materials configuring the first electrode 21A and the accumulation electrode 21B. Specifically, the electrically-conductive materials configuring the first electrode 21A and the accumulation electrode 21B are not limited to light-transmissive electrically-conductive materials; more versatile metal materials may be used.

Further, in the solid-state imaging element 10C of a back-illuminated type, use of the semiconductor substrate 30 allows for configuration of a stacked-type imaging element.

Figure 23:
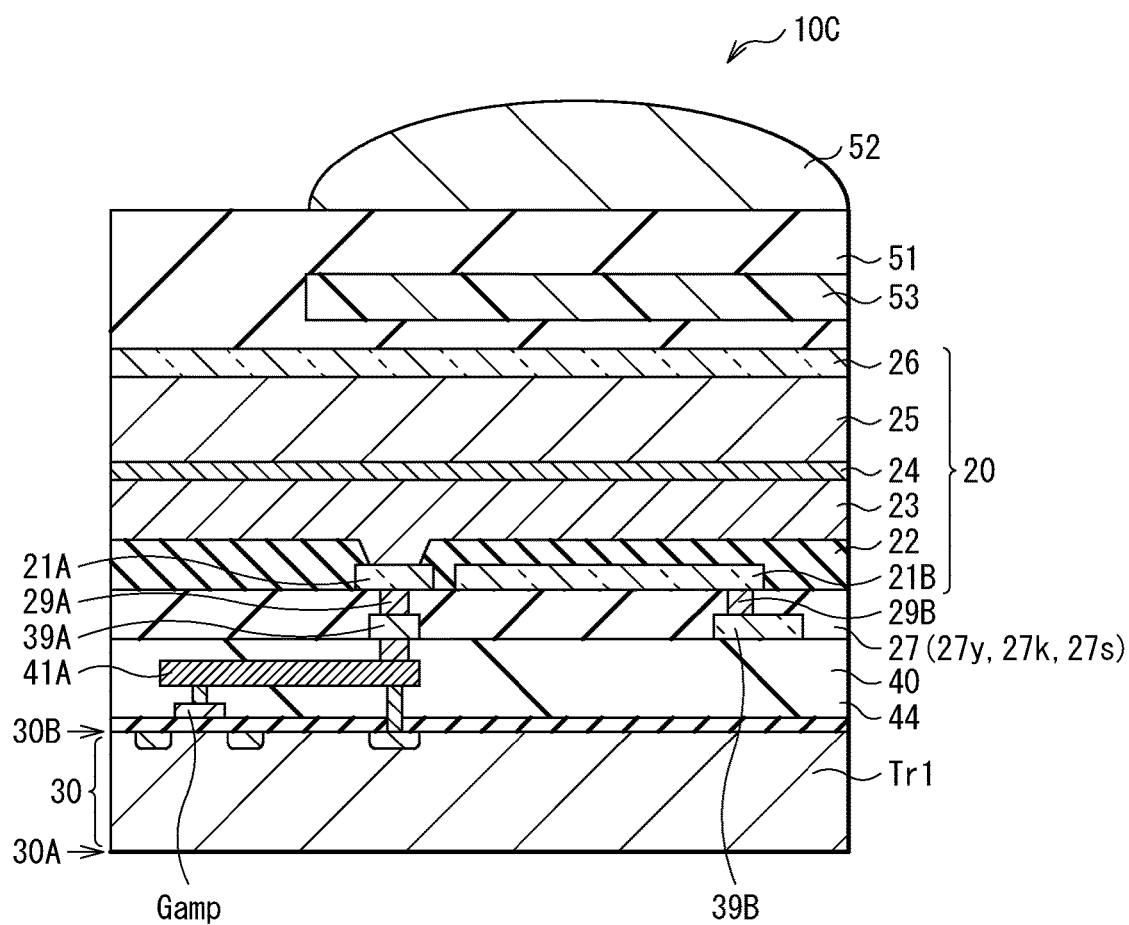
FIG. 23 is a cross-sectional schematic view of another example of the solid-state imaging element illustrated in FIG. 22.

As illustrated in FIG. 23, the solid-state imaging element 10C may be a front-illuminated solid-state imaging element. In the solid-state imaging element 10C, a circuit for improving functions may be provided in the semiconductor substrate 30 of a part opposed to the first electrode 21A and the accumulation electrode 21B.

5. Modification Example 4

Figure 24:
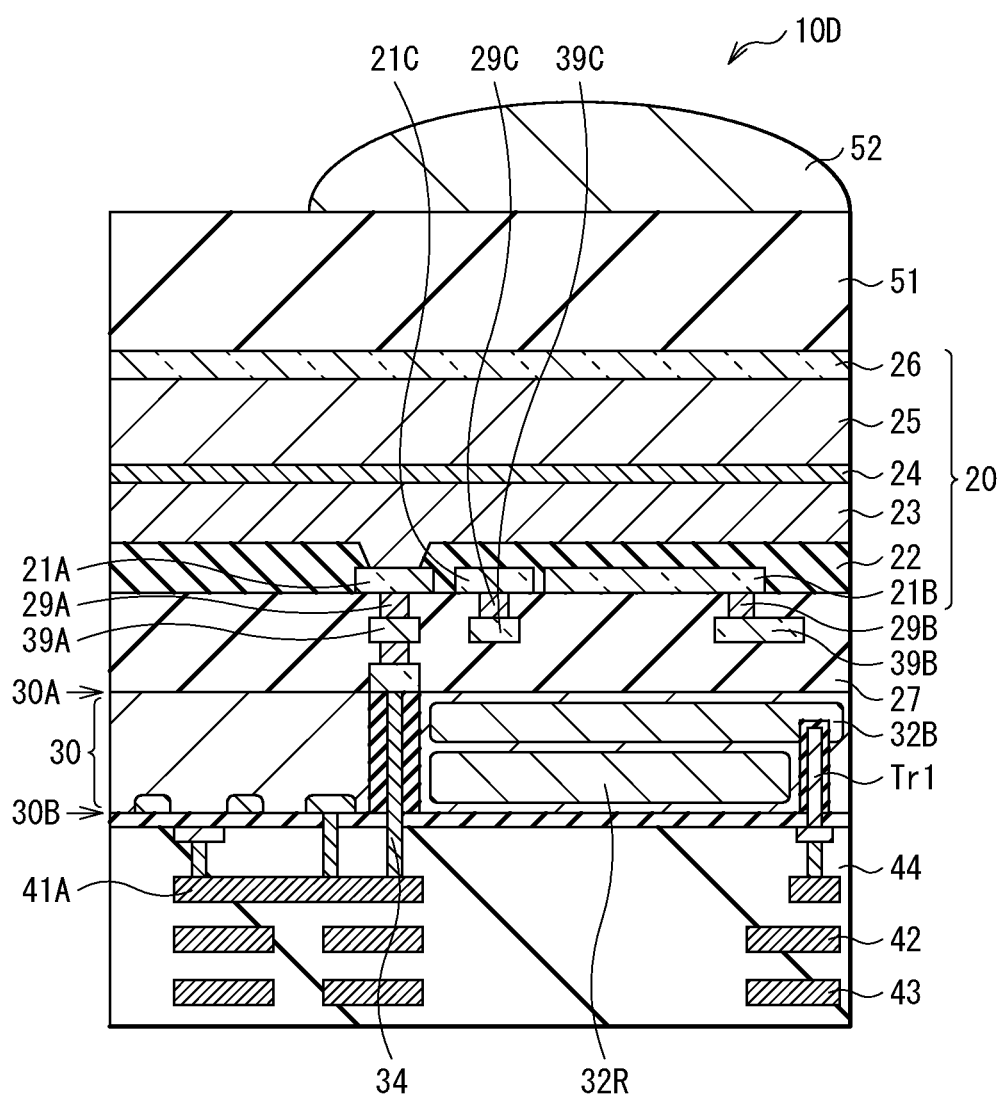
FIG. 24 is a cross-sectional schematic view of a schematic configuration of a solid-state imaging element according to Modification Example 4.

FIG. 24 schematically illustrates a cross-sectional configuration of a main part of a solid-state imaging element (a solid-state imaging element 10D) according to Modification Example 4 of the foregoing first embodiment. The solid-state imaging element 10D includes, in addition to the first electrode 21A and the accumulation electrode 21B, a transfer electrode 21C as an electrode opposed to the second electrode 26 with the semiconductor layer 23 interposed therebetween. The transfer electrode 21C is provided for controlling the movement of signal charges in the semiconductor layer 23. Except for this point, the solid-state imaging element 10D has configurations and effects similar to those of the solid-state imaging element 10.

Figure 25:
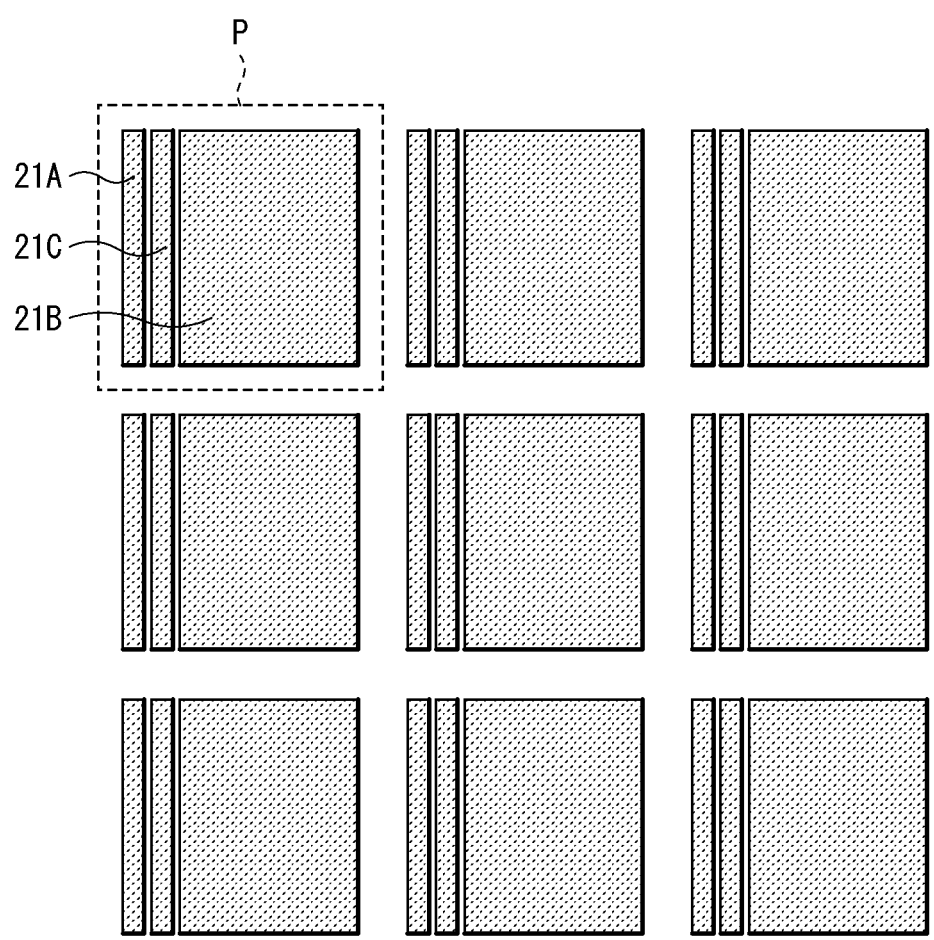
FIG. 25 is a schematic view of a planar configuration of a first electrode, an accumulation electrode, and a transfer electrode illustrated in FIG. 24.

FIG. 25 illustrates a planar configuration of the first electrode 21A, the accumulation electrode 21B, and the transfer electrode 21C. The first electrode 21A, the accumulation electrode 21B, and the transfer electrode 21C are provided apart from each other. The transfer electrode 21C has, for example, a quadrangular planar shape, and is provided side by side with the first electrode 21A and the accumulation electrode 21B. The transfer electrode 21C is arranged between the first electrode 21A and the accumulation electrode 21B.

The transfer electrode 62C is provided for improving efficiency of transferring signal charges accumulated in the accumulation electrode 21B to the first electrode 21A, and is opposed to the semiconductor layer 23 with the insulating layer 22 interposed therebetween. The transfer electrode 21C is coupled, for example, to a pixel drive circuit (not illustrated) configuring the drive circuit via an upper third contact 29C and a coupling wiring line 39C. The first electrode 21A, the accumulation electrode 21B, and the transfer electrode 21C are able to apply a voltage independently of one another. For example, adjusting a potential applied to the transfer electrode 21C makes it possible to prevent signal charges accumulated in the semiconductor layer 23 of a part opposed to the accumulation electrode 21B from unintentionally moving to the first electrode 21A.

In this manner, in the solid-state imaging element 10D, the transfer electrode 21C between the first electrode 21A and the accumulation electrode 21B is able to further improve the transfer efficiency of the signal charges accumulated in the semiconductor layer 23.

The solid-state imaging element 10D may be of a front-illuminated type (see FIG. 19). One inorganic photoelectric conversion section 32C may be provided in the semiconductor substrate 30 of the solid-state imaging element 10D (see FIGS. 20 and 21), or no inorganic photoelectric conversion section may be provided in the semiconductor substrate 30 (see FIGS. 22 and 23).

6. Modification Example 5

Figure 26:
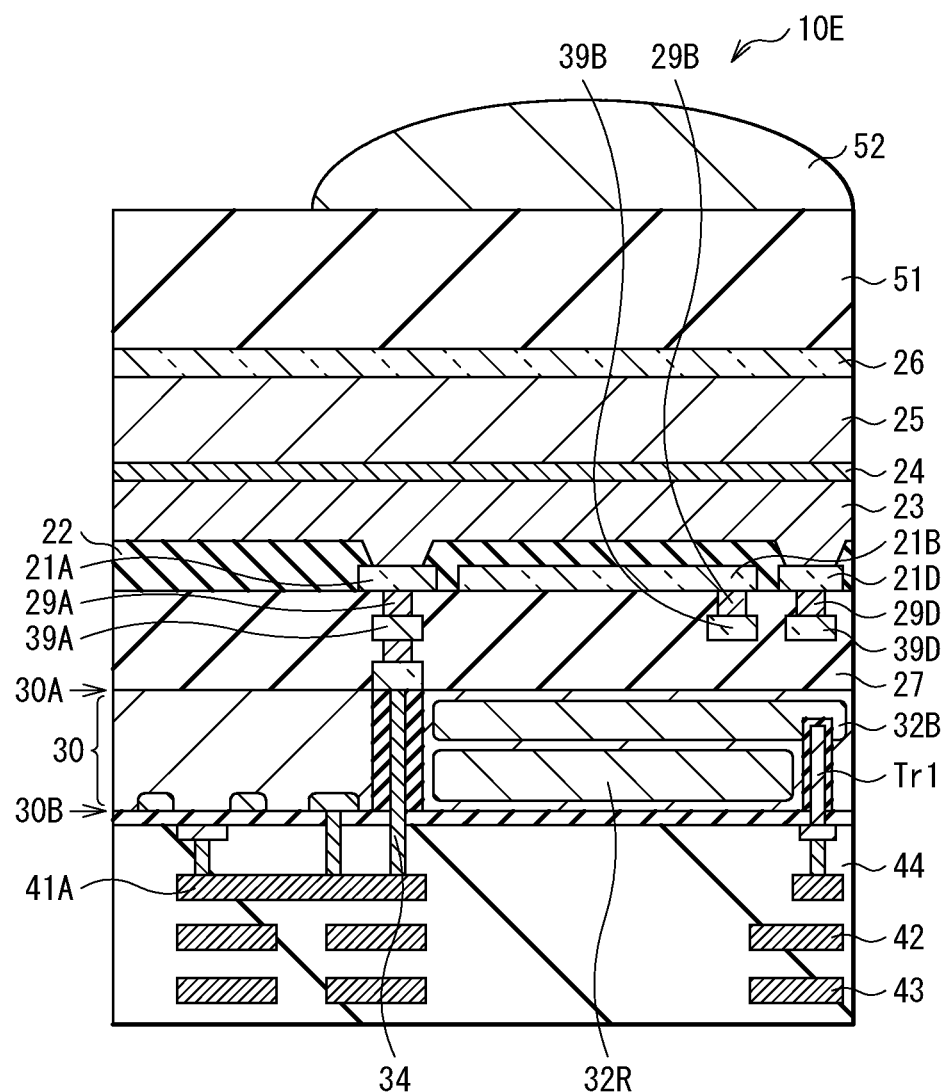
FIG. 26 is a cross-sectional schematic view of a schematic configuration of a solid-state imaging element according to Modification Example 5.

FIG. 26 schematically illustrates a cross-sectional configuration of a main part of a solid-state imaging element (a solid-state imaging element 10E) according to Modification Example 5 of the foregoing first embodiment. The solid-state imaging element 10E includes, in addition to the first electrode 21A and the accumulation electrode 21B, a discharge electrode 21D as an electrode opposed to the second electrode 26 with the semiconductor layer 23 interposed therebetween. Except for this point, the solid-state imaging element 10E has configurations and effects similar to those of the solid-state imaging element 10.

Figure 27:
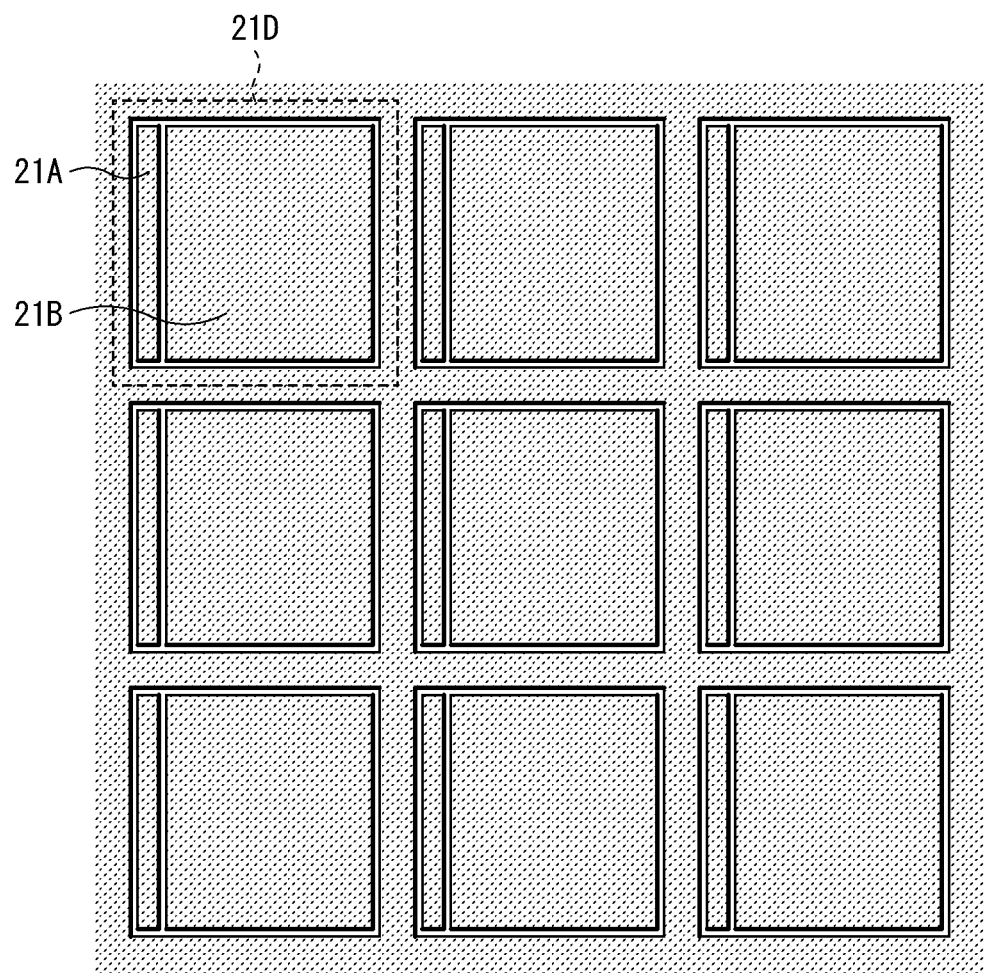
FIG. 27 is a schematic view of a planar configuration of a first electrode, an accumulation electrode and a discharge electrode illustrated in FIG. 26.

FIG. 27 illustrates a planar configuration of the first electrode 21A, the accumulation electrode 21B, and the discharge electrode 21D. The first electrode 21A, the accumulation electrode 21B, and the discharge electrode 21D are provided apart from each other. The discharge electrode 21D is provided to surround the first electrode 21A and the accumulation electrode 21B, for example. The discharge electrode 21D is provided in common for the pixel, for example. The discharge electrode 21D may be provided separately for each pixel (not illustrated).

The discharge electrode 21D is provided at an opening of the insulating layer 22, and is electrically coupled to the semiconductor layer 23. The discharge electrode 21D is provided for sending, to the drive circuit, signal charges not sufficiently attracted by the accumulation electrode 21B or excess signal charges (so-called overflowed signal charges)

upon generation of signal charges more than transfer capability. The discharge electrode 21D is coupled, for example, to a pixel drive circuit (not illustrated) configuring the drive circuit via an upper fourth contact 29D and a coupling wiring line 39D. The first electrode 21A, the accumulation electrode 21B, and the discharge electrode 21D are able to apply a voltage independently of one another.

In this manner, in the solid-state imaging element 10E, the discharge electrode 21D electrically coupled to the semiconductor layer 23 enables the excess signal charges generated in the semiconductor layer 23 to be discharged without remaining in the semiconductor layer 23.

The solid-state imaging element 10E may be of a front-illuminated type (see FIG. 19). One inorganic photoelectric conversion section 32C may be provided in the semiconductor substrate 30 of the solid-state imaging element 10E, (see FIGS. 20 and 21), or no inorganic photoelectric conversion section may be provided in the semiconductor substrate 30 (see FIGS. 22 and 23). The solid-state imaging element 10E may include the transfer electrode 21C together with the discharge electrode 21D (see FIG. 24).

7. Modification Example 6

Figure 28:
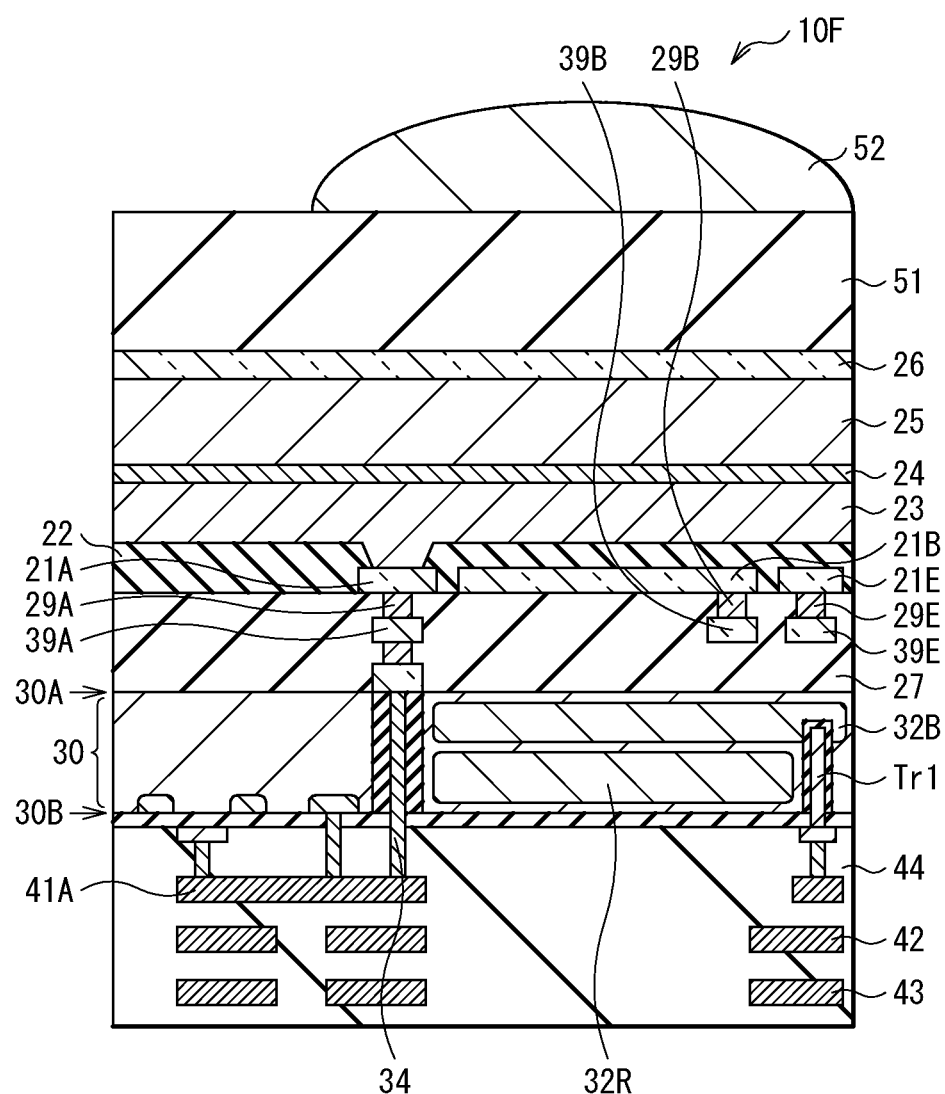
FIG. 28 is a cross-sectional schematic view of a schematic configuration of a solid-state imaging element according to Modification Example 6.

FIG. 28 schematically illustrates a cross-sectional configuration of a main part of a solid-state imaging element (a solid-state imaging element 10F) according to Modification Example 6 of the foregoing first embodiment. The solid-state imaging element 10F includes, in addition to the first electrode 21A and the accumulation electrode 21B, a shielding electrode 21E as an electrode opposed to the second electrode 26 with the semiconductor layer 23 interposed therebetween. Except for this point, the solid-state imaging element 10F has configurations and effects similar to those of the solid-state imaging element 10.

The first electrode 21A, the accumulation electrode 21B, and the shielding electrode 21E are provided apart from each other. The shielding electrode 21E is provided side by side with the first electrode 21A and the accumulation electrode 21B, and is arranged between the accumulation electrodes 21B adjacent to each other. The shielding electrode 21E is provided for suppressing leakage (leak) of signal charges between the adjacent accumulation electrodes 21B, and is opposed to the semiconductor layer 23 with the insulating layer 22 interposed therebetween. The shielding electrode 21E is coupled, for example, to a pixel drive circuit (not illustrated) configuring the drive circuit via an upper fifth contact 29E and a coupling wiring line 39E. The first electrode 21A, the accumulation electrode 21B, and the shielding electrode 21E are able to apply a voltage independently of one another.

In this manner, in the solid-state imaging element 10F, the shielding electrode 21E provided between the adjacent accumulation electrodes 21B is able to suppress the leakage of the signal charges between the adjacent accumulation electrodes 21B.

The solid-state imaging element 10F may be of a front-illuminated type (see FIG. 19). One inorganic photoelectric conversion section 32C may be provided in the semiconductor substrate 30 of the solid-state imaging element 10F (see FIGS. 20 and 21), or no inorganic photoelectric conversion section may be provided in the semiconductor substrate 30 (see FIGS. 22 and 23). The solid-state imaging element 10F may include the transfer electrode 21C (see FIG. 24) or the discharge electrode 21D (see FIG. 26) together with the shielding electrode 21E.

8. Modification Example 7

Figure 29:
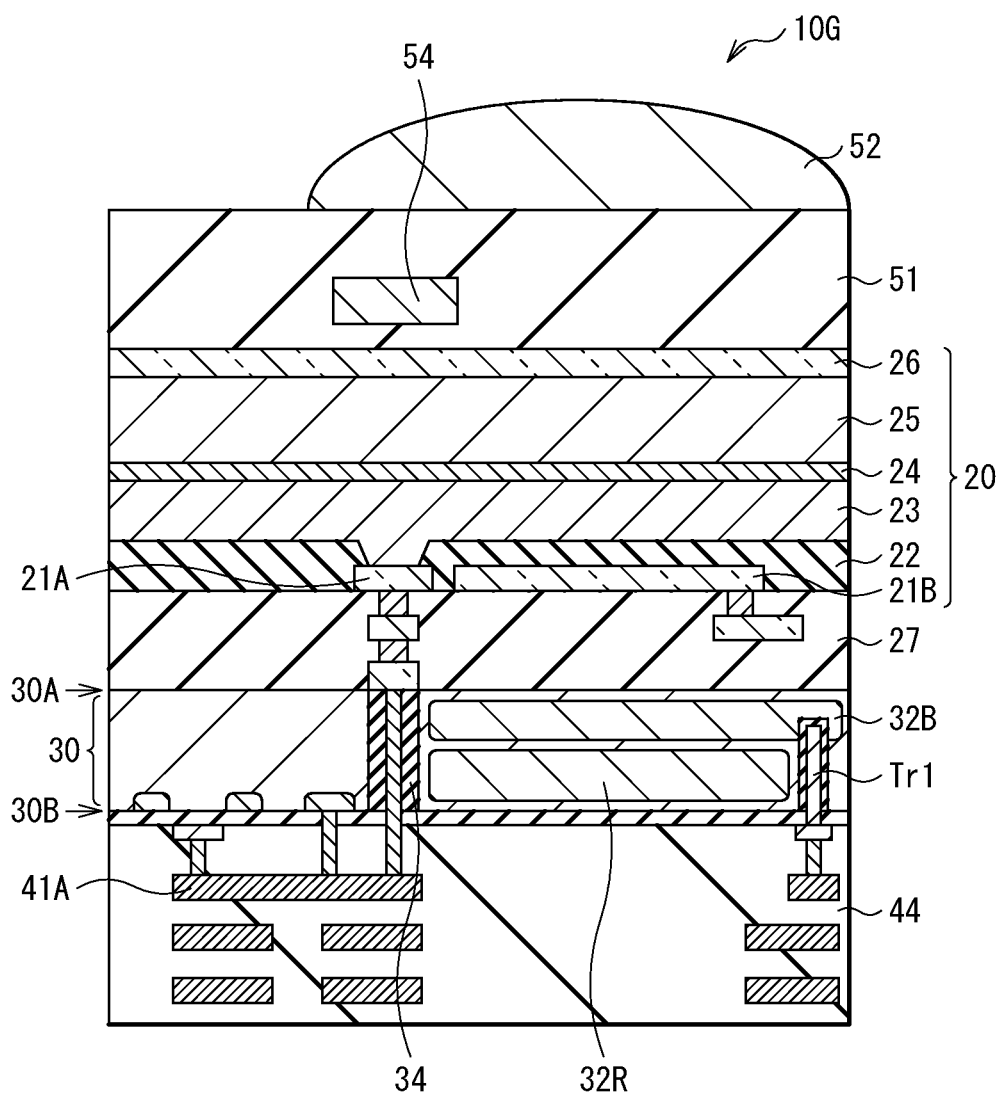
FIG. 29 is a cross-sectional schematic view of a schematic configuration of a solid-state imaging element according to Modification Example 7.

FIG. 29 schematically illustrates a cross-sectional configuration of a main part of a solid-state imaging element (a solid-state imaging element 10G) according to Modification Example 7 of the foregoing first embodiment. The solid-state imaging element 10G includes the light-shielding film 54 that covers the first electrode 21A with the photoelectric conversion layer 25 interposed therebetween. Except for this point, the solid-state imaging element 10G has configurations and effects similar to those of the solid-state imaging element 10.

The light-shielding film 54 is provided, for example, between the second electrode 26 and the on-chip lens 52, and covers the photoelectric conversion layer 25 of a part opposed to the first electrode 21A. This allows for suppression of photoelectric conversion at a region (photoelectric conversion layer 25) close to the first electrode 21A. Accordingly, it is possible to suppress transfer of excess signal charges to the first electrode 21A. The light-shielding film 54 contains, for example, metal such as tungsten (W) and aluminum (Al), and may be configured by a single metal or may be configured by an alloy. The light-shielding film 54 may include the constituent material of the color filter layer (e.g., color filter layer 53 in FIG. 20), and may have a stacked structure. A portion of the accumulation electrode 21B may be covered with the light-shielding film 54.

In this manner, in the solid-state imaging element 10G, the photoelectric conversion layer 25 of a part opposed to the first electrode 21A is covered with the light-shielding film 54, thus suppressing the transfer of excess signal charges to the first electrode 21A.

The solid-state imaging element 10G may be of a front-illuminated type (see FIG. 19). One inorganic photoelectric conversion section 32C may be provided in the semiconductor substrate 30 of the solid-state imaging element 10G (see FIGS. 20 and 21), or no inorganic photoelectric conversion section may be provided in the semiconductor substrate 30 (see FIGS. 22 and 23). The solid-state imaging element 10G may include the transfer electrode 21C (see FIG. 24), the discharge electrode 21D (see FIG. 26), or the shielding electrode 21E (see FIG. 28). A portion of the transfer electrode 21C, the discharge electrode 21D, or the shielding electrode 21E may be covered with the light-shielding film 54.

9. Second Embodiment

Figure 30:
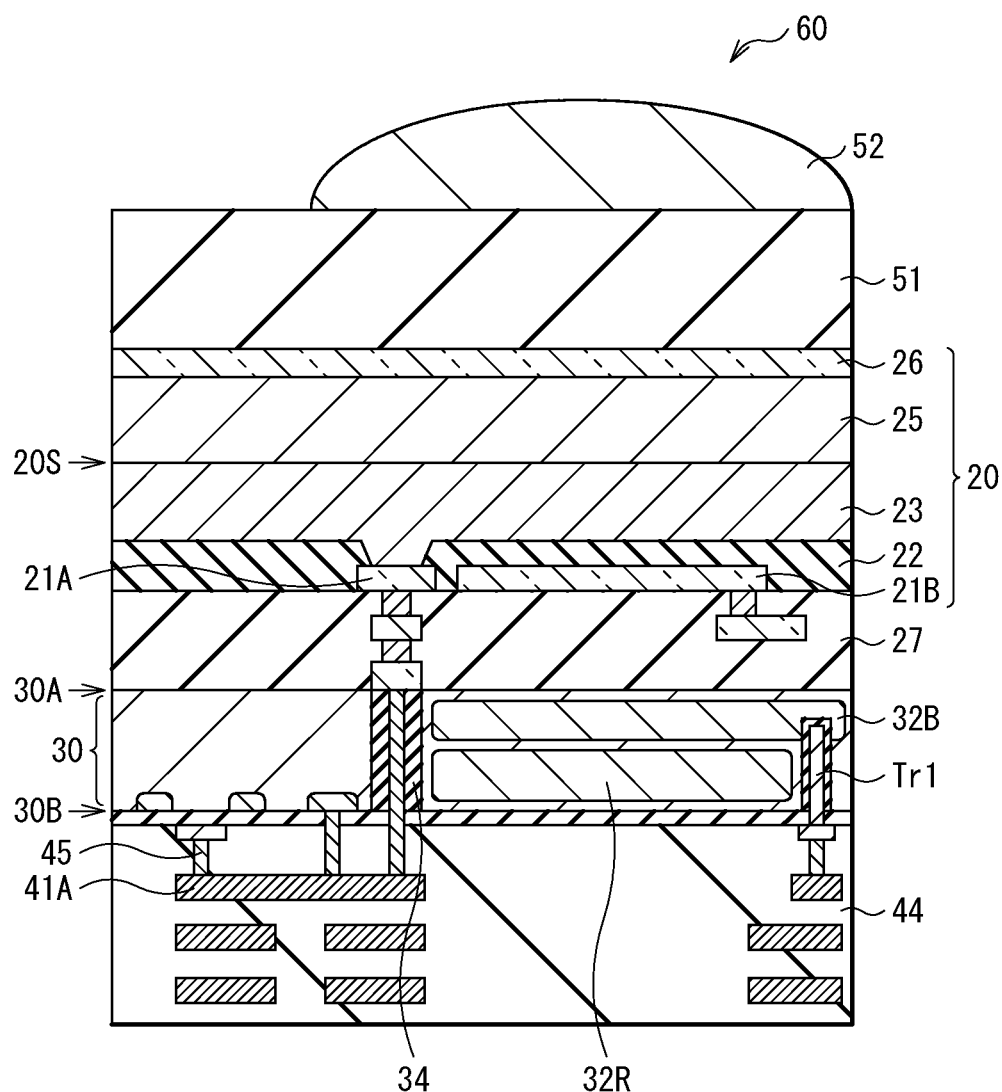
FIG. 30 is a cross-sectional schematic view of a schematic configuration of a solid-state imaging element according to a second embodiment of the present disclosure.

FIG. 30 schematically illustrates a cross-sectional configuration of a main part of a solid-state imaging element (a solid-state imaging element 60) of a second embodiment of the present disclosure. In the solid-state imaging element 60, a junction plane (a junction plane 20S) between the semiconductor layer 23 and the photoelectric conversion layer 25 functions as a potential barrier. That is, the solid-state imaging element 60 is provided with the junction plane 20S serving as a potential barrier, instead of the barrier layer (barrier layer 24 in FIG. 1). Except for this point, the solid-state imaging element 60 has configurations and effects similar to those of the solid-state imaging element 10 of the foregoing first embodiment.

Figure 31:
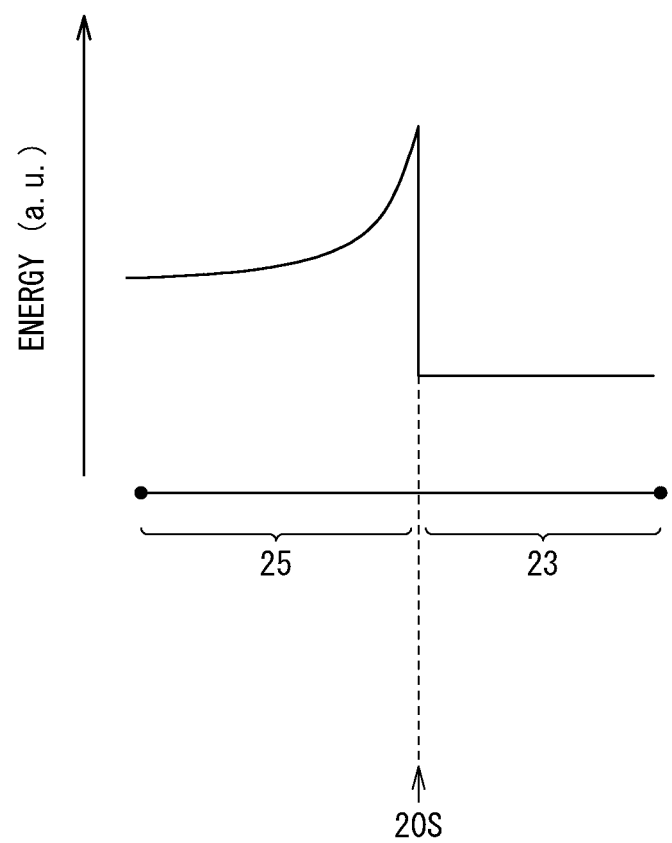
FIG. 31 is an explanatory schematic view of a potential barrier formed by a junction plane illustrated in FIG. 30.

FIG. 31 illustrates an example of potential energy of the semiconductor layer 23 and the photoelectric conversion layer 25. In this manner, a potential barrier is formed at the junction plane 20S between the semiconductor layer 23 and the photoelectric conversion layer 25. For example, such a junction plane 20S is configured under the following conditions.

When the signal charges are electrons, the semiconductor layer 23 has potential energy in a conduction band lower than a potential of a conductor of the photoelectric conversion layer 25, and has a Fermi level (vacuum level reference) lower than a Fermi level of the photoelectric conversion layer 25. When the signal charges are holes, the semiconductor layer 23 has potential energy higher than potential energy of a valence band of the photoelectric conversion layer 25, and has a Fermi level lower than a Fermi level of the photoelectric conversion layer 25.

In this manner, in the solid-state imaging element 60, the junction plane 20S between the semiconductor layer 23 and the photoelectric conversion layer 25 functions as a potential barrier, thus making it possible to suppress the occurrence of transfer failure of signal charges accumulated in the semiconductor layer 23, similarly to the above-described solid-state imaging element 10. Accordingly, it becomes possible to improve the element characteristics.

In addition, the junction plane 20S allows the accumulation, transfer and holding (memory) of the signal charges to be performed along the stacking direction of the semiconductor layer 23 and the photoelectric conversion layer 25, thus making it possible to achieve the global shutter driving without reducing the numerical aperture.

The solid-state imaging element 60 may be of a front-illuminated type (see FIG. 19). One inorganic photoelectric conversion section 32C may be provided in the semiconductor substrate 30 of the solid-state imaging element 60 (see FIGS. 20 and 21), or no inorganic photoelectric conversion section may be provided in the semiconductor substrate 30 (see FIGS. 22 and 23). The solid-state imaging element 60 may include the transfer electrode 21C (see FIG. 24), the discharge electrode 21D (see FIG. 26), or the shielding electrode 21E (see FIG. 28). The solid-state imaging element 60 may be provided with the light-shielding film 54 (see FIG. 29).

Application Example 1

Figure 32:
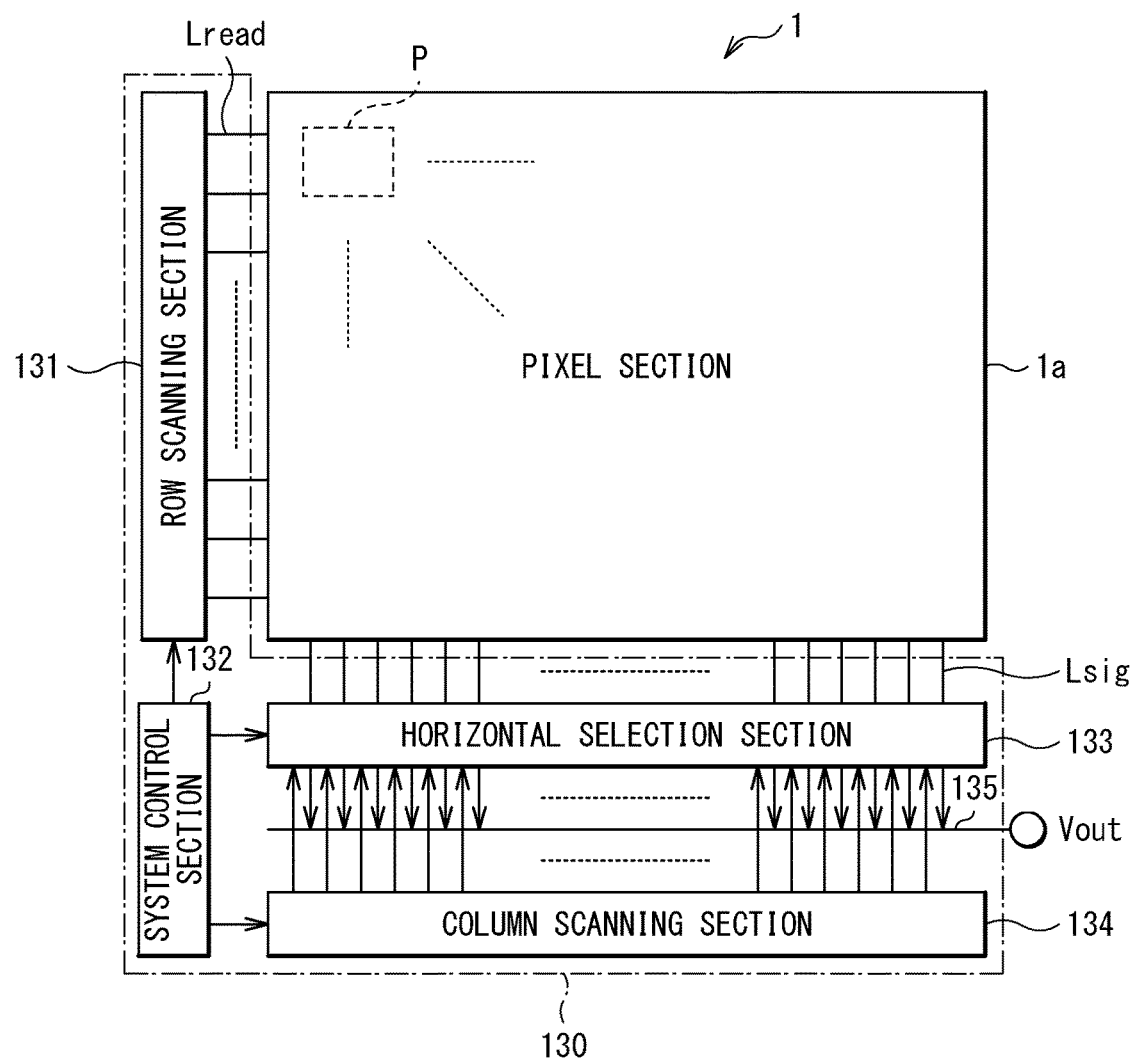
FIG. 32 is a block diagram illustrating a configuration of a solid-state imaging device including the solid-state imaging element illustrated in FIG. 1, etc.

FIG. 32 illustrates an overall configuration of the solid-state imaging device (solid-state imaging device 1) in which the solid-state imaging element 10 (or solid-state imaging elements 10A to 10G and 60; hereinafter, collectively referred to as the solid-state imaging element 10) described in the foregoing embodiment, etc. is used for each pixel. The solid-state imaging device 1 is a CMOS image sensor, and includes a pixel section 1a as an imaging area on the semiconductor substrate 30, and includes, for example, a peripheral circuit section 130 configured by a row scanning section 131, a horizontal selection section 133, a column scanning section 134, and a system control section 132 in a peripheral region of the pixel section 1a.

The pixel section 1a includes, for example, a plurality of pixels P (solid-state imaging elements 10) arranged two-dimensionally in matrix. To the pixel P, for example, pixel drive lines Lread (e.g., row selection lines and reset control lines) are wired on a pixel-row basis, and vertical signal lines Lsig are wired on a pixel-column basis. The pixel drive line Lread transmits a drive signal for reading of a signal from the pixel P. One end of the pixel drive line Lread is coupled to an output terminal corresponding to each row in the row scanning section 131.

The row scanning section 131 is configured by a shift register, an addresses decoder, and the like, and is, for example, a pixel drive section that drives the respective pixels P of an element region R1 on a row-unit basis. Signals outputted from the respective pixels P in the pixel row selectively scanned by the row scanning section 131 are supplied to the horizontal selection section 133 via the respective vertical signal lines Lsig. The horizontal selection section 133 is configured by an amplifier, a horizontal selection switch, and the like that are provided for each of the vertical signal lines Lsig.

The column scanning section 134 is configured by a shift register, an address decoder, and the like, and sequentially drives respective horizontal selection switches in the horizontal selection section 133 while scanning. As a result of the selective scanning by the column scanning section 134, signals of respective pixels to be transmitted via the respective vertical signal lines Lsigs are outputted sequentially to a horizontal signal line 135, and are inputted to an unillustrated signal processing section or the like through the horizontal signal line 135.

The system control section 132 receives a clock supplied from the outside, data instructing an operation mode, or the like, and outputs data such as internal information of an imaging element 4. The system control section 132 further includes a timing generator that generates various timing signals, and performs drive control of the row scanning section 131, the horizontal selection section 133, and the column scanning section 134 on the basis of various timing signals generated by the timing generator.

Application Example 2

Figure 33:
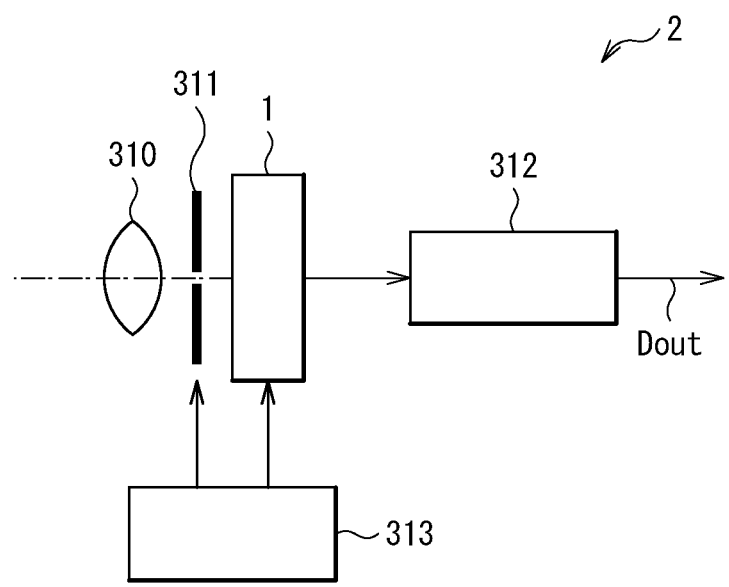
FIG. 33 is a functional block diagram illustrating an example of an electronic apparatus (camera) using the imaging element illustrated in FIG. 32.

The above-described solid-state imaging device 1 is applicable to any type of electronic apparatus having an imaging function, for example, a camera system such as a digital still camera or a video camera, or a mobile phone having an imaging function. FIG. 33 illustrates a schematic configuration of an electronic apparatus 2 (camera) as an example thereof. The electronic apparatus 2 is, for example, a video camera that is able to capture a still image or shoot a moving image, and includes the solid-state imaging device 1, an optical system (optical lens) 310, a shutter device 311, a drive section 313 that drives the solid-state imaging device 1 and the shutter device 311, and a signal processing section 312.

The optical system 310 guides image light (incident light) from a subject to the imaging element 4. The optical system 310 may be configured by a plurality of optical lenses. The shutter device 311 controls periods of light irradiation and light shielding with respect to the solid-state imaging device 1. The drive section 313 controls a transfer operation of the solid-state imaging device 1 and a shutter operation of the shutter device 311. The signal processing section 312 performs various types of signal processing on a signal outputted from the solid-state imaging device 1. An image signal Dout after the signal processing is stored in a storage medium such as a memory or outputted to a monitor or the like.

Application Example 3

Example of Practical Application to In-Vivo Information Acquisition System

Further, the technology according to an embodiment of the present disclosure (present technology) is applicable to various products. For example, the technology according to an embodiment of the present disclosure may be applied to an endoscopic surgery system.

Figure 34:
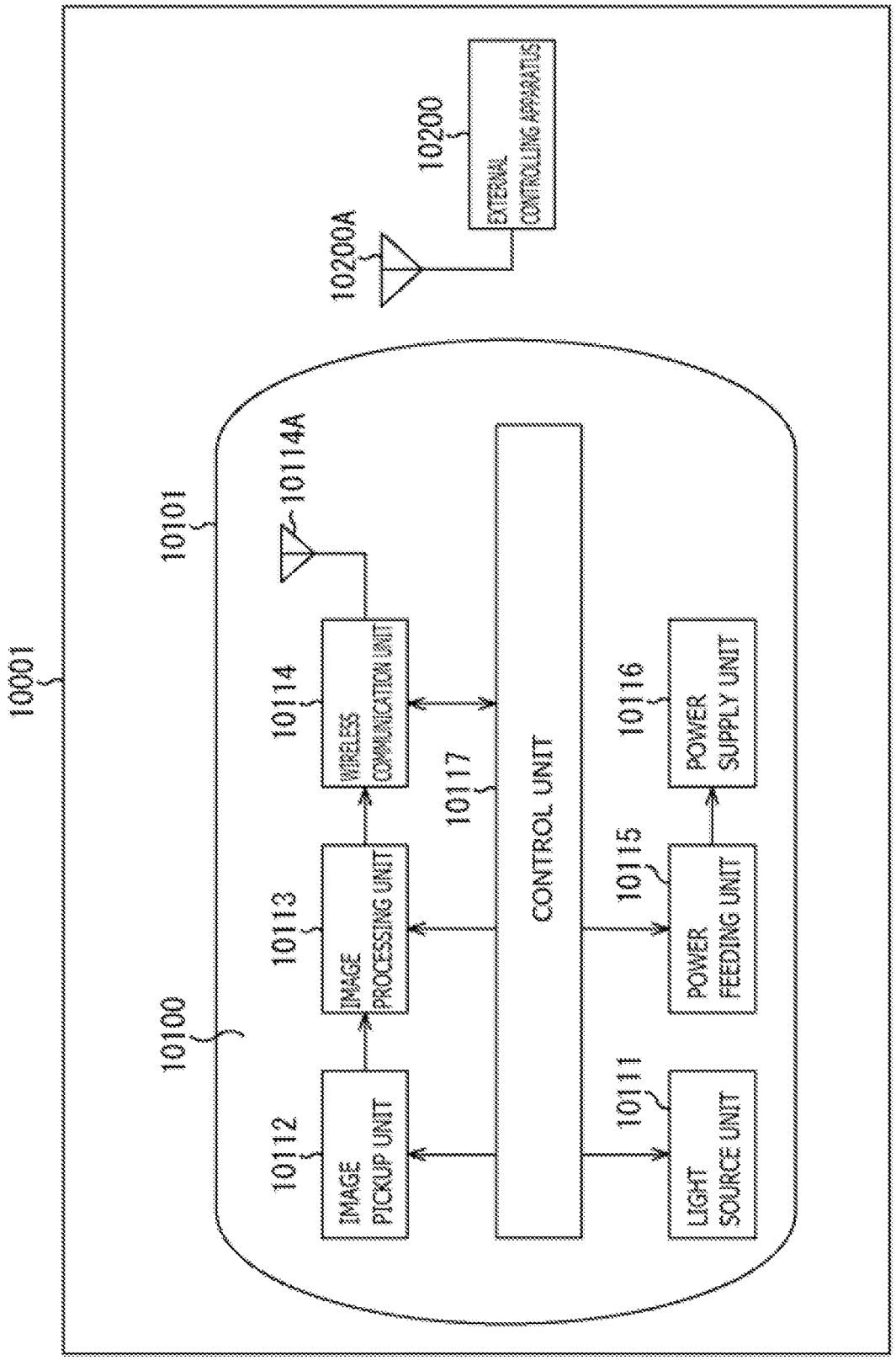
FIG. 34 is a block diagram depicting an example of a schematic configuration of an in-vivo information acquisition system.

FIG. 34 is a block diagram depicting an example of a schematic configuration of an in-vivo information acquisition system of a patient using a capsule type endoscope, to which the technology according to an embodiment of the present disclosure (present technology) can be applied.

The in-vivo information acquisition system 10001 includes a capsule type endoscope 10100 and an external controlling apparatus 10200.

The capsule type endoscope 10100 is swallowed by a patient at the time of inspection. The capsule type endoscope 10100 has an image pickup function and a wireless communication function and successively picks up an image of the inside of an organ such as the stomach or an intestine (hereinafter referred to as in-vivo image) at predetermined intervals while it moves inside of the organ by peristaltic motion for a period of time until it is naturally discharged from the patient. Then, the capsule type endoscope 10100 successively transmits information of the in-vivo image to the external controlling apparatus 10200 outside the body by wireless transmission.

The external controlling apparatus 10200 integrally controls operation of the in-vivo information acquisition system 10001. Further, the external controlling apparatus 10200 receives information of an in-vivo image transmitted thereto from the capsule type endoscope 10100 and generates image data for displaying the in-vivo image on a display apparatus (not depicted) on the basis of the received information of the in-vivo image.

In the in-vivo information acquisition system 10001, an in-vivo image imaged a state of the inside of the body of a patient can be acquired at any time in this manner for a period of time until the capsule type endoscope 10100 is discharged after it is swallowed.

A configuration and functions of the capsule type endoscope 10100 and the external controlling apparatus 10200 are described in more detail below.

The capsule type endoscope 10100 includes a housing 10101 of the capsule type, in which a light source unit 10111, an image pickup unit 10112, an image processing unit 10113, a wireless communication unit 10114, a power feeding unit 10115, a power supply unit 10116 and a control unit 10117 are accommodated.

The light source unit 10111 includes a light source such as, for example, a light emitting diode (LED) and irradiates light on an image pickup field-of-view of the image pickup unit 10112.

The image pickup unit 10112 includes an image pickup element and an optical system including a plurality of lenses provided at a preceding stage to the image pickup element. Reflected light (hereinafter referred to as observation light) of light irradiated on a body tissue which is an observation target is condensed by the optical system and introduced into the image pickup element. In the image pickup unit 10112, the incident observation light is photoelectrically converted by the image pickup element, by which an image signal corresponding to the observation light is generated. The image signal generated by the image pickup unit 10112 is provided to the image processing unit 10113.

The image processing unit 10113 includes a processor such as a central processing unit (CPU) or a graphics processing unit (GPU) and performs various signal processes for an image signal generated by the image pickup unit 10112. The image processing unit 10113 provides the image signal for which the signal processes have been performed thereby as RAW data to the wireless communication unit 10114.

The wireless communication unit 10114 performs a predetermined process such as a modulation process for the image signal for which the signal processes have been performed by the image processing unit 10113 and transmits the resulting image signal to the external controlling apparatus 10200 through an antenna 10114A. Further, the wireless communication unit 10114 receives a control signal relating to driving control of the capsule type endoscope 10100 from the external controlling apparatus 10200 through the antenna 10114A. The wireless communication unit 10114 provides the control signal received from the external controlling apparatus 10200 to the control unit 10117.

The power feeding unit 10115 includes an antenna coil for power reception, a power regeneration circuit for regenerating electric power from current generated in the antenna coil, a voltage booster circuit and so forth. The power feeding unit 10115 generates electric power using the principle of non-contact charging.

The power supply unit 10116 includes a secondary battery and stores electric power generated by the power feeding unit 10115. In FIG. 34, in order to avoid complicated illustration, an arrow mark indicative of a supply destination of electric power from the power supply unit 10116 and so forth are omitted. However, electric power stored in the power supply unit 10116 is supplied to and can be used to drive the light source unit 10111, the image pickup unit 10112, the image processing unit 10113, the wireless communication unit 10114 and the control unit 10117.

The control unit 10117 includes a processor such as a CPU and suitably controls driving of the light source unit 10111, the image pickup unit 10112, the image processing unit 10113, the wireless communication unit 10114 and the power feeding unit 10115 in accordance with a control signal transmitted thereto from the external controlling apparatus 10200.

The external controlling apparatus 10200 includes a processor such as a CPU or a GPU, a microcomputer, a control board or the like in which a processor and a storage element such as a memory are mixedly incorporated. The external controlling apparatus 10200 transmits a control signal to the control unit 10117 of the capsule type endoscope 10100 through an antenna 10200A to control operation of the capsule type endoscope 10100. In the capsule type endoscope 10100, an irradiation condition of light upon an observation target of the light source unit 10111 can be changed, for example, in accordance with a control signal from the external controlling apparatus 10200. Further, an image pickup condition (for example, a frame rate, an exposure value or the like of the image pickup unit 10112) can be changed in accordance with a control signal from the external controlling apparatus 10200. Further, the substance of processing by the image processing unit 10113 or a condition for transmitting an image signal from the wireless communication unit 10114 (for example, a transmission interval, a transmission image number or the like) may be changed in accordance with a control signal from the external controlling apparatus 10200.

Further, the external controlling apparatus 10200 performs various image processes for an image signal transmitted thereto from the capsule type endoscope 10100 to generate image data for displaying a picked up in-vivo image on the display apparatus. As the image processes, various signal processes can be performed such as, for example, a development process (demosaic process), an image quality improving process (bandwidth enhancement process, a super-resolution process, a noise reduction (NR) process and/or image stabilization process) and/or an enlargement process (electronic zooming process). The external controlling apparatus 10200 controls driving of the display apparatus to cause the display apparatus to display a picked up in-vivo image on the basis of generated image data. Alternatively, the external controlling apparatus 10200 may also control a recording apparatus (not depicted) to record generated image data or control a printing apparatus (not depicted) to output generated image data by printing.

The description has been given above of one example of the in-vivo information acquisition system, to which the technology according to an embodiment of the present disclosure is applicable. The technology according to an embodiment of the present disclosure is applicable to, for example, the image pickup unit 10112 of the configurations described above. This makes it possible to improve detection accuracy.

Application Example 4

Example of Practical Application to Endoscopic Surgery System

The technology according to an embodiment of the present disclosure (present technology) is applicable to various products. For example, the technology according to an embodiment of the present disclosure may be applied to an endoscopic surgery system.

Figure 35:
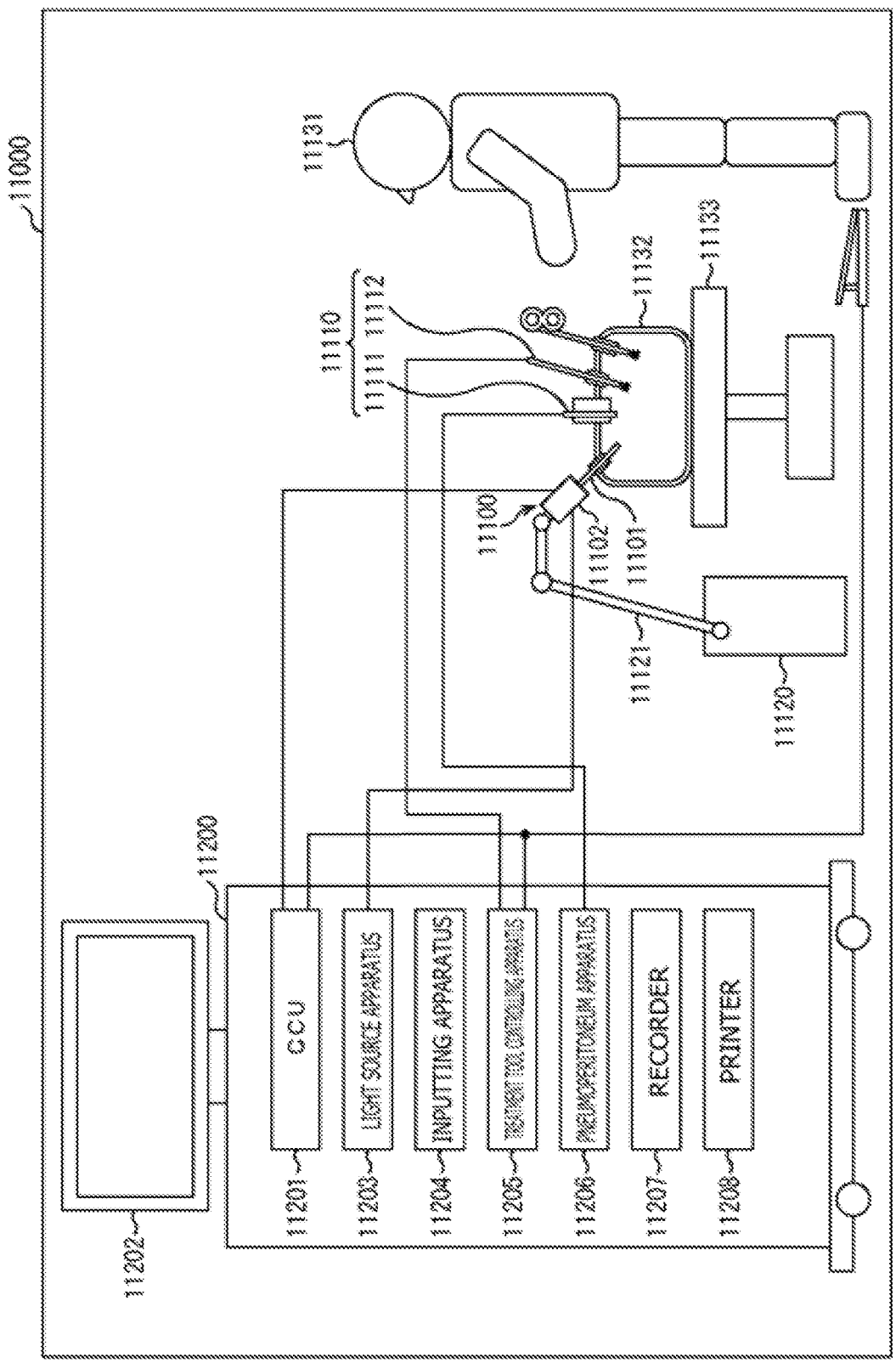
FIG. 35 is a view depicting an example of a schematic configuration of an endoscopic surgery system.

FIG. 35 is a view depicting an example of a schematic configuration of an endoscopic surgery system to which the technology according to an embodiment of the present disclosure (present technology) can be applied.

In FIG. 35, a state is illustrated in which a surgeon (medical doctor) 11131 is using an endoscopic surgery system 11000 to perform surgery for a patient 11132 on a patient bed 11133. As depicted, the endoscopic surgery system 11000 includes an endoscope 11100, other surgical tools 11110 such as a pneumoperitoneum tube 11111 and an energy device 11112, a supporting arm apparatus 11120 which supports the endoscope 11100 thereon, and a cart 11200 on which various apparatus for endoscopic surgery are mounted.

The endoscope 11100 includes a lens barrel 11101 having a region of a predetermined length from a distal end thereof to be inserted into a body cavity of the patient 11132, and a camera head 11102 connected to a proximal end of the lens barrel 11101. In the example depicted, the endoscope 11100 is depicted which includes as a rigid endoscope having the lens barrel 11101 of the hard type. However, the endoscope 11100 may otherwise be included as a flexible endoscope having the lens barrel 11101 of the flexible type.

The lens barrel 11101 has, at a distal end thereof, an opening in which an objective lens is fitted. A light source apparatus 11203 is connected to the endoscope 11100 such that light generated by the light source apparatus 11203 is introduced to a distal end of the lens barrel 11101 by a light guide extending in the inside of the lens barrel 11101 and is irradiated toward an observation target in a body cavity of the patient 11132 through the objective lens. It is to be noted that the endoscope 11100 may be a forward-viewing endoscope or may be an oblique-viewing endoscope or a side-viewing endoscope.

An optical system and an image pickup element are provided in the inside of the camera head 11102 such that reflected light (observation light) from the observation target is condensed on the image pickup element by the optical system. The observation light is photo-electrically converted by the image pickup element to generate an electric signal corresponding to the observation light, namely, an image signal corresponding to an observation image. The image signal is transmitted as RAW data to a CCU 11201.

The CCU 11201 includes a central processing unit (CPU), a graphics processing unit (GPU) or the like and integrally controls operation of the endoscope 11100 and a display apparatus 11202. Further, the CCU 11201 receives an image signal from the camera head 11102 and performs, for the image signal, various image processes for displaying an image based on the image signal such as, for example, a development process (demosaic process).

The display apparatus 11202 displays thereon an image based on an image signal, for which the image processes have been performed by the CCU 11201, under the control of the CCU 11201.

The light source apparatus 11203 includes a light source such as, for example, a light emitting diode (LED) and supplies irradiation light upon imaging of a surgical region to the endoscope 11100.

An inputting apparatus 11204 is an input interface for the endoscopic surgery system 11000. A user can perform inputting of various kinds of information or instruction inputting to the endoscopic surgery system 11000 through the inputting apparatus 11204. For example, the user would input an instruction or a like to change an image pickup condition (type of irradiation light, magnification, focal distance or the like) by the endoscope 11100.

A treatment tool controlling apparatus 11205 controls driving of the energy device 11112 for cautery or incision of a tissue, sealing of a blood vessel or the like. A pneumoperitoneum apparatus 11206 feeds gas into a body cavity of the patient 11132 through the pneumoperitoneum tube 11111 to inflate the body cavity in order to secure the field of view of the endoscope 11100 and secure the working space for the surgeon. A recorder 11207 is an apparatus capable of recording various kinds of information relating to surgery. A printer 11208 is an apparatus capable of printing various kinds of information relating to surgery in various forms such as a text, an image or a graph.

It is to be noted that the light source apparatus 11203 which supplies irradiation light when a surgical region is to be imaged to the endoscope 11100 may include a white light source which includes, for example, an LED, a laser light source or a combination of them. Where a white light source includes a combination of red, green, and blue (RGB) laser light sources, since the output intensity and the output timing can be controlled with a high degree of accuracy for each color (each wavelength), adjustment of the white balance of a picked up image can be performed by the light source apparatus 11203. Further, in this case, if laser beams from the respective RGB laser light sources are irradiated time-divisionally on an observation target and driving of the image pickup elements of the camera head 11102 are controlled in synchronism with the irradiation timings. Then images individually corresponding to the R, G and B colors can be also picked up time-divisionally. According to this method, a color image can be obtained even if color filters are not provided for the image pickup element.

Further, the light source apparatus 11203 may be controlled such that the intensity of light to be outputted is changed for each predetermined time. By controlling driving of the image pickup element of the camera head 11102 in synchronism with the timing of the change of the intensity of light to acquire images time-divisionally and synthesizing the images, an image of a high dynamic range free from underexposed blocked up shadows and overexposed highlights can be created.

Further, the light source apparatus 11203 may be configured to supply light of a predetermined wavelength band ready for special light observation. In special light observation, for example, by utilizing the wavelength dependency of absorption of light in a body tissue to irradiate light of a narrow band in comparison with irradiation light upon ordinary observation (namely, white light), narrow band observation (narrow band imaging) of imaging a predetermined tissue such as a blood vessel of a superficial portion of the mucous membrane or the like in a high contrast is performed. Alternatively, in special light observation, fluorescent observation for obtaining an image from fluorescent light generated by irradiation of excitation light may be performed. In fluorescent observation, it is possible to perform observation of fluorescent light from a body tissue by irradiating excitation light on the body tissue (autofluorescence observation) or to obtain a fluorescent light image by locally injecting a reagent such as indocyanine green (ICG) into a body tissue and irradiating excitation light corresponding to a fluorescent light wavelength of the reagent upon the body tissue. The light source apparatus 11203 can be configured to supply such narrow-band light and/or excitation light suitable for special light observation as described above.

Figure 36:
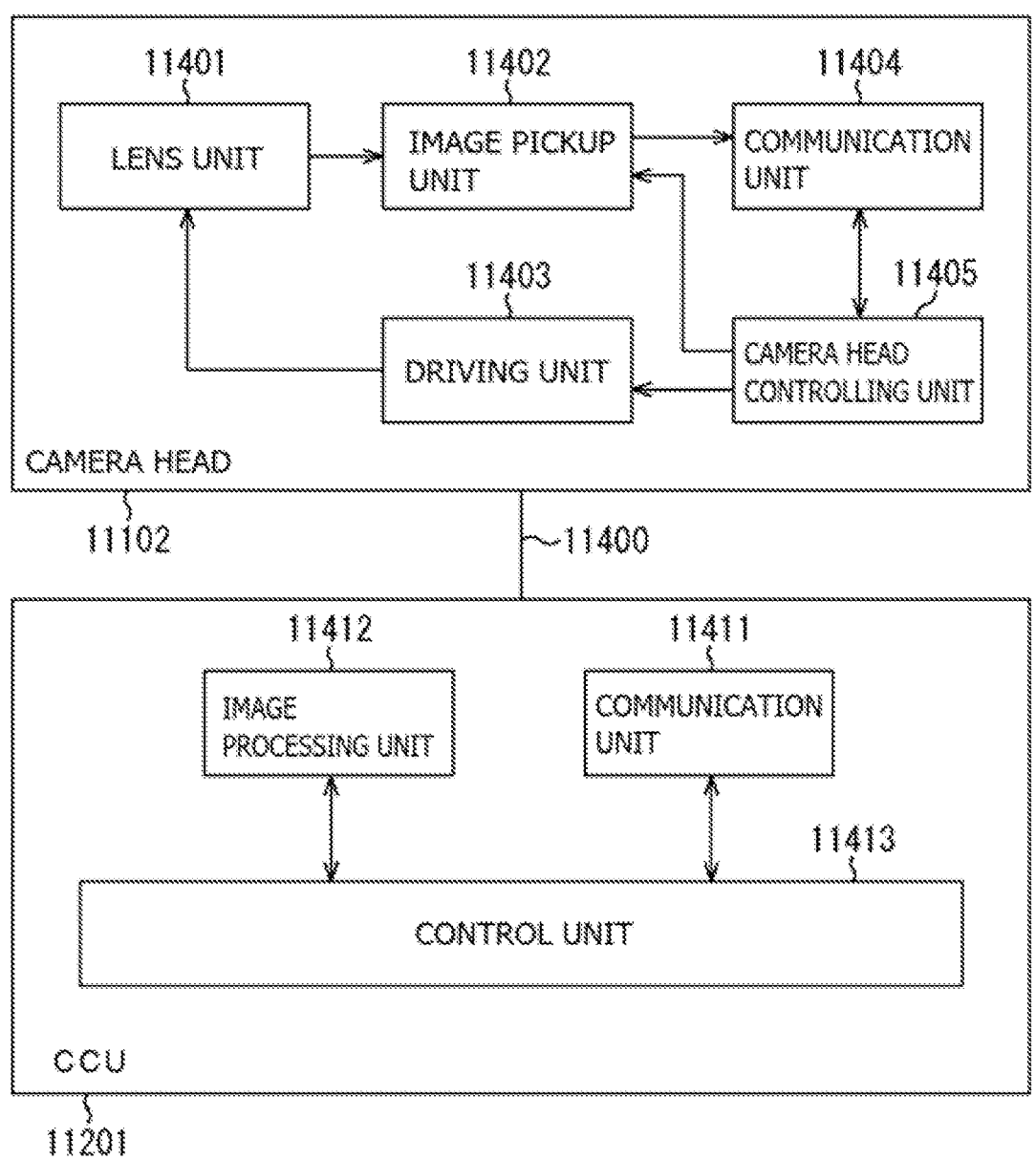
FIG. 36 is a block diagram depicting an example of a functional configuration of a camera head and a camera control unit (CCU).

FIG. 36 is a block diagram depicting an example of a functional configuration of the camera head 11102 and the CCU 11201 depicted in FIG. 35.

The camera head 11102 includes a lens unit 11401, an image pickup unit 11402, a driving unit 11403, a communication unit 11404 and a camera head controlling unit 11405. The CCU 11201 includes a communication unit 11411, an image processing unit 11412 and a control unit 11413. The camera head 11102 and the CCU 11201 are connected for communication to each other by a transmission cable 11400.

The lens unit 11401 is an optical system, provided at a connecting location to the lens barrel 11101. Observation light taken in from a distal end of the lens barrel 11101 is guided to the camera head 11102 and introduced into the lens unit 11401. The lens unit 11401 includes a combination of a plurality of lenses including a zoom lens and a focusing lens.

The number of image pickup elements which is included by the image pickup unit 11402 may be one (single-plate type) or a plural number (multi-plate type). Where the image pickup unit 11402 is configured as that of the multi-plate type, for example, image signals corresponding to respective R, G and B are generated by the image pickup elements, and the image signals may be synthesized to obtain a color image. The image pickup unit 11402 may also be configured so as to have a pair of image pickup elements for acquiring respective image signals for the right eye and the left eye ready for three dimensional (3D) display. If 3D display is performed, then the depth of a living body tissue in a surgical region can be comprehended more accurately by the surgeon 11131. It is to be noted that, where the image pickup unit 11402 is configured as that of stereoscopic type, a plurality of systems of lens units 11401 are provided corresponding to the individual image pickup elements.

Further, the image pickup unit 11402 may not necessarily be provided on the camera head 11102. For example, the image pickup unit 11402 may be provided immediately behind the objective lens in the inside of the lens barrel 11101.

The driving unit 11403 includes an actuator and moves the zoom lens and the focusing lens of the lens unit 11401 by a predetermined distance along an optical axis under the control of the camera head controlling unit 11405. Consequently, the magnification and the focal point of a picked up image by the image pickup unit 11402 can be adjusted suitably.

The communication unit 11404 includes a communication apparatus for transmitting and receiving various kinds of information to and from the CCU 11201. The communication unit 11404 transmits an image signal acquired from the image pickup unit 11402 as RAW data to the CCU 11201 through the transmission cable 11400.

In addition, the communication unit 11404 receives a control signal for controlling driving of the camera head 11102 from the CCU 11201 and supplies the control signal to the camera head controlling unit 11405. The control signal includes information relating to image pickup conditions such as, for example, information that a frame rate of a picked up image is designated, information that an exposure value upon image picking up is designated and/or information that a magnification and a focal point of a picked up image are designated.

It is to be noted that the image pickup conditions such as the frame rate, exposure value, magnification or focal point may be designated by the user or may be set automatically by the control unit 11413 of the CCU 11201 on the basis of an acquired image signal. In the latter case, an auto exposure (AE) function, an auto focus (AF) function and an auto white balance (AWB) function are incorporated in the endoscope 11100.

The camera head controlling unit 11405 controls driving of the camera head 11102 on the basis of a control signal from the CCU 11201 received through the communication unit 11404.

The communication unit 11411 includes a communication apparatus for transmitting and receiving various kinds of information to and from the camera head 11102. The communication unit 11411 receives an image signal transmitted thereto from the camera head 11102 through the transmission cable 11400.

Further, the communication unit 11411 transmits a control signal for controlling driving of the camera head 11102 to the camera head 11102. The image signal and the control signal can be transmitted by electrical communication, optical communication or the like.

The image processing unit 11412 performs various image processes for an image signal in the form of RAW data transmitted thereto from the camera head 11102.

The control unit 11413 performs various kinds of control relating to image picking up of a surgical region or the like by the endoscope 11100 and display of a picked up image obtained by image picking up of the surgical region or the like. For example, the control unit 11413 creates a control signal for controlling driving of the camera head 11102.

Further, the control unit 11413 controls, on the basis of an image signal for which image processes have been performed by the image processing unit 11412, the display apparatus 11202 to display a picked up image in which the surgical region or the like is imaged. Thereupon, the control unit 11413 may recognize various objects in the picked up image using various image recognition technologies. For example, the control unit 11413 can recognize a surgical tool such as forceps, a particular living body region, bleeding, mist when the energy device 11112 is used and so forth by detecting the shape, color and so forth of edges of objects included in a picked up image. The control unit 11413 may cause, when it controls the display apparatus 11202 to display a picked up image, various kinds of surgery supporting information to be displayed in an overlapping manner with an image of the surgical region using a result of the recognition. Where surgery supporting information is displayed in an overlapping manner and presented to the surgeon 11131, the burden on the surgeon 11131 can be reduced and the surgeon 11131 can proceed with the surgery with certainty.

The transmission cable 11400 which connects the camera head 11102 and the CCU 11201 to each other is an electric signal cable ready for communication of an electric signal, an optical fiber ready for optical communication or a composite cable ready for both of electrical and optical communications.

Here, while, in the example depicted, communication is performed by wired communication using the transmission cable 11400, the communication between the camera head 11102 and the CCU 11201 may be performed by wireless communication.

The description has been given above of one example of the endoscopic surgery system, to which the technology according to an embodiment of the present disclosure is applicable. The technology according to an embodiment of the present disclosure is applicable to, for example, the image pickup unit 11402 of the configurations described above. Applying the technology according to an embodiment of the present disclosure to the image pickup unit 11402 makes it possible to improve detection accuracy.

It is to be noted that although the endoscopic surgery system has been described as an example here, the technology according to an embodiment of the present disclosure may also be applied to, for example, a microscopic surgery system, and the like.

Application Example 5

Example of Practical Application to Mobile Body

The technology according to an embodiment of the present disclosure is applicable to various products. For example, the technology according to an embodiment of the present disclosure may be achieved in the form of an apparatus to be mounted to a mobile body of any kind. Non-limiting examples of the mobile body may include an automobile, an electric vehicle, a hybrid electric vehicle, a motorcycle, a bicycle, any personal mobility device, an airplane, an unmanned aerial vehicle (drone), a vessel, a robot, a construction machine, and an agricultural machine (tractor).

Figure 37:
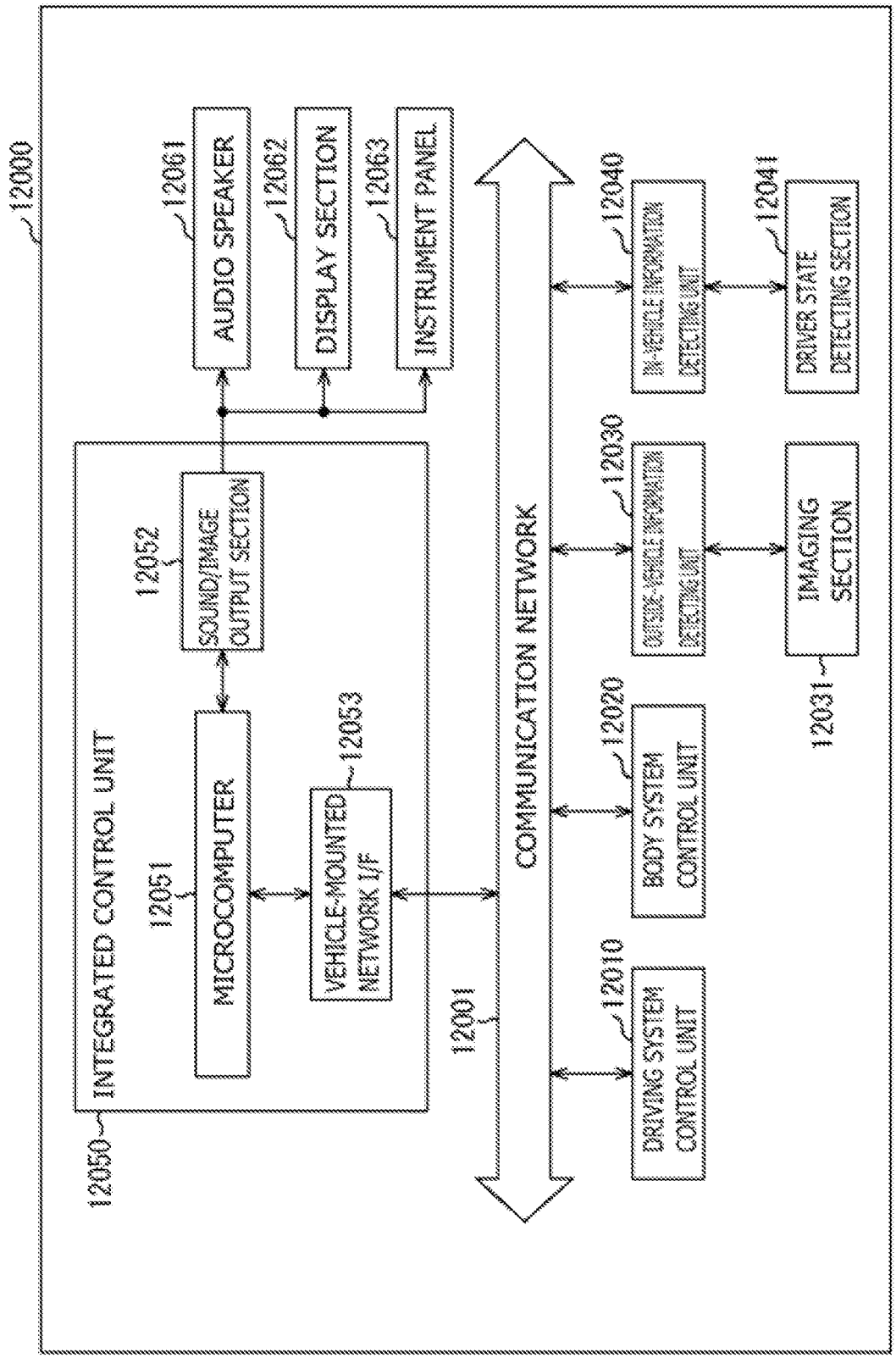
FIG. 37 is a block diagram depicting an example of schematic configuration of a vehicle control system.

FIG. 37 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 37, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 13, an audio speaker 12061, a display section 12062, and an instrument panel 12063 are illustrated as the output device. The display section 12062 may, for example, include at least one of an on-board display and a head-up display.

Figure 38:
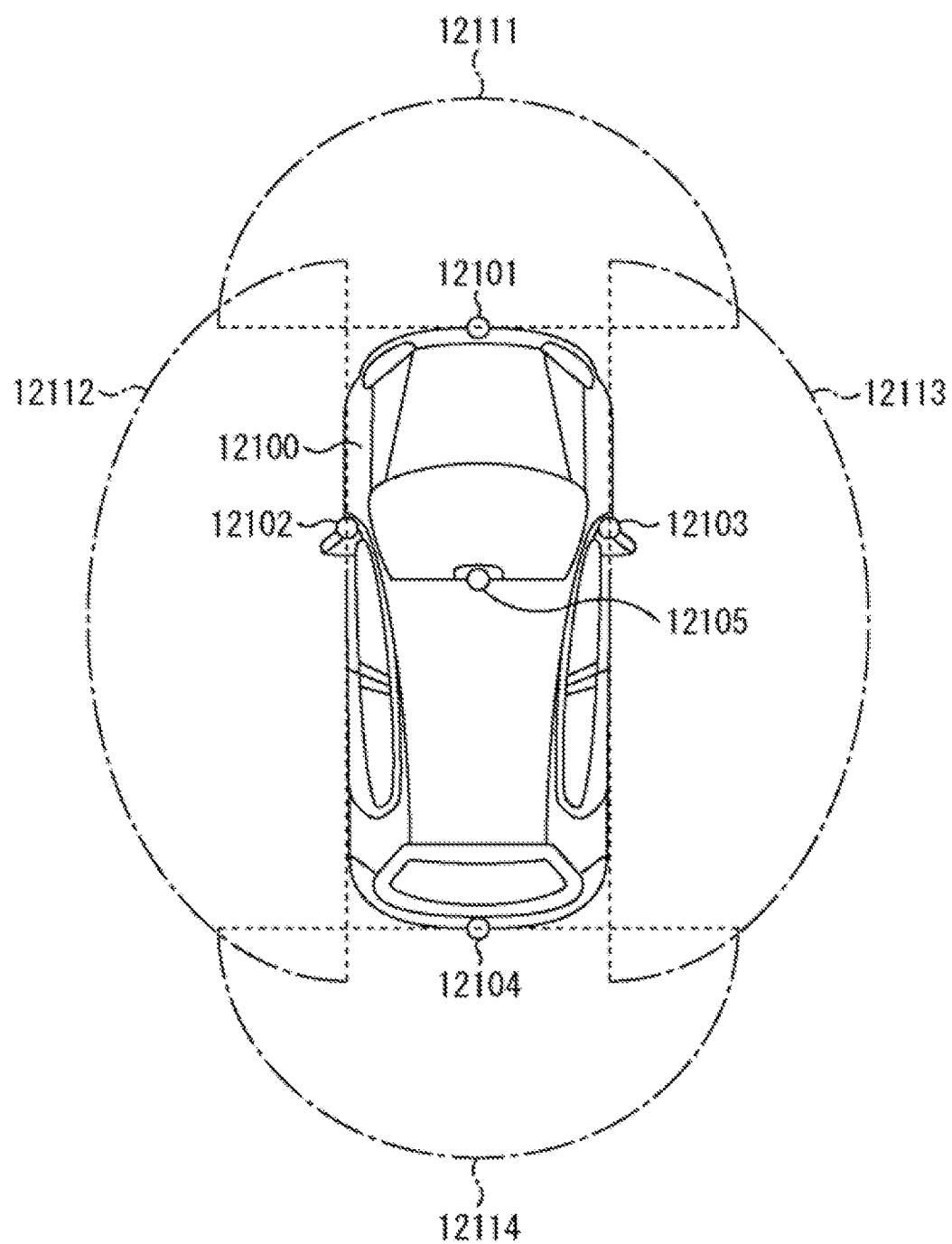
FIG. 38 is a diagram of assistance in explaining an example of installation positions of an outside-vehicle information detecting section and an imaging section.

FIG. 38 is a diagram depicting an example of the installation position of the imaging section 12031.

In FIG. 38, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 38 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

An example of the vehicle control system to which the technology according to an embodiment of the present disclosure may be applied has been described above. The technology according to an embodiment of the present disclosure may be applied to the imaging section 12031 out of the configurations described above. Specifically, the solid-state imaging device 1 in FIG. 32 is applicable to the imaging section 12031. Applying the technology according to an embodiment of the present disclosure to the imaging section 12031 makes it possible to obtain a captured image that is easier to see. This makes it possible to decrease fatigue of a driver.

Description has been given hereinabove referring to the embodiments, etc.; however, the content of the present disclosure is not limited to the foregoing embodiments, etc., and various modifications may be made. For example, in the foregoing embodiment, etc., the solid-state imaging element 10, etc. has a configuration in which the organic photoelectric conversion section 11G that detects green light, and the organic photoelectric conversion section 20 that detects green light and the inorganic photoelectric conversion sections 32B and 32R that detect, respectively, blue light and red light are stacked. However, the content of the present disclosure is not limited to such a structure. In other words, red light or blue light may be detected in the organic photoelectric conversion section, and green light may be detected in the inorganic photoelectric conversion section.

In addition, the number or ratio of the organic photoelectric conversion section and the inorganic photoelectric conversion sections are not limited; two or more organic photoelectric conversion sections may be provided. For example, the present technology achieves effects similar to those of the foregoing embodiments, etc. also in a solid-state imaging element of a vertical spectroscopic type in which a red photoelectric conversion section, a green photoelectric conversion section, and a blue photoelectric conversion section, that include organic semiconductor materials being able to selectively absorb light beams in predetermined respective wavelength regions, are stacked in this order on a substrate with an insulating layer interposed therebetween. In addition, the present technology achieves effects similar to those of the foregoing embodiments, etc. also in a solid-state imaging element in which an organic photoelectric conversion section and an inorganic photoelectric conversion section are arranged side by side along a substrate plane.

Further, the configuration of the solid-state imaging element of the present disclosure is not limited to the combinations illustrated in the foregoing embodiments, etc. For example, the solid-state imaging element may include the transfer electrode 21C, the discharge electrode 21D, and the shielding electrode 21E. In addition, the accumulation electrode 21B may be formed to be divided into two or three or more.

In addition, the solid-state imaging element and the solid-state imaging device of the present disclosure do not need to include all of the constituent elements described in the foregoing embodiments, etc., and may include any other layer on the contrary.

The effects described in the foregoing embodiments, etc. are merely exemplary, and may be other effects or may further include other effects.

It is to be noted that the present disclosure may include the following configurations.

(1)
  A solid-state imaging element including:
  a photoelectric conversion layer;
  a first electrode and a second electrode opposed to each other with the photoelectric conversion layer interposed therebetween;
  a semiconductor layer provided between the first electrode and the photoelectric conversion layer;
  an accumulation electrode opposed to the photoelectric conversion layer with the semiconductor layer interposed therebetween;
  an insulating film provided between the accumulation electrode and the semiconductor layer; and
  a barrier layer provided between the semiconductor layer and the photoelectric conversion layer.

(2)
  A solid-state imaging element including:
  a photoelectric conversion layer;
  a first electrode and a second electrode opposed to each other with the photoelectric conversion layer interposed therebetween;
  a semiconductor layer provided between the first electrode and the photoelectric conversion layer, the semiconductor layer having a potential barrier at a junction plane with respect to the photoelectric conversion layer;
  an accumulation electrode opposed to the photoelectric conversion layer with the semiconductor layer interposed therebetween; and
  an insulating film provided between the accumulation electrode and the semiconductor layer.

(3)
  The solid-state imaging element according to (1) or (2), in which
    the photoelectric conversion layer includes an organic semiconductor material, and
    the semiconductor layer includes a semiconductor material having mobility higher than mobility of the organic semiconductor material.

(4)
  The solid-state imaging element according to (1), further including a semiconductor substrate having a first surface and a second surface that are opposed to each other, in which
    the first electrode, the semiconductor layer, the barrier layer, the photoelectric conversion layer, and the second electrode are provided in this order on the first surface of the semiconductor substrate.

(5)
  The solid-state imaging element according to any one of (1) to (3), further including:
    a semiconductor substrate having a first surface and a second surface that are opposed to each other; and
    a multilayer wiring line provided between the second surface of the semiconductor substrate and the first electrode.

(6)
  The solid-state imaging element according to (4) or (5), further including an inorganic photoelectric conversion section provided in the semiconductor substrate.

(7)
  The solid-state imaging element according to any one of (1) to (6), further including a transfer electrode provided opposed to the semiconductor layer with the insulating film interposed therebetween, the transfer electrode controlling movement of signal charges in the semiconductor layer.

(8)
The solid-state imaging element according to any one of (1) to (7), further including a discharge electrode provided apart from the first electrode and electrically coupled to the semiconductor layer.
(9)
The solid-state imaging element according to any one of (1) to (8), further including a light-shielding film that covers the first electrode with the photoelectric conversion layer interposed therebetween.
(10)
The solid-state imaging element according to (1), in which the barrier layer includes silicon oxide, silicon nitride, silicon oxynitride, or an organic material.
(11)
A solid-state imaging device including a plurality of solid-state imaging elements, the solid-state imaging elements each including
 a photoelectric conversion layer,
 a first electrode and a second electrode opposed to each other with the photoelectric conversion layer interposed therebetween,
 a semiconductor layer provided between the first electrode and the photoelectric conversion layer,
 an accumulation electrode opposed to the photoelectric conversion layer with the semiconductor layer interposed therebetween,
 an insulating film provided between the accumulation electrode and the semiconductor layer, and
 a barrier layer provided between the semiconductor layer and the photoelectric conversion layer.
(12)
A solid-state imaging device including a plurality of solid-state imaging elements, the solid-state imaging elements each including
 a photoelectric conversion layer,
 a first electrode and a second electrode opposed to each other with the photoelectric conversion layer interposed therebetween,
 a semiconductor layer provided between the first electrode and the photoelectric conversion layer, the semiconductor layer having a potential barrier at a junction plane with respect to the photoelectric conversion layer,
 an accumulation electrode opposed to the photoelectric conversion layer with the semiconductor layer interposed therebetween, and
 an insulating film provided between the accumulation electrode and the semiconductor layer.
(13)
The solid-state imaging device according to (11) or (12), further including a shielding electrode opposed to the semiconductor layer with the insulating film interposed therebetween, the shielding electrode being arranged between the accumulation electrodes adjacent to each other.
(14)
The solid-state imaging device according to any one of (11) to (13), including a plurality of pixels in which the respective solid-state imaging elements are provided, in which the semiconductor layer is provided separately for each of the pixels.
(15)
The solid-state imaging device according to any one of (11) to (14), including a plurality of pixels in which the respective solid-state imaging elements are provided, in which the photoelectric conversion layer is provided separately for each of the pixels.

This application claims the benefit of Japanese Priority Patent Application JP2018-50808 filed with the Japan Patent Office on Mar. 19, 2018, the entire contents of which are incorporated herein by reference.

It should be understood by those skilled in the art that various modifications, combinations, sub-combinations, and alterations may occur depending on design requirements and other factors insofar as they are within the scope of the appended claims or the equivalents thereof.

What is claims is:

1. A solid-state imaging element comprising:
 a photoelectric conversion layer;
 a first electrode and a second electrode opposed to each other with the photoelectric conversion layer interposed therebetween;
 a semiconductor layer provided between the first electrode and the photoelectric conversion layer;
 an accumulation electrode opposed to the photoelectric conversion layer with the semiconductor layer interposed therebetween;
 an insulating film provided between the accumulation electrode and the semiconductor layer; and
 a barrier layer provided between the semiconductor layer and the photoelectric conversion layer,
 wherein either i) electron affinity of the barrier layer is smaller than electron affinity of the photoelectric conversion layer and electron affinity of the semiconductor layer, or ii) ionization potential of the barrier layer is larger than ionization potential of the photoelectric conversion layer and ionization potential of the semiconductor layer.

2. The solid-state imaging element according to claim 1, wherein the photoelectric conversion layer includes an organic semiconductor material, and wherein the semiconductor layer includes a semiconductor material having mobility higher than mobility of the organic semiconductor material.

3. The solid-state imaging element according to claim 1, further comprising:
 a semiconductor substrate having a first surface and a second surface that are opposed to each other, wherein the first electrode, the semiconductor layer, the barrier layer, the photoelectric conversion layer, and the second electrode are provided in this order on the first surface of the semiconductor substrate.

4. The solid-state imaging element according to claim 3, further comprising:
 an inorganic photoelectric conversion section provided in the semiconductor substrate.

5. The solid-state imaging element according to claim 1, further comprising:
 a semiconductor substrate having a first surface and a second surface that are opposed to each other; and
 a multilayer wiring line provided between the second surface of the semiconductor substrate and the first electrode.

6. The solid-state imaging element according to claim 1, further comprising:
 a transfer electrode provided opposed to the semiconductor layer with the insulating film interposed therebetween, the transfer electrode controlling movement of signal charges in the semiconductor layer.

7. The solid-state imaging element according to claim 1, further comprising:
 a discharge electrode provided apart from the first electrode and electrically coupled to the semiconductor layer.

8. The solid-state imaging element according to claim 1, further comprising:
a light-shielding film that covers the first electrode with the photoelectric conversion layer interposed therebetween.

9. The solid-state imaging element according to claim 1, wherein the barrier layer includes silicon oxide, silicon nitride, silicon oxynitride, or an organic material.

10. A solid-state imaging element comprising:
a photoelectric conversion layer;
a first electrode and a second electrode opposed to each other with the photoelectric conversion layer interposed therebetween;
a semiconductor layer provided between the first electrode and the photoelectric conversion layer;
an accumulation electrode opposed to the photoelectric conversion layer with the semiconductor layer interposed therebetween; and
an insulating film provided between the accumulation electrode and the semiconductor layer,
wherein either i) the semiconductor layer has a potential energy in a conduction band lower than a potential energy of a conduction band of the photoelectric conversion layer and has a Fermi level lower than a Fermi level of the photoelectric conversion layer, or ii) the semiconductor layer has a potential energy in a valence band higher than a potential energy in a valence band of the photoelectric conversion layer and has a Fermi level lower than a Fermi level of the photoelectric conversion layer, and
wherein a potential difference between a first region of the photoelectric conversion layer and the semiconductor layer is larger than a potential difference between a second region of the photoelectric conversion layer and the semiconductor layer, the first region of the photoelectric conversion layer being disposed between the second region of the photoelectric conversion layer and semiconductor layer.

11. A solid-state imaging device comprising:
a plurality of solid-state imaging elements, the solid-state imaging elements each including:
a photoelectric conversion layer;
a first electrode and a second electrode opposed to each other with the photoelectric conversion layer interposed therebetween;
a semiconductor layer provided between the first electrode and the photoelectric conversion layer;
an accumulation electrode opposed to the photoelectric conversion layer with the semiconductor layer interposed therebetween;
an insulating film provided between the accumulation electrode and the semiconductor layer; and
a barrier layer provided between the semiconductor layer and the photoelectric conversion layer,
wherein either i) electron affinity of the barrier layer is smaller than electron affinity of the photoelectric conversion layer and electron affinity of the semiconductor layer, or ii) ionization potential of the barrier layer is larger than ionization potential of the photoelectric conversion layer and ionization potential of the semiconductor layer.

12. The solid-state imaging device according to claim 11, further comprising:
a shielding electrode opposed to the semiconductor layer with the insulating film interposed therebetween, the shielding electrode being arranged between adjacent accumulation electrodes.

13. The solid-state imaging device according to claim 11, further comprising:
a plurality of pixels in which the respective solid-state imaging elements are provided, wherein the semiconductor layer is provided separately for each of the pixels.

14. The solid-state imaging device according to claim 11, further comprising:
a plurality of pixels in which the respective solid-state imaging elements are provided, wherein the photoelectric conversion layer is provided separately for each of the pixels.

15. A solid-state imaging device comprising:
a plurality of solid-state imaging elements, the solid-state imaging elements each including:
a photoelectric conversion layer;
a first electrode and a second electrode opposed to each other with the photoelectric conversion layer interposed therebetween;
a semiconductor layer provided between the first electrode and the photoelectric conversion layer;
an accumulation electrode opposed to the photoelectric conversion layer with the semiconductor layer interposed therebetween; and
an insulating film provided between the accumulation electrode and the semiconductor layer,
wherein either i) the semiconductor layer has a potential energy in a conduction band lower than a potential energy of a conduction band of the photoelectric conversion layer and has a Fermi level lower than a Fermi level of the photoelectric conversion layer, or ii) the semiconductor layer has a potential energy in a valence band higher than a potential energy in a valence band of the photoelectric conversion layer and has a Fermi level lower than a Fermi level of the photoelectric conversion layer, and
wherein a potential difference between a first region of the photoelectric conversion layer and the semiconductor layer is larger than a potential difference between a second region of the photoelectric conversion layer and the semiconductor layer, the first region of the photoelectric conversion layer being disposed between the second region of the photoelectric conversion layer and semiconductor layer.

* * * * *